(12) United States Patent
Murota et al.

(10) Patent No.: US 6,335,144 B1
(45) Date of Patent: Jan. 1, 2002

(54) PHOTOPOLYMERIZABLE COMPOSITION FOR SHORT WAVELENGTH SEMICONDUCTOR LASER EXPOSURE

(75) Inventors: Yasufumi Murota; Tadahiro Sorori, both of Shizuoka (JP)

(73) Assignee: Fuji Photo Film Co., Ltd., Minami-Ashigara ( * ) Notice: Subject to any disclaimer, the term of this patent is extended or adjusted under 35 U.S.C. 154(b) by 0 days.

(21) Appl. No.: 09/557,321

(22) Filed: Apr. 25, 2000

(30) Foreign Application Priority Data

| | | |
|---|---|---|
| Apr. 27, 1999 | (JP) | 11-119214 |
| Aug. 4, 1999 | (JP) | 11-221480 |
| Sep. 30, 1999 | (JP) | 11-280204 |

(51) Int. Cl.$^7$ ............................................. G03F 7/027
(52) U.S. Cl. ................. 430/281.1; 430/913; 430/926; 522/26; 522/29
(58) Field of Search ....................... 430/281.1, 913, 430/926; 522/26, 29

(56) References Cited

U.S. PATENT DOCUMENTS 5,731,363 A * 3/1998 Okamoto et al. ............ 522/16

FOREIGN PATENT DOCUMENTS

GB 1148636 * 4/1969

* cited by examiner

*Primary Examiner*—Rosemary Ashton
(74) *Attorney, Agent, or Firm*—Burns, Doane, Swecker & Mathis, LLP

(57) ABSTRACT

Disclosed is a photopolymerizable composition which comprises (i) a sensitizing dye represented by the following formula (I-1), (ii) a titanocene compound, and (iii) an addition polymerizable compound having at least one ethylenically unsaturated double bond:

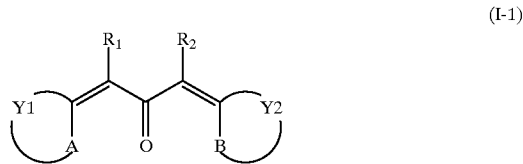

(I-1)

wherein A and B each represents —S—, $NR_3$, or $NR_4$; $R_3$ and $R_4$ each represents a substituted or unsubstituted alkyl group, or a substituted or unsubstituted aryl group; $Y_1$ and $Y_2$ each represents a non-metallic atomic group to form a basic nucleus of a dye together with the adjacent A or B, and the adjacent carbon atoms; $R_1$ and $R_2$ each represents a monovalent non-metallic atomic group, or they may be bonded to each other to form an aliphatic or aromatic ring.

7 Claims, No Drawings

2

PHOTOPOLYMERIZABLE COMPOSITION FOR SHORT WAVELENGTH SEMICONDUCTOR LASER EXPOSURE

FIELD OF THE INVENTION

The present invention relates to a photosensitive composition containing a novel photopolymerization initiator, in particular, a photopolymerization initiator which is high sensitive and excellent in stability. In particular, the present invention relates to an excellent photopolymerizable composition or photosensitive composition as the material for a lithographic printing plate precursor capable of plate-making by scanning exposure based on digital signals. Besides the lithographic printing plate precursor, such a photopolymerizable composition or photosensitive composition are utilized in the fields of, for example, optical image-forming, holography, and a color hard copy, production of electronic materials such as photoresists, and photo-curable resin materials for inks, coatings and adhesions.

BACKGROUND OF THE INVENTION

As a lithographic printing plate, a PS plate comprising a hydrophilic support having provided thereon a lipophilic photosensitive resin layer has so far been widely used, and a desired printing plate is obtained by mask exposure (surface exposure) via a lith film and then dissolving and removing the non-image part.

Digitized techniques of electronically processing, accumulating and outputting image data using a computer have prevailed in recent years, and various image output systems corresponding to these digitized techniques have been put to practical use. As a result, a computer-to-plate (CTP) technique directly making a printing plate which comprises scanning digitized image data without using a lith film with high convergent light such as a laser beam is desired. With such a tendency, it has become an important technical subject to obtain the printing plate precursor well adapted to this purpose.

As one means to obtain a lithographic printing plate capable of such scanning exposure, the constitution in which a high speed photopolymerizable composition is used as the ink-receptive photosensitive resin layer (hereinafter referred to as "photosensitive layer") provided on a hydrophilic support has so far been proposed and such printing plate is now on the market. The printing plate precursor having this constitution is easy to perform development process and, further, has desired properties as a printing plate and printing properties, e.g., excellent in resolving power, adhesion of ink, press life, and smearing prevention (i.e., staining prevention).

The photopolymerizable composition fundamentally comprises an ethylenically unsaturated compound, a photopolymerization initiator, and a binder resin. A photopolymerization initiator absorbs light to generate an active radical, addition polymerization of an ethylenically unsaturated compound is caused, and a photosensitive layer is not solubilized, thereby an image is formed. The greatest part of the conventional proposals concerning photopolymerizable compositions capable of scanning exposure have been those disclosed the use of a photopolymerization initiator having high photosensitivity, and many such compositions are described, e.g., in Bruce M. Monro et al., *Chemical Revue*, 93, 435 (1993) and R. S. Davidson, *Journal of Photochemistry and Biology A: Chemistry*, 73.81 (1993).

With respect to conventionally used CTP systems using the photopolymerizable compositions comprising these photopolymerization initiators and long wavelength visible light sources such as Ar laser (488 nm) and FD-YAG laser (532 nm) as a light source, writing at higher speed has been desired for increasing the productivity of plate-making process but such technique is not realized yet because the output of light sources is not sufficiently high and the sensitivity of photosensitive materials is not sufficiently high.

On the other hand, in recent years, for example, a semiconductor laser using InGaN series materials and capable of continuous oscillation in the region of from 350 nm to 450 nm has nearly reached the stage of practical use. Scanning exposure systems using such short wave light sources have advantages that economical systems can be constructed while light sources have sufficient output as semiconductor lasers can be produced inexpensively from the structural point of view. Further, as compared with the systems using conventional FD-YAG and Ar lasers, photosensitive materials having the sensitive region of short wavelength which can be handled under brighter safelight can be used in this semiconductor laser.

Further, for example, as described in J. P. Faussier, *Photoinitiated Polymerization—Theory and Application*, Rapra Review, Vol. 9, Report, Rapra Technology (1998), and M. Tsunooka et al., *Prog. Polym. Sci.*, 21, 1 (1996), obtaining high speed photopolymerization initiators is an earnestly desired technique widely in imaging field.

Obtaining photopolymerization compositions having high photosensitivity to short wavelength semiconductor laser region of from 350 nm to 450 nm is an important technique which has been increasingly demanded widely in industrial fields of, other than CTP industry, for example, laser imaging such as optical shaping, holography, and a color hard copy, production of electronic materials such as photoresists, and photo-curable resin materials for inks, coatings and adhesions.

However, photopolymerization initiators which have sufficient sensitivity to scanning exposure in the region of short wavelength of from 350 nm to 450 nm have not been known up to the present.

As a relatively high speed photopolymerization initiator, photopolymerization initiators comprising a specific dye and a titanocene compound in combination are known. A combination of a dye having an oxazolidine acidic nucleus and triazine photopolymerization initiator is disclosed in JP-B-61-9621 (the term "JP-B" as used herein means an "examined Japanese patent publication"), but this compound is inferior in storage stability hence there are problems from the manufacturing point of view. Moreover, a combination of a dye having an oxazolone acidic nucleus and a titanocene compound is disclosed in JP-A-8-272096 (the term "JP-A" as used herein means an "unexamined published Japanese patent application"), and a combination of a dye having a 5-membered heterocyclic acidic nucleus and a titanocene compound is disclosed in JP-A-10-101719. These compounds are certainly high speed but not sufficiently and when laser light sources having wavelength of 450 nm or less are used, practicably sufficient sensitivity cannot be obtained and they are not suited to light sources of short wavelength Further, combinations of a specific carbomerocyanine dye and a titanocene compound are disclosed in JP-A-9-328505, JP-A-8-272096 and JP-A-8-262715. They are certainly high speed but not practicably sufficient and they are not suited to light sources of short wavelength. Photopolymerizable compositions containing N-alkylindolylidene or N-alkylbenzothiazolylidenealkanone as a photosensitizer and hexaarylbiimidazoles as an activator are disclosed in JP-B-1-43299 and JP-A-2-216154, but these photopolymerizable compositions cannot exhibit practicably sufficient sensitivity and further there are problems in storage stability.

A combination of a carbazole derivative and a titanocene photopolymerization initiator is disclosed in JP-A-9-230913 but this compound has long absorption wavelength hence not suited to a light source of short wavelength. In JP-A-9-80750 is disclosed a combination of a styryl dye and a titanocene compound and this composition is certainly high speed but not sufficiently high. Combinations of a carbazole derivative and a triazine photopolymerization initiator are disclosed in JP-A-62-212643 and JP-A-63-32540, a combination of a carbazole derivative and an iodonium salt photopolymerization initiator in JP-A-63-32539, and a combination of a carbazole derivative and a thioxanthone photopolymerization initiator is disclosed in JP-A-63-325401, but the sensitivity of any of these compounds is practicably insufficient and further there are problems in storage stability.

SUMMARY OF THE INVENTION

An object of the present invention is to provide a photosensitive composition which is excellent in working ability, economical efficiency and storage stability, and can be used as materials for a lithographic printing plate precursor for scanning exposure suitable for a CTP system or a lithographic printing plate precursor highly sensitive to the oscillation wavelength of an inexpensive short wavelength semiconductor laser.

Another object of the present invention is to provide a photosensitive composition containing a novel photopolymerization initiator highly sensitive to broad wavelength region of from 350 nm to 450 nm.

As a result of eager investigation to achieve the above object, the present inventors have found that a photopolymerizable composition which comprises (i) a sensitizing dye represented by the following formula (I-1), (ii) a titanocene compound, and (iii) an addition polymerizable compound having at least one ethylenically unsaturated double bond has sufficient sensitivity to the oscillation wavelength of a short wavelength semiconductor laser, and is excellent in storage stability, thus achieved the present invention:

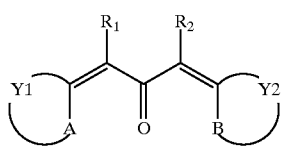

(I-1)

wherein A and B each represents —S—, NR$_3$, or NR$_4$; R$_3$ and R$_4$ each represents a substituted or unsubstituted alkyl group, or a substituted or unsubstituted aryl group; Y$_1$ and Y$_2$ each represents a non-metallic atomic group to form the basic nucleus of the dye together with the adjacent A or B, and the adjacent carbon atoms; R$_1$ and R$_2$ each represents a monovalent non-metallic atomic group, or R$_1$ and R$_2$ may be bonded to each other to form an aliphatic or aromatic ring.

Further, as a result of eager investigation to achieve the above object, the present inventors have found that when a carbazole compound represented by the following formula (II-1) and a titanocene compound are used in combination, a photopolymerization initiator excellent in sensitivity and stability can be obtained, particularly a photopolymerization initiator which is suited to exposure at wavelength of 350 nm to 450 nm can be obtained. The present inventors have further found that a photosensitive composition comprising this photopolymerization initiator and a compound which reacts with a radical or an acid to change and retain the physical or chemical characteristics, specifically, an addition polymerizable compound having at least one ethylenically unsaturated double bond, is used in a photopolymerizable lithographic printing plate precursor, a lithographic printing plate precursor having sufficient sensitivity to the oscillation wavelength of a short wavelength semiconductor laser and capable of being handled under bright safelight can be obtained, thus achieved the present invention:

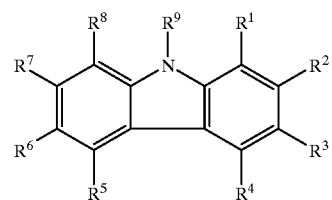

(II-1)

wherein R$^1$, R$^2$, R$^3$, R$^4$, R$^5$, R$^6$, R$^7$, R$^8$ and R$^9$ each represents a hydrogen atom, or a monovalent non-metallic atomic group, provided that at least one of R$^1$ and R$^3$ is a monovalent organic residue represented by the following partial structural formula (1), and R$^1$, R$^2$, R$^3$, R$^4$, R$^5$, R$^6$, R$^7$, R$^8$ and R$^9$ each may be bonded to each other to form an aliphatic or aromatic group;

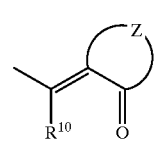

(1)

wherein R$^{10}$ represents a hydrogen atom, or a monovalent non-metallic atomic group; Z represents a divalent non-metallic atomic group necessary to form a 5-membered ring acidic nucleus, which may have a substituent, together with the adjacent atomic group, and R$^{10}$ may be bonded to R$^1$, R$^2$, R$^3$, R$^4$, R$^5$, R$^6$, R$^7$, R$^8$ or R$^9$ to form an aliphatic or aromatic ring.

As a result of eager investigation to achieve the above object, the present inventors have further found that by adopting the constitution comprising (i) a sensitizing dye represented by the following formula (III-1), (ii) a titanocene compound, and (iii) a compound which reacts with at least either a radical or an acid to change and retain at least either the physical or chemical characteristics, a photosensitive composition having sufficient sensitivity to the oscillation wavelength of a short wavelength semiconductor laser and excellent in storage stability can be obtained, thus achieved the present invention:

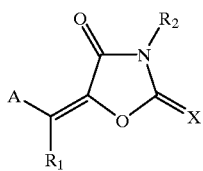

(III-1)

wherein A represents an aromatic or heterocyclic ring which may have a substituent, X represents an oxygen atom, a sulfur atom or —N($R_3$)—; $R_1$, $R_2$ and $R_3$ each represents a hydrogen atom, or a monovalent non-metallic atomic group, and A and $R_1$, and $R_2$ and $R_3$ each may be bonded to each other to form an aliphatic or aromatic group.

DETAILED DESCRIPTION OF THE INVENTION

The present invention will be described in detail below.

Photopolymerizable Composition

The photopolymerizable composition according to the present invention contains (A) a photopolymerization initiator (a sensitizing dye and a titanocene compound), and (B) an addition polymerizable compound having at least one ethylenically unsaturated double bond (hereinafter referred to as "an addition polymerizable compound") as essential components and, if necessary, (C) a binder polymer. Each of these components is described specifically below.

(A) Photopolymerization Initiator

A photopolymerization initiator (hereinafter sometimes referred to as "a photoinitiator") which is an essential component of the photopolymerizable composition according to the present invention contains (i) a sensitizing dye having a specific structure, and (ii) a titanocene compound. It is thought that in the photoinitiator according to the present invention, a sensitizing dye primarily absorbs light to accelerate the generation of an initiating radical from the coexisting titanocene compound (such a process is hereinafter referred to as "dye sensitizations") One reason why the sensitizing dyes according to the present invention are superior is that their absorption wavelength is within the region of from 350 nm to 450 nm. Further, the greatest part of titanocene compounds described later per se have weak absorption in the wavelength region of from ultraviolet to the vicinity of 500 nm and also have photosensitivity in the same region, but as the sensitizing dyes having a specific structure according to the present invention extremely improve the photosensitivity of the titanocene compounds, it is possible, on one hand, to sufficiently increase the photosensitivity in short wavelength region by confining the use amount of the titanocene compounds to a relatively small amount, on the other hand, at the same time, it is possible to make the photosensitivity in 500 nm region by the titanocene compounds themselves low, therefore, safelight aptitude (use aptitude under a yellow lamp, etc.) of the photopolymerizable compositions can be improved. Further, the reason why the sensitizing dyes having a specific structure according to the present invention have particularly excellent dye sensitization property cannot be described in detail as the mechanism of dye sensitization is unknown but it can be presumed as follows. That is, the sensitizing dyes in the present invention exhibit relatively high emission (fluorescence or phosphorescence), which suggests that the life in excitation state of the dye is long, as a result the efficiency of the dye sensitization reaction becomes high.

Further, as the sensitizing dyes according to the present invention show relatively high phosphorescence, the dyes are thought to be the compound group having good formation efficiency of a triple state, and this fact may advantageously affect the improvement of the dye sensitization efficiency.

(i) Sensitizing Dye

The sensitizing dye for use in the present invention is represented by formula (I-1):

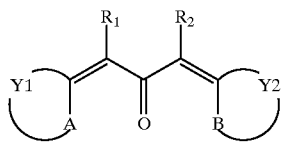

(I-1)

wherein A and B each represents —S—, $NR_3$, or $NR_4$; $R_3$ and $R_4$ each represents a substituted or unsubstituted alkyl group, or a substituted or unsubstituted aryl group; $Y_1$ and $Y_2$ each represents a non-metallic atomic group to form the basic nucleus of the dye together with the adjacent A or B, and the adjacent carbon atoms; $R_1$ and $R_2$ each represents a monovalent non-metallic atomic group, or $R_1$ and $R_2$ may be bonded to each other to form an aliphatic or aromatic ring.

Formula (I-1) will be described in detail below.

A and B each represents —S—, $NR_3$, or $NR_4$, and $R_3$ and $R_4$ each represents a substituted or unsubstituted alkyl group, or a substituted or unsubstituted aryl group.

Preferred examples of the unsubstituted alkyl groups represented by $R_3$ and $R_4$ are specifically described below. Preferred examples of the unsubstituted alkyl groups are straight chain, branched or cyclic alkyl groups having from 1 to 20 carbon atoms, and specific examples include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Preferred examples of the substituents of the substituted alkyl groups represented by $R_3$ and $R_4$ are monovalent non-metallic atomic groups exclusive of a hydrogen atom, and preferred examples include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfanoyl group, an N-aylarylsulfoyl group, an N,N-diarylsulfamoyl group, an N-alkyl-N-arylsulfamoyl group, a phosphono group (—PO$_3$H$_2$) and a conjugate base group thereof (hereinafter referred to as a phosphonato group), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugate base group thereof (hereinafter referred to as an alkylphosphonato group), a monoarylphosphono group (—PO$_3$H(aryl)) and a conjugate base group thereof (hereinafter referred to as an arylphosphonato group), a phosphonooxy group (—OPO$_3$H$_2$) and a conjugate base group thereof (hereinafter referred to as a phosphonatooxy group), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and a conjugate base group thereof (hereinafter referred to as an alkylphosphonatooxy group), a monoarylphosphonooxy group (—OPO$_3$H(aryl)) and a conjugate base group thereof (hereinafter referred to as an arylphosphonatooxy group), a cyano group, a nitro group, an aryl group, a heteroaryl group, an alkenyl group, and an alkynyl group.

As the specific examples of the alkyl groups in the substituents of the substituted alkyl groups, the above-described alkyl groups can be exemplified. As the specific examples of the aryl groups in the substituents of the substituted alkyl groups, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a phenyl group, a cyanophenyl group, a sulfophenyl group, a sulfonatophenyl group, a phosphonophenyl group and a phosphonatophenyl group can be exemplified.

As the examples of the heteroaryl groups in the substituents of the substituted alkyl groups, a monocyclic or polycyclic aromatic ring containing at least one of nitrogen, oxygen and sulfur atoms are used, preferably a 5- or 6-membered aromatic ring, e.g., furan, pyrrole or pyridine, can be used.

As the examples of the alkenyl groups in the substituents of the substituted alkyl groups, a vinyl group, a 1-propenyl group, a 1-butenyl group, a cinnamyl group, and a 2-chloro-1-ethenyl group can be exemplified, and as the examples of the alkynyl groups in the substituents of the substituted alkyl groups, an ethynyl group, a 1-propynyl group, a 1-butynyl group and a trimethylsilylethynyl group can be exemplified.

As $G^1$ in the acyl group ($G^1CO$—) in the substituents of the substituted alkyl groups, a hydrogen atom and the above-described alkyl groups and aryl groups can be exemplified.

Of these substituents, more preferred examples include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group, and an alkenyl group On the other hand, as the alkylene group in the substituted alkyl group, the alkylene groups obtained by removing any one hydrogen atom on the above-described alkyl groups having from 1 to 20 carbon atoms to make divalent organic residues, preferably a straight chain alkylene group having from 1 to 12 carbon atoms, a branched alkylene group having from 3 to 12 carbon atoms, and a cyclic alkylene group having from 5 to 10 carbon atoms can be exemplified.

Specific examples of the preferred substituted alkyl groups obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Preferred examples of the unsubstituted aryl groups represented by $R_3$ and $R_4$ are a condensed ring formed by 1 to 3 benzene rings and a condensed ring formed by a benzene ring and a 5-membered unsaturated ring, and specific examples include a phenyl group, a naphthyl group, an anthryl group, a phenanthryl group, an indenyl group, an acenaphthenyl group, and a fluorenyl group. Of these, a phenyl group and a naphthyl group are more preferred.

Specific examples of the preferred substituted aryl groups represented by $R_3$ and $R_4$ are those having a monovalent non-metallic atomic groups exclusive of a hydrogen atom on the ring-forming carbon atoms of the above-described aryl groups as the substituent. As preferred examples of the substituents, the above-described alkyl groups, substituted alkyl groups, and those described above as the examples of the substituents in the substituted alkyl groups can be exemplified. Preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

In the next place, $R_1$ and $R_2$ in formula (I-1) are described. $R_1$ and $R_2$ each represents a monovalent non-metallic atomic group, or $R_1$ and $R2$ may be bonded to each other to form an aliphatic or aromatic ring. $R_1$ and $R_2$ each preferably represents a hydrogen atom, a substituted or unsubstituted alkyl group, or a substituted or unsubstituted aryl group, or $R_1$ and $R_2$ may be bonded to each other to form an aliphatic or aromatic ring via a substituent or an unsubstituted alkylene group, etc. When $R_1$ and $R_2$ are bonded to each other to form a ring, the ring may be formed via an oxygen atom, a nitrogen atom, or a sulfur atom, besides a carbon atom. Preferred examples of the rings include rings formed via a substituted or unsubstituted alkylene group, an ether bond, an ester bond, an amido bond, etc. As preferred examples of the substituted or unsubstituted alkyl group, the substituted or unsubstituted aryl group, and the substituents, the same groups as described in $R_3$ and $R_4$ in formula (I-1) can be exemplified.

$Y_1$ and $Y_2$ in formula (I-1) will be described. $Y_1$ and $Y_2$ each represents a non-metallic atomic group to form the basic nucleus of the dye together with the adjacent A or B, and the adjacent carbon atoms. As such heterocyclic rings, 5-, 6- or 7-membered nitrogen-containing, oxygen-containing and sulfur-containing heterocyclic rings can be exemplified, and preferably 5- or 6-membered heterocyclic rings.

As the examples of the nitrogen-containing heterocyclic rings, those known as constituting the basic nucleus in merocyanine dyes described in L. G. Brooker et al., *J. Am. Chem. Soc.*, 73, pp. 5326 to 5358 (1951) and the bibliography cited therein can preferably be used. Specific examples include thiazoles (e.g., thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenylthiazole), 4-(2-thienyl)thiazole, etc.), benzothiazoles (e.g., benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole, 5thiazole, -ethoxycarbonylbenzothiazole, etc.), naphthothiazoles (e.g., naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole, 7-methoxynaphtho[1,2]thiazole, etc.), thianaphtheno-7',6',4,5-thiazoles (e.g., 4'-methoxythianaphtheno-7',6',4,5-thiazole, etc.), oxazoles (e.g., 4-methyloxazole, 5-methyloxazole, 4-phenyloxazole, 4,5-diphenyloxazole, 4-ethyloxazole, 4,5-dimethyloxazole, 5-phenyloxazole, etc.), benzoxazoles (e.g., benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 6-methoxybenzoxazole, 5-hydroxybenzoxazole, 6-hydroxybenzoxazole, etc.), naphthoxazoles (e.g., naphtho[1,2]oxazole, naphtho[2,1]oxazole, etc.), selenazoles (e.g., 4-methylselenazole, 4-phenylselenazole, etc.), benzoselenazoles (e.g., benzoselenazole, 5-chlorobenzoselenazole, 5-methoxybenzoselenazole, 5-hydroxybenzoselenazole, tetrahydrobenzoselenazole, etc.), naphthoselenazoles (e.g., naphtho[1,2]selenazole, naphtho[2,1]selenazole, etc.), thiazolines (e.g., thiazoline, 4-methylthiazoline, etc.), 2-quinolines (e.g., quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline, 8-hydroxyquinoline, etc.), 4-quinolines (e.g., quinoline, 6-methoxyquinoline, 7-methylquinoline, 8-methylquinoline, etc.), 1-isoquinolines (e.g., isoquinoline, 3,4-dihydroisoquinoline, etc.), 3-isoquinolines (e.g., isoquinoline, etc.), benzimidazoles (e.g., 1,3-diethylbenzimidazole, 1-ethyl-3-phenylbenzimidazole, etc.), 3,3-dialkylindolenines (e.g., 3,3-dimethylindolenine, 3,3,5-trimethylindolenine, 3,3,7-trimethylindolenine, etc.), and 2-pyridines (e.g., pyridine, 5-methylpyridine, etc.), and 4-pyridines (e.g., pyridine, etc.). These basic nuclei can be used as dihydrogenated alkylidene derivatives in the present invention.

Of the above examples of nitrogen-containing or sulfur-containing heterocyclic rings formed by $Y_1$ and $Y_2$ in formula (I-1) together with the adjacent A or B described above and the adjacent carbon atoms, the dye having the structure represented by the following formula (I-2) is particularly preferred because it is excellent in exposure aptitude at 350 to 450 nm, it has high sensitization property and, further, it can provide a photopolymerizable composition very excellent in storage stability.

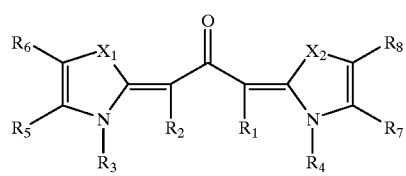

(I-2)

wherein $R_1$, $R_2$, $R_3$, and $R_4$ each has the same meaning as defined in formula (I-1); $X_1$ and $X_2$ each represents an O atom, an S atom, an Se atom, $NR_9$ or $CR_{10}R_{11}$; $R_9$, $R_{10}$ and $R_{11}$ each represents an alkyl group having from 1 to 6 carbon atoms, or a substituted or unsubstituted phenyl group; and $R_5$, $R_6$, $R_7$ and $R_8$ each represents a hydrogen atom, an alkyl group having from 1 to 6 carbon atoms, an alkoxyl group having from 1 to 6 carbon atoms, a substituted or unsubstituted phenyl group, chlorine or bromine, and $R_5$ and $R_6$, and $R_7$ and $R_8$ may be bonded to each other to form an aliphatic or aromatic ring. When they are bonded to each other to form a ring, the ring may be formed via an oxygen atom, a nitrogen atom, or a sulfur atom, besides a carbon atom. Preferred examples of the rings include rings formed via a substituted or unsubstituted alkylene group, an ether bond, an ester bond, an amido bond, etc. As preferred examples of the substituted or unsubstituted alkyl group, the substituted or unsubstituted aryl group, and the substituents, the same groups as described in $R_3$ and $R_4$ in formula (I-1) can be exemplified.

In the preferred embodiment of the present invention, $X_1$ and $X_2$ are the same, and represents S or $C(CH_3)_2$; $R_1$ plus $R_2$ (the case in which $R_1$ and $R_2$ are bonded to each other to form a ring) is $-(CH_2)_2-$ or $-(CH_2CHR_{14}CH_2)-$ (wherein $R_{14}$ represents H or t-butyl); $R_3$ and $R_4$ are the same, and represents $CH_3$ or $C_2H_5$; $R_1$ and $R_2$ each represents H; $R_5$ and $R_6$ each represents hydrogen, or they are bonded to each other to form an aromatic ring; $R_7$ and $R_8$ each represents hydrogen, or they are bonded to each other to form an aromatic ring. Concerning the substituted or unsubstituted alkyl group, the alkylene group and the substituents in formula (I-2), the same groups as described in formula (I-1) can be exemplified.

Chemical structural formulae (D1) to (D25) are shown below as more specific examples of the sensitizing dyes according to the present invention, however, the sensitizing dyes for use in the present invention is not limited to the following chemical structures and any sensitizing dye can be preferably used so long as it satisfies the structural requisites described above.

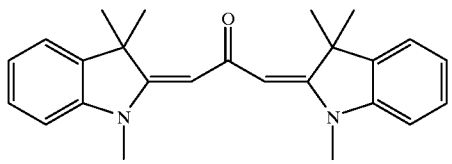

(D1)

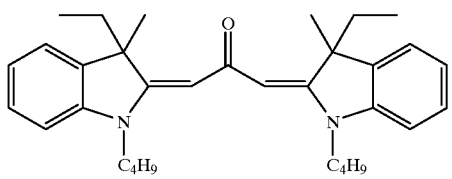

(D2)

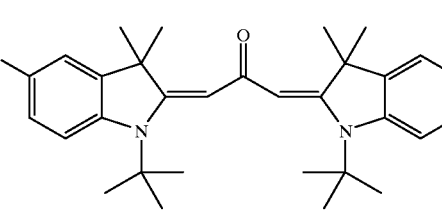

(D3)

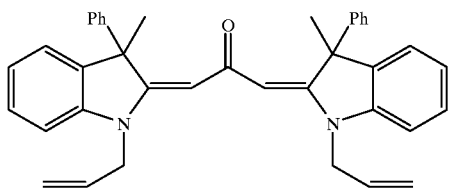

(D4)

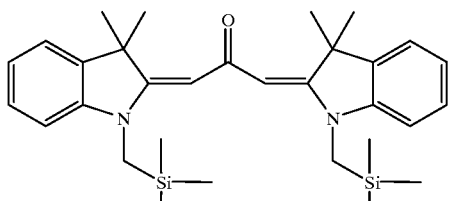

(D5)

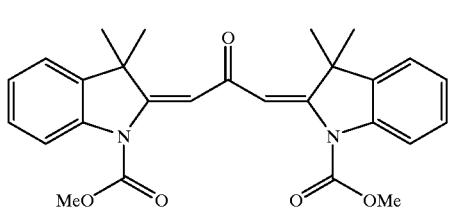

(D6)

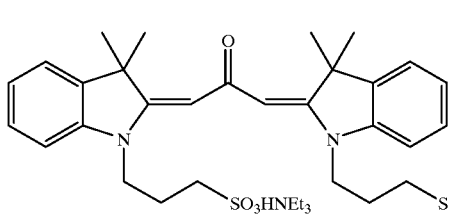

(D7)

(D8)
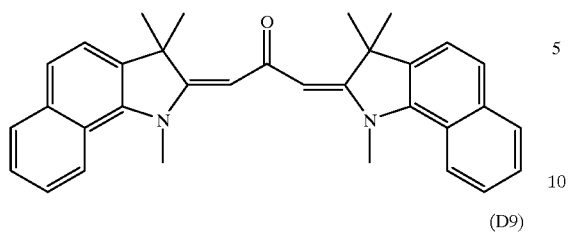
(D9)
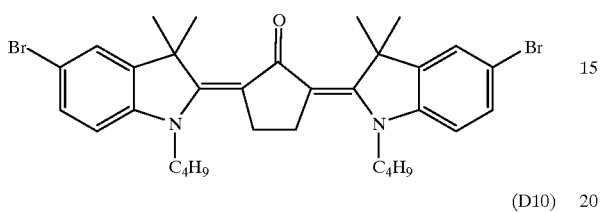
(D10)
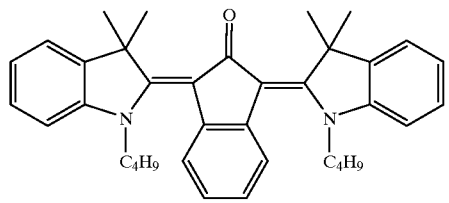
(D11)
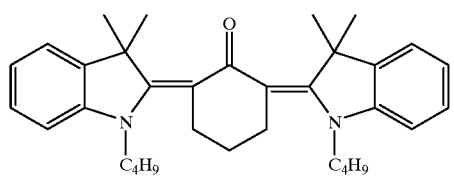
(D12)
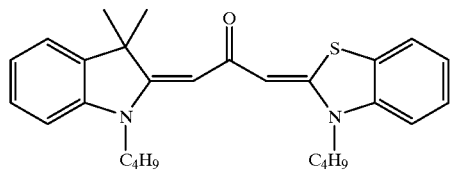
(D13)
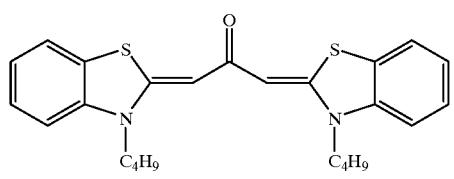
(D14)
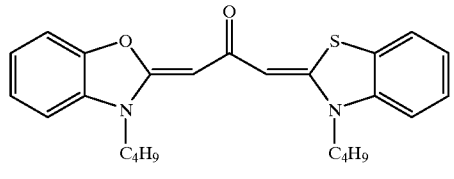
(D15)
(D16)
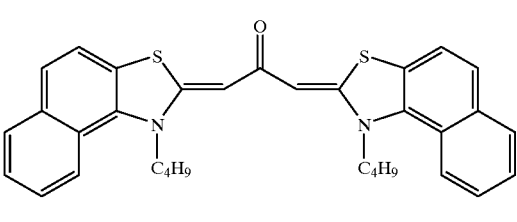
(D17)
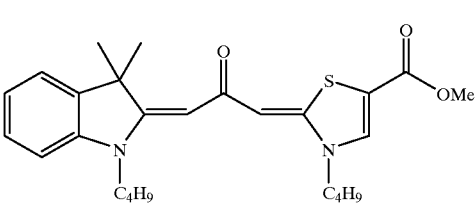
(D18)
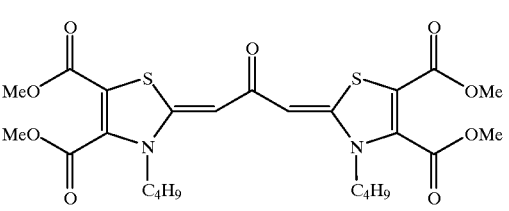
(D19)
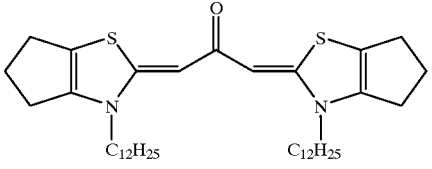
(D20)
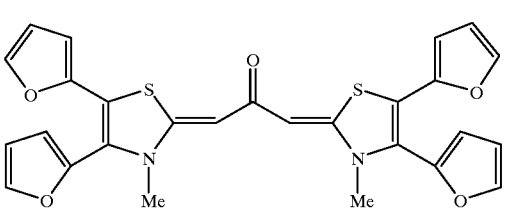
(D21)
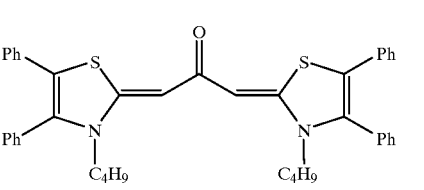
(D22)
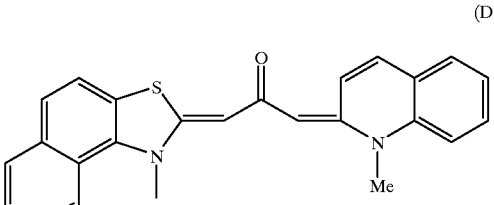

-continued

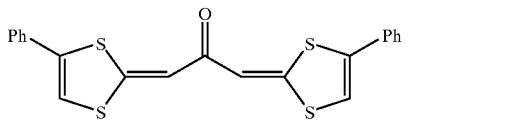
(D23)

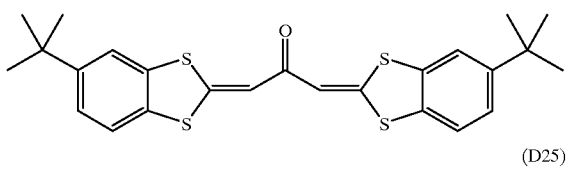
(D24)

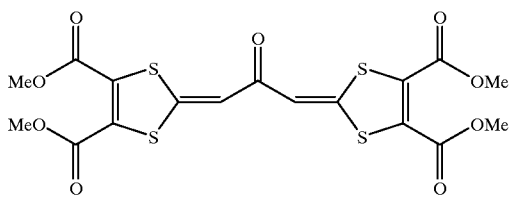
(D25)

Sensitizing dyes represented by formula (I-1) or (I-2) according to the present invention can be produced by Claisen-Schmidt condensation reaction of 2-equivalent of appropriate aldehyde and 1-equivalent of appropriate ketone by base catalyst. A producing method by hydrolysis of a carbocyanine dye is disclosed in U.S. Pat. No. 3,672,906. Synthesizing methods by condensation of ketone and azothium salt are described in Slominskii et al., *Khim. Geterotsikl. Soedin.*, pp. 711 to 712 (1974), and *Chem. Abst.*, 81, 77828f (1974).

With respect to the sensitizing dyes according to the present invention, various chemical modifications can be performed for the purpose of improving the characteristics of photopolymerizable compositions. For example, in the case where the photopolymerizable composition according to the present invention is used as a photosensitive layer, the strength of the film to be exposed can be increased and the unnecessary precipitation of dyes from the film after exposure can be prevented by bonding the dye with addition polymerizable compound structure (e.g., an acryloyl group and a methacryloyl group) by means of covalent bonding, ionic bonding, and hydrogen bonding. Further, the photosensitivity of the photopolymerizable composition can be conspicuously increased with the state of the photoinitiator in low concentration by bonding sensitizing dyes with the later-described titanocene compound and other radical generating parts (e.g., reduction decomposition parts such as alkyl halide, onium, peroxide, biimidazole, etc., and oxidation cleavage parts such as borate, amine, trimethylsilylmethyl, carboxymethyl, carbonyl, imine, etc.). When the photopolymerizable composition according to the present invention is used as a lithographic printing plate precursor which is a preferred way of use of the present invention, the introduction of a hydrophilic part (an acid radical or a polar group such as a carboxyl group and the ester thereof, a sulfonic acid group and the ester thereof, and an ethylene oxide group, etc.) is effective for the purpose of improving the processing aptitude to a (alkali) water system developing solution. An ester type hydrophilic group is, in particular, excellent in compatibility due to its comparatively hydrophobic structure in a photosensitive layer, and generates an acid radical by hydrolysis in a developing solution, as a result hydrophilicity increases. In addition, substituents can be arbitrarily introduced for the purpose of improving compatibility and preventing crystal precipitation in a photosensitive layer. For example, in a certain kind of photosensitive system, unsaturated bonds of an aryl group and an allyl group are sometimes extremely effective for the improvement of compatibility and, further, crystal precipitation can be markedly inhibited by introducing steric hindrance between the π-plane of a dye and that of other dyes by a method of introducing branched alkyl structure, etc. Further, by the introduction or a phosphonic acid group, an epoxy group and a trialkoxysilyl group, etc., adhesion of metals and metallic oxides to inorganic substances can be improved. In addition, if necessary, a polymerizing method of a sensitizing dye can also be used.

The sensitizing dye can be arbitrarily used according to the design of the characteristics of the photosensitive material similarly to the addition polymerizable compound described below. For example, the compatibility with a photopolymerizable composition can be increased by the combined use of two or more sensitizing dyes. In the selection of the sensitizing dye, the molar extinction coefficient at the emission wavelength of the light source to be used is an important factor, in addition to the photosensitivity. If the dye having a large molar extinction coefficient is used, the addition amount of the dye can be relatively reduced, which is economical and is also advantageous from the point of view of the physical properties of the film of a photopolymerizable composition. Since the photosensitivity, the resolving power and the physical properties of exposed film of a photopolymerizable composition are largely influenced by the absorbance at a light source wavelength, the addition amount of the sensitizing dye is arbitrarily selected taking these factors into consideration. For example, sensitivity decreases in the region of absorbance of 0.1 or less. Further, resolving power decreases by the influence of halation. However, such low absorbance is sometimes rather effective for the purpose of increasing hardness of a thick film of 5 μm or more. When the sensitizing dye is used in a printing plate having a photosensitive layer comprising a photopolymerizable composition, almost all the light is absorbed on the surface of the photosensitive layer in a high region of absorbance of 3 or more, hence, curing is hindered at more inside of the film and the film strength and adhesion strength to a substrate become insufficient. When the sensitizing dye is used in a lithographic printing plate having a comparatively thin film thickness, it is preferred to set up the addition amount of the sensitizing dye such that the absorbance of the photosensitive layer becomes from 0.1 to 1.5, preferably from 0.25 to 1. When the sensitizing dye is used in a lithographic printing plate, the amount is in general from 0.05 to 30 weight parts, preferably from 0.1 to 20 weight parts, and more preferably from 0.2 to 10 weight parts, per 100 weight parts of the photopolymerizable composition component.

(ii) Titanocene Compound

Titanocene compounds for use in the present invention as a photoinitiator are not particularly limited and any compound can be used so long as it can generate active radicals when irradiated with light in the coexistence with the above-described sensitizing dyes. For example, well-known compounds disclosed in the following patents can be arbitrarily used: JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

More specifically, dicyclopentadienyl-Ti-dichloride, dicyclopentadienyl-Ti-bisphenyl, dicyclopentadienyl-Tibis-2,3,4,5,6-pentafluorophen-1-yl (hereinafter sometimes referred to as "T-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, and bis(cyclopentadienyl)-bis(2,6-difluoro-3-(1-H-pyrrol-1-yl)phenyl)titanium (hereinafter sometimes referred to as "T-2") can be exemplified.

Concerning the titanocene compounds according to the present invention similarly to the above-described sensitizing dyes, a variety of chemical modifications can be performed for the purpose of further improving the characteristics of photopolymerizable compositions. For example, a method of bonding titanocene compounds with sensitizing dyes, addition polymerizable unsaturated compounds and other radical generating parts, a method of introducing hydrophilic parts, a method of introducing substituents for the compatibility improvement and crystal precipitation prevention, a method of introducing substituents for adhesion improvement, and a method of polymerization can be utilized.

With respect to the usage of the titanocene compound, it can also be used arbitrarily according to the design of the characteristics of the photosensitive material similarly to the addition polymerizable compound and the sensitizing dye described above. For example, the compatibility with a photopolymerizable composition can be increased by using two or more compounds in combination. In general, the use amount of the titanocene compound is preferably large from the point of view of photosensitivity. The amount of from 0.5 to 80 weight parts and preferably from 1 to 50 weight parts per 100 weight parts of the photopolymerizable composition component is sufficient to obtain satisfactory photosensitivity. On the other hand, when the use under a yellow lamp and a white lamp is taken into consideration, which is a primary object of the present invention, the amount of the titanocene compound is preferably small from the point of fogging characteristic due to light in the vicinity of 500 nm. Even if the amount of the titanocene compound is reduced to 6 weight parts or less, further 1.9 weight parts or less, and still further 1.4 weight parts or less, sufficient photosensitivity can be obtained by the combined use with the sensitizing dye according to the present invention.

(B) Addition Polymerizable Compound

An addition polymerizable compound having at least one ethylenically unsaturated double bond is selected from among the compounds having at least one, preferably two or more, ethylenically unsaturated bond at terminals. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof, unsaturated carboxylic acids (e.g., acrylic acid, methacrylic acid, itaconic acid; crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)-phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

As examples of other esters, e.g., aliphatic alcohol esters disclosed in JP-B-46-27926, JP-B-51-47334 and JP-A-57-196231, those having an aromatic skeleton disclosed in JP-A-59-5240, JP-A-59-5241 and JP-A-2-226149, and those containing an amino group disclosed in JP-A-1-165613 can also be preferably used in the present invention.

Further, the mixtures of the above-described ester monomers can also be used.

Further, specific examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other preferred amide monomers, those having cyclohexylene structure disclosed in JP-B-54-21726 can be exemplified.

Further, urethane-based addition polymerizable compounds which are obtained by the addition reaction of an isocyanate and a hydroxyl group are also preferably used in the present invention, and as the specific example, as is disclosed in JP-B-48-41708, a vinyl urethane compound having two or more polymerizable vinyl groups in one molecule can be exemplified, which is obtained by the addition of a vinyl monomer having a hydroxyl group represented by the following formula (V) to a polyisocyanate compound having two or more isocyanate groups in one molecule.

$$CH_2=C(R)COOCH_2CH(R')OH \quad (V)$$

wherein R and R' each represents H or $CH_3$.

Further, urethane acrylates as disclosed in JP-A-51-37193, JP-B-2-32293, and JP-B-2-16765, and urethane compounds having an ethylene oxide skeleton as disclosed in JP-B-58-49860, JP-B-56-17654, JP-B-62-39417, and JP-B-62-39418 are also preferably used in the present invention.

Further, extremely high speed photopolymerizable compositions can be obtained by using addition polymerizable compounds having amino structure and sulfide structure in the molecule as disclosed in JP-A-63-277653, JP-A-63-260909 and JP-A-1-105238.

As other examples, polyfunctional acrylates and methacrylates, such as polyester acrylates, and epoxy acrylates obtained by reacting epoxy resins with (meth)acrylic acids as disclosed in JP-A-48-64183, JP-B-49-43191 and JP-B-52-30490 can be exemplified. Specific unsaturated compounds as disclosed in JP-B-46-43946, JP-B-1-40337, and JP-B-1-40336, and vinyl sulfonic acid compounds as disclosed in JP-A-2-25493 can also be exemplified. Further, according to cases, structures containing a perfluoroalkyl group as disclosed in JP-A-61-22048 are preferably used. Moreover, photo-curable monomers and oligomers introduced into *Bulletin of Nihon Setchaku Kyokai,* Vol. 20, No. 7, pp. 300–308 (1984) can be used as well.

The details in usage of the addition polymerizable compound, e.g., what structure is to be used, whether the compound is to be used alone or in combination, or what an amount is to be used, can be optionally set up according to the final design of the characteristics of the photosensitive material. For example, the conditions are selected from the following viewpoint. As for the photosensitive speed, the structure containing many unsaturated groups per molecule is preferred and in many cases bifunctional or more functional groups are preferred. For increasing the strength of an image part, i.e., a cured film, trifunctional or more functional groups are preferred, further, it is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but they are in some cases not preferred in the point of development speed and precipitation in a developing solution. The selection and usage of the addition polymerizable compound are important factors for the compatibility with other components (e.g., a binder polymer, an initiator, a colorant, etc.) in the photopolymerizable composition and dispersibility, for example, sometimes compatibility can be improved by using a low purity compound or two or more compounds in combination. Further, it is also possible to select a compound having specific structure for the purpose of improving the adhesion property of a support and an overcoat layer. Concerning the compounding ratio of the addition polymerizable compound in a photopolymerizable composition, the more the amount, the higher is the sensitivity, but too large an amount sometimes results in disadvantageous phase separation, problems in manufacturing process due to the stickiness of the photopolymerizable composition (e.g., manufacturing failure resulting from the transfer and adhesion of the photosensitive material components), and precipitation from a developing solution. From these points of view, a preferred compounding ratio of the addition polymerizable compound is in many cases from 5 to 80 weight parts, preferably from 25 to 75 weight parts, based on the entire composition components. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation and surface adhesion. Further, the layer constitution and the coating method of undercoating and overcoating can be performed according to circumstances.

(C) Binder Polymer

When a photopolymerizable composition is applied to a lithographic printing plate, which is a preferred embodiment of the present invention, it is preferred for the photopolymerizable composition to further contain a binder polymer. As the binder polymer, linear organic high molecular polymers are preferably used. Any compound can be used as such "linear organic high molecular polymers". Water- or weak alkali water-soluble or swelling linear organic high molecular polymers capable of water development or weak alkali water development are preferably selected. Linear organic high molecular polymers are selected and used not only as a film-forming agent of the composition but according to the purpose as a water developer, a weak alkali water developer or an organic solvent developer. For example, when water-soluble linear organic high molecular polymers are used, water development becomes possible. As such linear organic high molecular polymers, addition polymers having a carboxylic acid group at the side chain, e.g., the polymers disclosed in JP-A-59-44615, JP-B-54-34327, JP-B-58-12577, JP-B-54-25957, JP-A-54-92723, JP-A-59-53836 and JP-A-59-71048, i.e., a methacrylic acid copolymer, an acrylic acid copolymer, an itaconic acid copolymer, a crotonic acid copolymer, a maleic acid copolymer, and a partially esterified maleic acid copolymer, can be exemplified. Acidic cellulose derivatives having a carboxylic acid group at the side chain can also be used. Besides the above, the polymers obtained by adding a cyclic acid anhydride to an addition polymer having a hydroxyl group are also useful.

Of these polymers, in particular, copolymers of [benzyl (meth)acrylate-(meth)acrylic acid-other addition polymerizable vinyl monomer according to necessity] and [allyl (meth)acrylate-(meth)acrylic acid-other addition polymerizable vinyl monomer according to necessity] are excellent in the balance of film strength, sensitivity and developability hence advantageously used in the present invention.

Since the urethane-based binder polymers having an acid radical disclosed in JP-B-7-12004, JP-B-7-120041, JP-B-7-120042, JP-B-8-12424, JP-A-63-287944, JP-A-63-287947, JP-A-1-271741, and Japanese Patent Application No. 10-116232 are very excellent in strength, advantageous in the point of press life and low exposure aptitude.

The binder having an amido group disclosed in JP-A-11-171907 has both excellent developability and film strength.

In addition to the above, polyvinyl pyrrolidone and ethylene oxide are useful as the water-soluble linear organic high molecular polymer. For increasing cured film strength, alcohol-soluble nylon, polyethers of 2,2-bis(4-hydroxyphenyl)propane and epichlorohydrin are also useful. These linear organic high molecular polymers can be mixed in an arbitrary amount in the entire composition, but when the amount exceeds 90 wt %, image strength, etc., are adversely influenced. A preferred amount is from 3 to 85 wt %. The weight ratio of the compound having photopolymerizable ethylenically unsaturated double bond and the linear organic high molecular polymer is preferably within the range of from 1/9 to 7/3. In a preferred embodiment of the present invention, the binder polymer to be used is substantially water-insoluble and alkali-soluble, by which the organic solvents which are environmentally undesirable as developing solution can be done without, or the use amount can be limited to extremely small amount. In such a usage, the acid value (acid content per g of the polymer represented in chemical equivalent weight) and the molecular weight of the binder polymer are appropriately selected from the viewpoint of the image strength and developability. The acid value is preferably from 0.4 to 3.0 meq/g, more preferably from 0.6 to 2.0 meq/g, and the molecular weight is preferably from 3,000 to 500,000, more preferably from 10,000 to 300,000.

The photosensitive composition in another embodiment of the present invention comprises a carbazole compound represented by formula (II-1) (hereinafter referred to as simply "a carbazole compound"), a titanocene compound, and a compound which reacts with a radical or an acid to change and retain the physical or chemical characteristics.

The present inventors have found that the sensitivity of the photosensitive composition according to the present invention in the wavelength region corresponding to the absorption band of the carbazole compound is markedly improved by the combined use of the carbazole compound and the titanocene compound. The functions of the two compounds in the present invention are not clear but it can be presumed that the carbazole compound functions as a sensitizing dye, absorbs exposure light and forms an excitation state to accelerate the generation of an initiating radical from the coexisting titanocene compound (such a process is hereinafter referred to as "dye sensitization").

One reason why the sensitizing dyes according to the present invention are superior is that their absorption wavelength is within the region of from 350 nm to 450 nm. Further, the greatest part of titanocene compounds described later per se have weak absorption in the wavelength region of from ultraviolet to the vicinity of 500 nm and also have photosensitivity in the same region, but since the sensitizing dyes having a specific structure according to the present invention extremely improve the photosensitivity of the titanocene compounds, it is possible, on one hand, to sufficiently increase the photosensitivity in short wavelength region by confining the use amount of the titanocene compounds to a relatively small amount, on the other hand, at the same time, it is possible to make the photosensitivity in 500 nm region by the titanocene compounds themselves low, therefore, safelight aptitude of the photosensitive compositions can be improved. The present inventors have found that the above characteristics can be obtained when the sensitizing dye satisfies the following structural characteristics, thus the present invention has been attained. That is, remarkably high sensitivity and excellent absorption characteristic can be obtained when the basic nucleus of a styryl type dye has carbazole structure, and the acidic nucleus has a 5-membered ring carbonyl structure. The definition of "acidic nucleus" is described in T. H. James, *The Theory of The Photographic Process*, Fourth Edition, Chapter 8, Macmillan Publishing Co. The sensitizing dye represented by a merocyanine dye generally has 1) basic (electron-donative) and 2) acidic (electron-acceptive) heterocyclic rings at terminals, and 1) a basic (electron-donative) heterocyclic ring is called a basic nucleus, and 2) an acidic (electron-acceptive) heterocyclic ring is called an acidic nucleus. Examples of basic nuclei and acidic nuclei are described in detail in the above T. H. James, *The Theory of The Photographic Process*, Fourth Edition, Chapter 8, Macmillan Publishing Co.

The reason why the sensitizing dyes having a specific structure according to the present invention have particularly excellent dye sensitization property cannot be described in detail as the mechanism of dye sensitization is unknown but it can be presumed as follows. That is, the sensitizing dyes in the present invention exhibit high emission (fluorescence or phosphorescence) spectrum, which suggests, as one possibility, that the life in excitation state of the dye having the structure represented by partial structural formula (1) is relatively long, as a result, the dye functions to make the reaction with an activator efficient.

A. Photopolymerization Initiator

The photopolymerization initiator for use in the photosensitive composition according to the present invention comprises a carbazole sensitizing dye and a titanocene compound.

(A1) Sensitizing Dye

The carbazole sensitizing dye which constitutes the photoinitiator for use in the photosensitive composition according to the present invention is represented by formula (II-1):

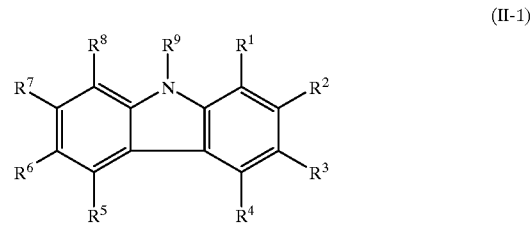

wherein $R^1$, $R^2$, $R^3$, $R^4$, $R^5$, $R^6$, $R^7$, $R^8$ and $R^9$ each represents a hydrogen atom, or a monovalent non-metallic atomic group, provided that at least one of $R^1$ and $R^3$ is a monovalent organic residue represented by the following partial structural formula (1), and $R^1$, $R^2$, $R^3$, $R^4$, $R^5$, $R^6$, $R^7$, $R^8$ and $R^9$ each may be bonded to each other to form an aliphatic or aromatic group;

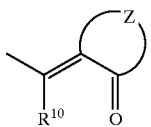

(1)

wherein $R^{10}$ represents a hydrogen atom, or a monovalent non-metallic atomic group; Z represents a divalent non-metallic atomic group necessary to form a 5-membered ring acidic nucleus, which may have a substituent, together with the adjacent atomic group, and $R^{10}$ may be bonded to $R^1$, $R^2$, $R^3$, $R^4$, $R^5$, $R^6$, $R^7$, $R^8$ or $R^9$ to form an aliphatic or aromatic ring.

Formula (II-1) and partial structural formula (1) will be described in detail below.

$R^1$, $R^2$, $R^3$, $R^4$, $R^5$, $R^6$, $R^7$, $R^8$, $R^9$ and $R^{10}$ each represents a hydrogen atom, or a monovalent non-metallic atomic group, and each preferably represents a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxyl group, a substituted or unsubstituted alkylthio group, a hydroxyl group or a halogen atom.

Preferred examples of $R^1$, $R^2$, $R^3$, $R^4$, $R^5$, $R^6$, $R^7$, $R^8$, $R^9$ and $R^{10}$ are specifically described. Preferred examples of the alkyl groups include a straight chain, branched or cyclic alkyl groups having from 1 to 20 carbon atoms, and specific examples include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these groups, a straight chain alkyl group having from 1 to 12 carbon atoms, a branched alkyl group having from 3 to 12 carbon atoms, and a cyclic alkyl group having from 5 to 10 carbon atoms are more preferred.

Examples of the substituents of the substituted alkyl groups are monovalent non-metallic atomic groups exclusive of a hydrogen atom, and preferred examples include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylaminogroup, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—$PO_3H_2$) and a conjugate base group thereof (hereinafter referred to as a phosphonato group), a dialkylphosphono group (—$PO_3(alkyl)_2$), a diarylphosphono group (—$PO_3(aryl)_2$), an alkylarylphosphono group (—$PO_3(alkyl)(aryl)$), a monoalkylphosphono group (—$PO_3H(alkyl)$) and a conjugate base group thereof (hereinafter referred to as an alkylphosphonato group), a monoarylphosphono group (—$PO_3H(aryl)$) and a conjugate base group thereof (hereinafter referred to as an arylphosphonato group), a phosphonooxy group (—$OPO_3H_2$) and a conjugate base group thereof (hereinafter referred to as a phosphonatooxy group), a dialkylphosphonooxy group (—$OPO_3(alkyl)_2$), a diarylphosphonooxy group (—$OPO_3(aryl)_2$), an alkylarylphosphonooxy group (—$OPO_3(alkyl)(aryl)$), a monoalkylphosphonooxy group (—$OPO_3H(alkyl)$) and a conjugate base group thereof (hereinafter referred to as an alkylphosphonatooxy group), a monoarylphosphonooxy group (—$OPO_3H(aryl)$) and a conjugate base group thereof (hereinafter referred to as an arylphosphonatooxy group), a cyano group, a nitro group, an aryl group, a heteroaryl group, an alkenyl group, and an alkynyl group.

As the specific examples of the alkyl groups in these substituents, the above-described alkyl groups can be exemplified. As the specific examples of the aryl groups, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group can be exemplified.

As the examples of the heteroaryl groups, a monocyclic or polycyclic aromatic ring containing at least one of nitrogen, oxygen and sulfur atoms are used, and particularly preferred examples of the heteroaryl groups include thiophene, thianthrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthyridine, quinazoline, cinnoline, pteridine, carbazole, carboline, phenanthrene, acridine, perimidine, phenanthroline, phthalazine, phenarsazine, phenoxazine, furazane, and phenoxazine. These groups may further be benzo-condensed or may have a substituent.

As the examples of the alkenyl groups, a vinyl group, a 1-propenyl group, a 1-butenyl group, a cinnamyl group, and a 2-chloro-1-ethenyl group can be exemplified, and as the examples of the alkynyl groups, an ethynyl group, a 1-propynyl group, a 1-butynyl group and a trimethylsilyl-ethynyl group can be exemplified.

As $G_1$ in the acyl group ($G_1CO$—), a hydrogen atom and the above-described alkyl groups and aryl groups can be exemplified.

Of these substituents, more preferred examples include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group, and an alkenyl group.

On the other hand, as the alkylene group in the substituted alkyl group, the alkylene groups obtained by removing any one hydrogen atom on the above-described alkyl groups having from 1 to 20 carbon atoms to make divalent organic residues can be exemplified, preferably a straight chain alkylene group having from 1 to 12 carbon atoms, a branched alkylene group having from 3 to 12 carbon atoms, and a cyclic alkylene group having from 5 to 10 carbon atoms.

The substituents of the preferred substituted alkyl groups represented by $R^1$, $R^2$, $R^3$, $R^4$, $R^5$, $R^6$, $R^7$, $R^8$, $R^9$ and $R^{10}$ obtained by combining the above substituents and alkylene groups are arbitrary, but specific examples of the preferred substituted alkyl groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl) carbamoylethyl group, an N-methyl-N-(sulfophenyl) carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Preferred examples of the aryl groups represented by $R^1$, $R^2$, $R^3$, $R^4$, $R^5$, $R^6$, $R^7$, $R^8$, $R^9$ and $R^{10}$ are a condensed ring formed by 1 to 3 benzene rings and a condensed ring formed by a benzene ring and a 5-membered unsaturated ring, and specific examples include a phenyl group, a naphthyl group, an anthryl group, a phenanthryl group, an indenyl group, an acenaphthenyl group, and a fluorenyl group. Of these, a phenyl group and a naphthyl group are more preferred.

Specific examples of the preferred substituted aryl groups represented by $R^1$, $R^2$, $R^3$, $R^4$, $R^5$, $R^6$, $R^7$, $R^8$, $R^9$ and $R^{10}$ are those having a monovalent non-metallic atomic groups exclusive of a hydrogen atom on the ring-forming carbon atoms of the above-described aryl groups as the substituent. As preferred examples of the substituents, the above-described alkyl groups, substituted alkyl groups, and those described above as the examples of the substituents in the substituted alkyl groups can be exemplified. Preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl)carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

In the next place, Z in partial structural formula (1) for formula (II-1) will be described. Z represents a divalent non-metallic atomic group necessary to form a 5-membered ring acidic nucleus, which may have a substituent, together with the adjacent atomic group. Specific examples of the acidic nuclei include a 1,3-dicarbonyl nucleus (e.g., 1,3-indanedione, 1,3-dioxane-4,6-dione, etc.), a pyrazolinone nucleus (e.g., 3-methyl-1-phenyl-2-pyrazolin-5-one, 1-phenyl-2-pyrazolin-5-one, 1-(2-benzothiazolyl)-3-methyl-2-pyrazolin-5-one, etc.), an isooxazolinone nucleus (e.g., 3-phenyl-2-isooxazolin-5-one, 3-methyl-2-isooxazolin-5-one, etc.), an oxyindole nucleus (e.g., 1-alkyl-2,3-dihydro-2-oxyindole, etc.), a 2-thio-2,4-thiazolidinedione nucleus (e.g., rhodanine and N-substituted derivatives thereof, e.g., 3-methylrhodanine, 3-ethylrhodanine, 3-phenylrhodanine, 3-allylrhodanine, 3-benzylrhodanine, 3-carboxymethylrhodanine, 3-carboxyethylrhodanine, 3-methoxycarbonylmethylrhodanine, 3-hydroxyethylrhodanine, 3-morpholinoethylrhodanine, etc.), a 2-thio-2,4-oxazolidinedione nucleus (i.e., a 2-thio-2,4-(3H,4H)-oxazoledione nucleus, e.g., 2-ethyl-2-thio-2,4-oxazolidinedione, etc.), a thianaphthenone nucleus (e.g., 3(2H)-thianaphthenone, 3(2H)-thianaphthenone-1,1-dioxide, etc.), a 2-thio-2,5-thiazolidinedione nucleus (e.g., 3-ethyl-2-thio-2,5-thiazolidinedione, etc.), a 2,4-thiazolidinedione nucleus (e.g., 2,4-thiazolidinedione, 3-ethyl-4-thiazolidinedione, 3-phenyl-2,4-thiazolidinedione, etc.), a thiazolidinone nucleus (e.g., 4-thiazolidinone, 3-ethyl-4-thiazolidinone, 2-ethylmercapto-4-thiazolidinone, 2-methylphenylamino-4-thiazolidinone, etc.), a 2-imino-2-oxazolin-4-one nucleus (i.e., a pseudo-hydantoin nucleus), a 2,4-imidazolidinedione nucleus (i.e., a hydantoin nucleus, e.g., 2,4-imidazolidinedione, 3-ethyl-2,4-imidazolidinedione, 1,3-diethyl-2,4-imidazolidinedione, etc.), a 2-thio-2,4-imidazolidinedione nucleus (i.e., a thiohydantoin nucleus, e.g., 2-thio-2,4-imidazolidinedione, 3-ethyl-2-thio-2,4-imidazolidinedione, 1,3-diethyl-2-thio-2,4-imidazolidinedione, etc.), an imidazolin-5-one nucleus (e.g., 2-propylmercapto-2-imidazolin-5-one, etc.), a furan-5-one nucleus, and a thioindoxyl nucleus (e.g., 5-methylthioindoxyl, etc.), and these acidic nuclei may further have a substituent.

Of the above described carbazole sensitizing dyes represented by formula (II-1) and partial structural formula (1), the dye having the structure represented by the following formula (II-2), (II-3), (II-4), (II-5) or (II-6) has high sensitization property and provides a photosensitive composition having excellent storage stability, therefore, particularly preferably used in the present invention.

(II-2)

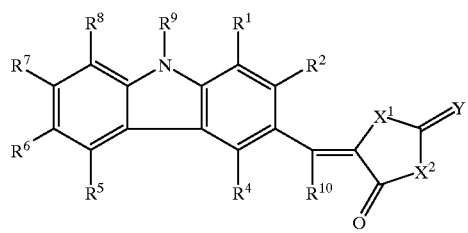

(II-3)

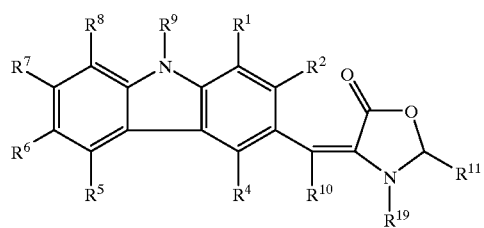

(II-4)

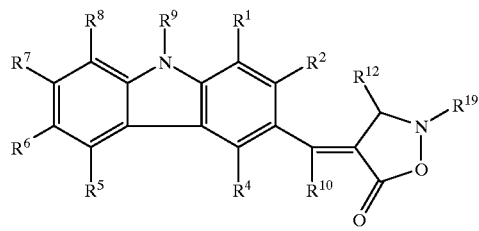

(II-5)

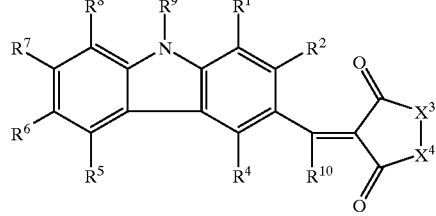

(II-6)

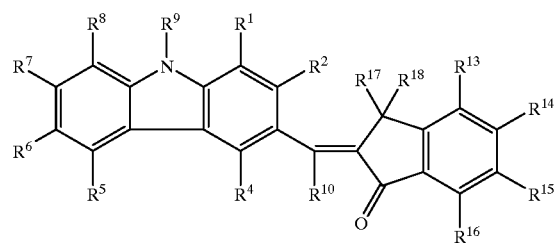

In formulae (II-2) to (II-6), $R^1$, $R^2$, $R^3$, $R^4$, $R^5$, $R^6$, $R^7$, $R^8$, $R^9$ and $R^{10}$ each has the same meaning as defined in formula (II-1) and partial structural formula (1); $X^1$, $X^2$, $X^3$ and $X^4$ each represents an O atom, an S atom, or $NR^{20}$; Y represents an O atom, an S atom; or $NR^{21}$; and $R^{11}$, $R^{12}$, $R^{13}$, $R^{14}$, $R^{15}$, $R^{16}$, $R^{17}$, $R^{18}$, $R^{19}$, $R^{20}$ and $R^{21}$ each represents a hydrogen atom, or a monovalent non-metallic atomic group, and they may be bonded to each other to form an aliphatic or aromatic ring, each of which each may have a substituent.

Formulae (II-2) to (II-6) are described in detail below.

In formulae (II-2) to (II-6), $R^1$, $R^2$, $R^3$, $R^4$, $R^5$, $R^6$, $R^7$, $R^8$, $R^9$ and $R^{10}$ each has the same meaning as defined in formula (II-1) and partial structural formula (1). $R^{11}$, $R^{12}$, $R^{13}$, $R^{14}$, $R^{15}$, $R^{16}$, $R^{17}$, $R^{18}$, $R^{19}$, $R^{20}$ and $R^{21}$ each represents a hydrogen atom, or a monovalent non-metallic atomic group, and each preferably represents a substituted or unsubstituted alkyl group, a substituted or unsubstituted alkenyl group, a substituted or unsubstituted aryl group, a substituted or unsubstituted heteroaryl group, a substituted or unsubstituted alkoxyl group, a substituted or unsubstituted alkylthio group, a hydroxyl group or a halogen atom. $R^{13}$, $R^{14}$, $R^{15}$, $R^{16}$, $R^{17}$, $R^{18}$ and $R^{19}$ may be bonded to each other to form an aliphatic or aromatic ring, each of which may have a substituent. As preferred examples of $R^{11}$, $R^{12}$, $R^{13}$, $R^{14}$, $R^{15}$, $R^{16}$, $R^{17}$, $R^{18}$, $R^{19}$, $R^{20}$ and $R^{21}$, the same examples as described in $R^1$, $R^2$, $R^3$, $R^4$, $R^5$, $R^6$, $R^7$, $R^8$, $R^9$ and $R^{10}$ in formula (II-1) can be exemplified.

In formulae (II-2) to (II-6), $X^1$, $X^2$, $X^3$ and $X^4$ each represents an O atom, an S atom, or $NR^{20}$; Y represents an O atom, an S atom, or $NR^{21}$.

The sensitizing dyes represented by formulae (II-2) to (II-6) can be obtained by the condensation reaction of the above-described acidic nucleus, an acidic nucleus having an active methylene group with a substituted or unsubstituted carbazole carboaldehyde, and these dyes can be synthesized by referring to JP-B-59-28329.

Preferred specific examples (D1) to (D31) of the compound represented by formula (II-1) are shown below, but the present invention is not limited thereto. Further, the isomer by the double bond connecting an acidic nucleus with a carbazole skeleton is not clear and the present invention is not limited to either isomer.

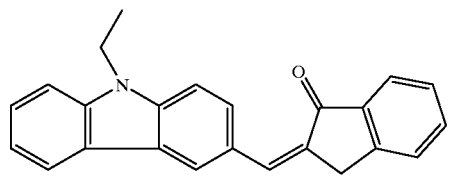

(D1)

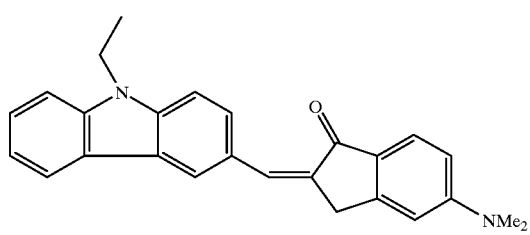

(D2)

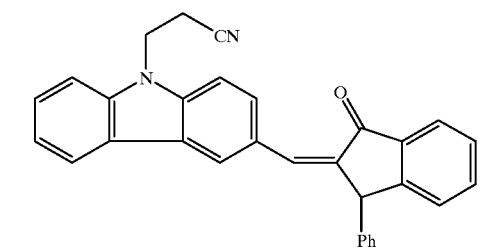

(D3)

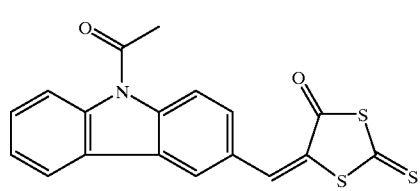

(D4)

-continued

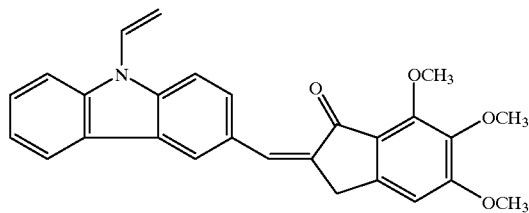

(D5)

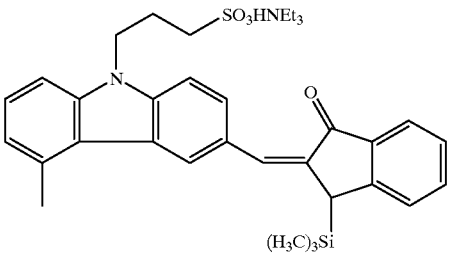

(D6)

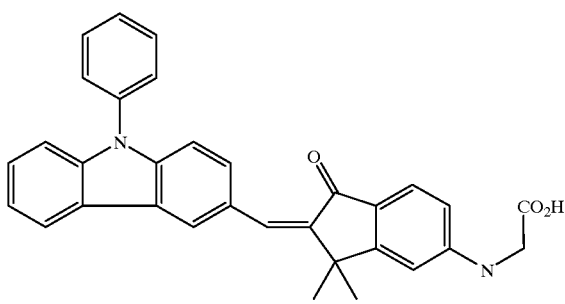

(D7)

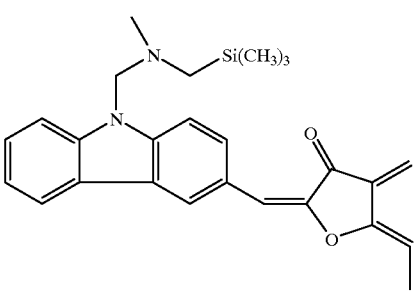

(D8)

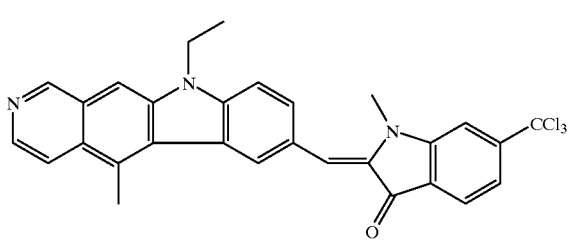

(D9)

(D10)
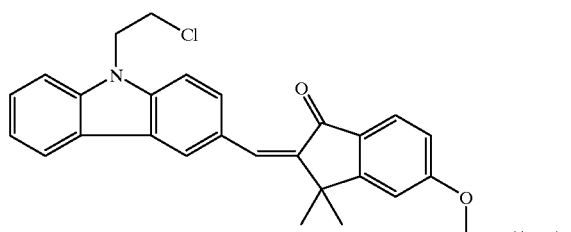
(D11)
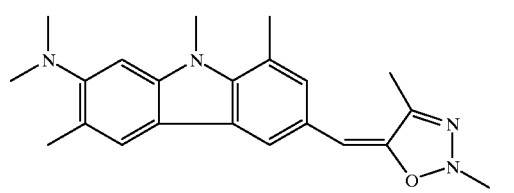
(D12)
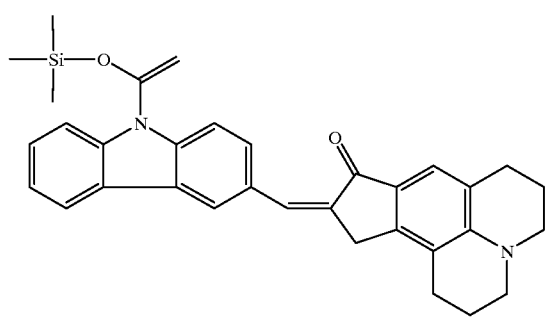
(D13)
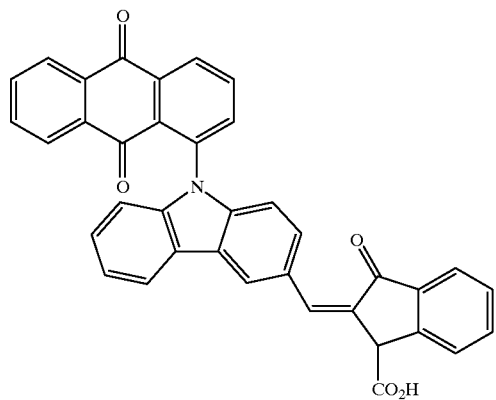
(D14)
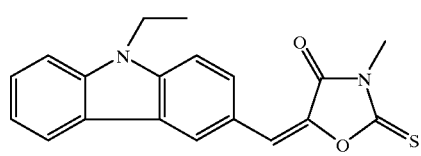
(D15)
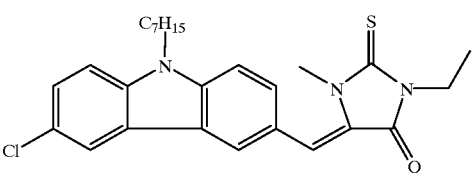
(D16)
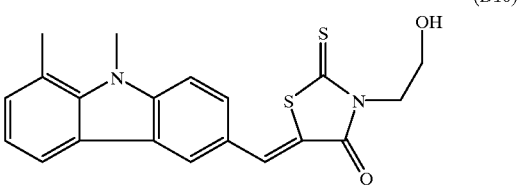
(D17)
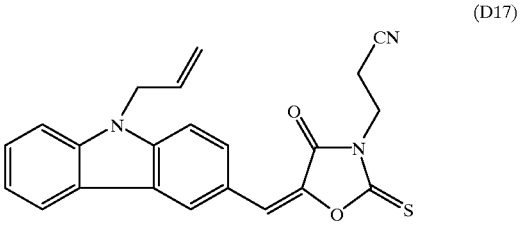
(D18)
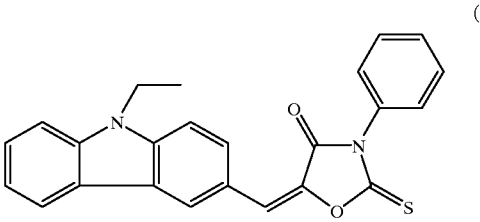
(D19)
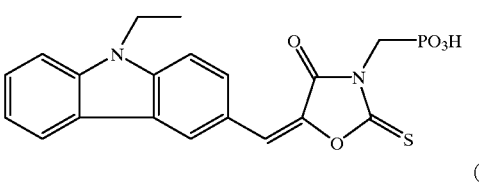
(D20)
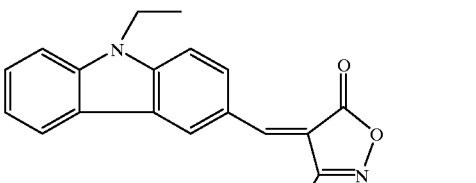
(D21)
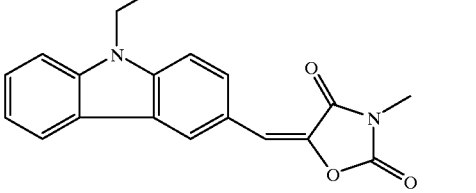

-continued (D22)
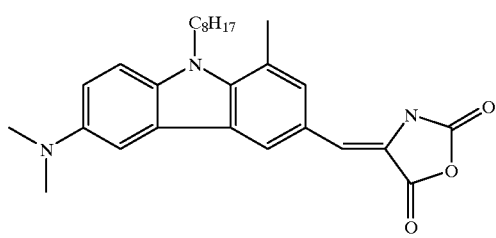

(D23)
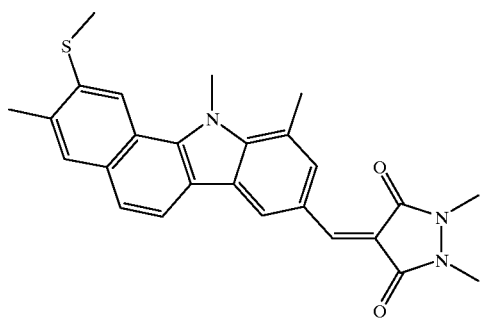

(D24)
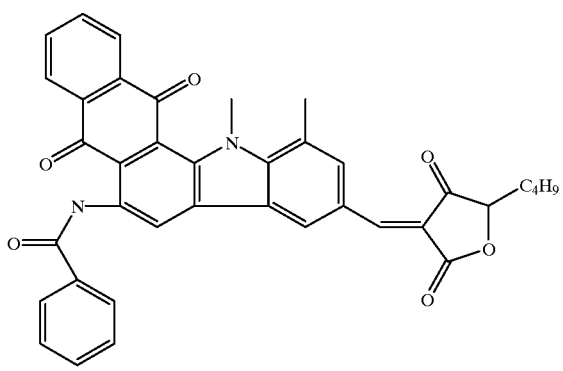

(D25)
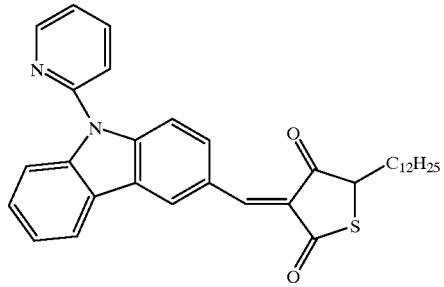

(D26)
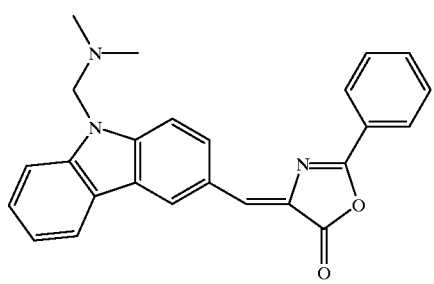

-continued (D27)
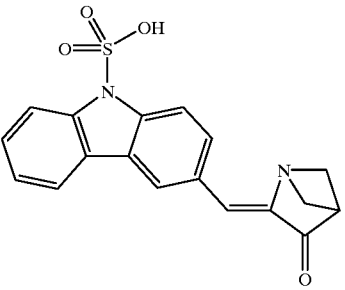

(D28)
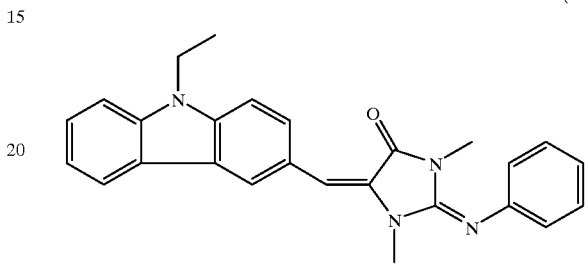

(D29)
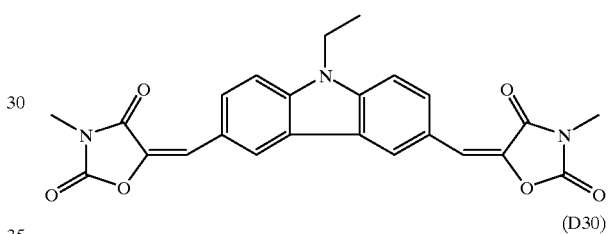

(D30)
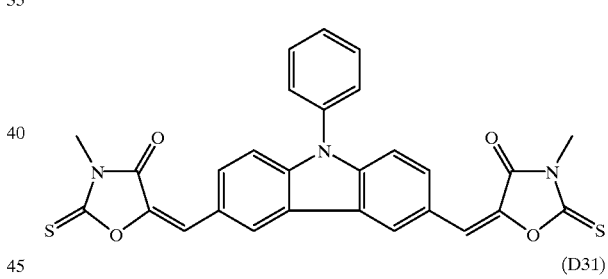

(D31)
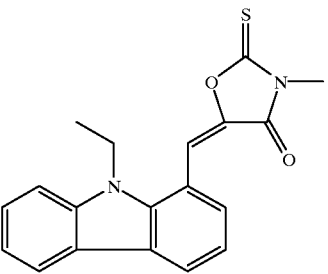

With respect to the carbazole sensitizing dyes contained in the photosensitive composition of the present invention, in the case where they are used as a lithographic printing plate precursor, various chemical modifications can be performed for the purpose of improving the characteristics of the photosensitive layer. For example, the strength of the film to be exposed can be increased and the unnecessary precipitation of dyes from the film after exposure can be prevented by bonding the sensitizing dye with addition polymerizable compound structure (e.g., an acryloyl group and a methacryloyl group) by means of covalent bonding, ionic bonding, and hydrogen bonding. Further, the photosensitivity of the photosensitive composition can be conspicuously increased with the state of the photoinitiator in low concentration by bonding the sensitizing dyes with the later-described titanocene compound and other radical generating parts (e.g., reduction decomposition parts such as alkyl halide, onium, peroxide, biimidazole, etc., and oxidation cleavage parts such as borate, amine, trimethylsilylmethyl, carboxymethyl, carbonyl, imine, etc.). For the purpose of improving the processing aptitude of the lithographic printing plate precursor using the photosensitive composition according to the present invention to a (alkali) water system developing solution, which is a preferred way of use of the present invention, the introduction of a hydrophilic part (an acid radical or a polar group such as a carboxyl group and the ester thereof, a sulfonic acid group and the ester thereof, and an ethylene oxide group, etc.) is effective. An ester type hydrophilic group is, in particular, excellent in compatibility due to its comparatively hydrophobic structure in the photosensitive layer of a lithographic printing plate precursor, and generates an acid radical by hydrolysis in a developing solution, as a result hydrophilicity increases. In addition, substituents can be arbitrarily introduced for the purpose of improving compatibility and preventing crystal precipitation in the photosensitive layer of a lithographic printing plate precursor. For example, in a certain kind of photosensitive system, unsaturated bonds of an aryl group and an allyl group are sometimes extremely effective for the improvement of compatibility and, further, crystal precipitation can be markedly inhibited by introducing steric hindrance between the π-plane of a dye and that of other dyes by a method of introducing branched alkyl structure, etc. Further, by the introduction of a phosphonic acid group, an epoxy group and a trialkoxysilyl group, etc., adhesion of metals and metallic oxides to inorganic substances can be improved. In addition, if necessary, a polymerizing method of a sensitizing dye can also be used.

The details in usage of the sensitizing dye, e.g., what structure is to be used, whether the dye is to be used alone or in combination of two or more, or what an amount is to be used, can be optionally set up according to the final design of the characteristics of the photosensitive material. For example, the compatibility with the photosensitive layer of a lithographic printing plate precursor can be increased by using two or more sensitizing dyes in combination. In the selection of the sensitizing dye, the molar extinction coefficient at the emission wavelength of the light source to be used is an important factor, in addition to the photosensitivity. If the dye having a large molar extinction coefficient is used, the addition amount of the dye can be relatively reduced, which is economical and is also advantageous from the point of view of the physical properties of the film of the photosensitive layer. Since the photosensitivity, the resolving power and the physical properties of exposed film of a photosensitive layer are largely influenced by the absorbance at a light source wavelength, the addition amount of the sensitizing dye is arbitrarily selected taking these factors into consideration. For example, sensitivity decreases in the region of absorbance of 0.1 or less. Further, resolving power decreases by the influence of halation. However, such low absorbance is sometimes rather effective for the purpose of increasing hardness of a thick film of 5 μm or more. In a high region of absorbance of 3 or more, almost all the light is absorbed on the surface of the photosensitive layer, hence curing is hindered at more inside of the film and the film strength and adhesion strength to a substrate become insufficient when the sensitizing dye is used, e.g., in a printing plate. When the sensitizing dye is used in a lithographic printing plate precursor having a comparatively thin film thickness, it is preferred to set up the addition amount of the sensitizing dye such that the absorbance of the photosensitive layer becomes from 0.1 to 1.5, preferably from 0.25 to 1. When the sensitizing dye is used in a lithographic printing plate precursor, the amount is generally from 0.05 to 30 weight parts, preferably from 0.1 to 20 weight parts, and more preferably from 0.2 to 10 weight parts, per 100 weight parts of the photosensitive layer component.

(A2) Titanocene Compound

Titanocene compounds for use in the photosensitive composition according to the present invention as a photoinitiator are not particularly limited and any compound can be used so long as it can generate active radicals when irradiated with light in the coexistence with the above-described sensitizing dyes. For example, well-known compounds disclosed in the following patents can arbitrarily be used: JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

More specifically, dicyclopentadienyl-Ti-dichloride, dicyclopentadienyl-Ti-bisphenyl, dicyclopentadienyl-Ti-bis-2,3,4,5,6-pentafluorophen-1-yl (hereinafter sometimes referred to as "T-1"), dicyclopentadienyl-Ti-bis-2,3,5,6-tetra-fluorophen-1-yl, dicyclopentadienyl-Ti-bis-2,4,6-trifluoro-phen-1-yi, dicyclopentadienyl-Ti-bis-2,6-difluorophen-1-yl, dicyclopentadienyl-Ti-bis-2,4-difluorophen-1-yl, dimethyl-cyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, and bis(cyclopentadienyl)-bis(2,6-difluoro-3-(1-H-pyrrol-1-yl)phenyl)titanium (hereinafter sometimes referred to as "T-2") can be exemplified.

Concerning the titanocene compounds contained in the photosensitive composition according to the present invention, similarly to the above-described sensitizing dyes, a variety of chemical modifications can be performed for the purpose of improving the characteristics of the photosensitive composition when used as the photosensitive layer of a lithographic printing plate precursor. For example, a method of bonding titanocene compounds with sensitizing dyes, addition polymerizable unsaturated compounds and other radical generating parts, a method of introducing hydrophilic parts, a method of introducing substituents for the compatibility improvement and crystal precipitation prevention, a method of introducing substituents for adhesion improvement, and a method of polymerization can be utilized.

With respect to the usage of the titanocene compound, it can also be used arbitrarily according to the design of the characteristics of the photosensitive material similarly to the addition polymerizable compound and the sensitizing dye described above. For example, the compatibility with the photosensitive layer of a lithographic printing plate precursor can be increased by using two or more titanocene compounds in combination. In general, the use amount of the titanocene compound is preferably large from the point of view of photosensitivity. The amount of from 0.5 to 80 weight parts and preferably from 1 to 50 weight parts per 100 weight parts of the photosensitive layer component is sufficient to obtain satisfactory photosensitivity. On the other hand, when the use under a yellow lamp and a white lamp is taken into consideration, which is a primary object of the present invention, the amount of the titanocene compound is preferably small from the point of fogging characteristic due to light in the vicinity of 500 nm. Even if the amount of the titanocene compound is reduced to 6 weight parts or less, further 1.9 weight parts or less, and still further 1.4 weight parts or less, sufficient photosensitivity can be obtained by the combined use with the sensitizing dye as described above.

B. Compound which Reacts with Radical or Acid to Change and Retain the Physical or Chemical Characteristics In addition to the above-described photoinitiator, the photosensitive composition according to the present invention contains a compound which reacts with a radical or an acid to change and retain the physical or chemical characteristics.

Such a compound is specifically an addition polymerizable compound having at least one ethylenically unsaturated double bond, which is selected from among the compounds having at least one, preferably two or more, ethylenically unsaturated bond at terminals. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof, unsaturated carboxylic acids (e.g., acrylic acid, methacrylic acid, itaconic acid, crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used.

In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used. The addition reaction products of unsaturated carboxylic esters and amides having electrophilic substituents such as an isocyanato group and an epoxy group with monofunctional orpolyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)-phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

As examples of other esters, e.g., aliphatic alcohol esters disclosed in JP-B-46-27926, JP-B-51-47334 and JP-A-57-196231, those having an aromatic skeleton disclosed in JP-A-59-5240, JP-A-59-5241 and JP-A-2-226149, and those containing an amino group disclosed in JP-A-1-165613 can also be preferably used in the present invention.

Further, the mixtures of the above-described ester monomers can also be used.

Further, specific examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other preferred amide monomers, those having cyclohexylene structure disclosed in JP-B-54-21726 can be exemplified.

Further, urethane-based addition polymerizable compounds which are obtained by the addition reaction of an isocyanate and a hydroxyl group are also preferably used in the present invention, and as the specific example, as is disclosed in JP-B-48-41708, a vinyl urethane compound having two or more polymerizable vinyl groups in one molecule can be exemplified, which is obtained by the addition of a vinyl monomer having a hydroxyl group represented by the following formula (V) to a polyisocyanate compound having two or more isocyanate groups in one molecule.

$$CH_2=C(R)COOCH_2CH(R')OH \qquad (V)$$

wherein R and R' each represents H or $CH_3$.

Further, urethane acrylates as disclosed in JP-A-51-37193, JP-B-2-32293, and JP-B-2-16765, and urethane compounds having an ethylene oxide skeleton as disclosed in JP-B-58-49860, JP-B-56-17654, JP-B-62-39417, and JP-B-62-39418 are also preferably used in the present invention.

Further, extremely high speed photopolymerizable compositions can be obtained by using addition polymerizable compounds having amino structure and sulfide structure in the molecule as disclosed in JP-A-63-277653, JP-A-63-260909 and JP-A-1-105238.

As other examples, polyfunctional acrylates and methacrylates, such as polyester acrylates, and epoxy acrylates obtained by reacting epoxy resins with (meth)acrylic acids as disclosed in JP-A-48-64183, JP-B-49-43191 and JP-B-52-30490 can be exemplified. Specific unsaturated compounds as disclosed in JP-B-46-43946, JP-B-1-40337, and JP-B-1-40336, and vinyl sulfonic acid compounds as disclosed in JP-A-2-25493 can also be exemplified. Further, according to cases, structures containing a perfluoroalkyl group as disclosed in JP-A-61-22048 are preferably used. Moreover, photo-curable monomers and oligomers introduced into Bulletin of Nihon Setchaku Kyokai, Vol. 20, No. 7, pp. 300–308 (1984) can be used as well.

The details in usage of the addition polymerizable compound, e.g., what structure is to be used, whether the compound is to be used alone or in combination, or what an amount is to be used, can be optionally set up according to the final design of the characteristics of the photosensitive material. For example, the conditions are selected from the following viewpoint. As for the photosensitive speed, the structure containing many unsaturated groups per molecule is preferred and in many cases bifunctional or more functional groups are preferred. When the addition polymerizable compound is used in the photosensitive layer of a lithographic printing plate precursor, for increasing the strength of an image part, i.e., a cured film, trifunctional or more functional groups are preferred, further, it is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but they are in some cases not preferred in the point of development speed and precipitation in a developing solution. The selection and usage of the addition polymerizable compound are important factors for the compatibility with other components (e.g., a binder polymer described later, the above-described photoinitiator, and a colorant described later, etc.) in the photosensitive layer and dispersibility, for example, sometimes compatibility can be improved by using a low purity compound or two or more compounds in combination. Further, it is also possible to select a compound having specific structure for the purpose of improving the adhesion property of a support and an overcoat layer. Concerning the compounding ratio of the addition polymerizable compound in the photosensitive layer, the more the amount, the higher is the sensitivity, but too large an amount sometimes results in disadvantageous phase separation, problems in manufacturing process due to the stickiness of the photosensitive layer (e.g., manufacturing failure resulting from the transfer and adhesion of the photosensitive material components), and precipitation from a developing solution. From these points of view, a preferred compounding ratio of the addition polymerizable compound is in many cases from 5 to 80 weight parts, preferably from 25 to 75 weight parts, based on the entire composition components. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation and surface adhesion. Further, the layer constitution and the coating method of undercoating and overcoating can be performed according to circumstances.

(C) Binder Polymer

When the photosensitive composition according to the present invention is applied to the photosensitive layer of a lithographic printing plate, which is a preferred embodiment of the present invention, it is preferred for the photosensitive composition to further contain a binder polymer in addition to the above-described photoinitiator and addition polymerizable compound. As the binder polymer, linear organic high molecular polymers are preferably used. Any compound can be used as such "linear organic high molecular polymers". Water- or weak alkali water-soluble or swelling linear organic high molecular polymers capable of water development or weak alkali water development are preferably selected. Linear organic highmolecular polymers are selected and used not only as a film-forming agent of the composition but according to the purpose as a water developer, a weak alkali water developer or an organic solvent developer. For example, when water-soluble linear organic high molecular polymers are used, water development becomes possible. As such linear organic high molecular polymers, addition polymers having a carboxylic acid group at the side chain, e.g., the polymers disclosed in JP-A-59-44615, JP-B-54-34327, JP-B-58-12577, JP-B-54-25957, JP-A-54-92723, JP-A-59-53836, and JP-A-59-71048, ie., a methacrylic acid copolymer, an acrylic acid copolymer, an itaconic acid copolymer, a crotonic acid copolymer, a maleic acid copolymer, and a partially esterified maleic acid copolymer, can be exemplified. Acidic cellulose derivatives having a carboxylic acid group at the side chain can also be used. Besides the above, the polymers obtained by adding a cyclic acid anhydride to an addition polymer having a hydroxyl group are also useful.

Of these polymers, in particular, copolymers of [benzyl (meth)acrylate-(meth)acrylic acid-other addition polymerizable vinyl monomer according to necessity] and [allyl (meth)acrylate-(meth)acrylic acid-other addition polymerizable vinyl monomer according to necessity] are excellent in the balance of film strength, sensitivity and developability hence advantageously used in the present invention.

Since the urethane-based binder polymers having an acid radical disclosed in JP-B-7-12004, JP-B-7-120041, JP-B-7-120042, JP-B-8-12424, JP-A-63-287944, JP-A-63-287947, JP-A-1-271741, and Japanese Patent Application No. 10-116232 are very excellent in strength, advantageous in the point of press life and low exposure aptitude.

The binder having an amido group disclosed in JP-A-11-171907 has both excellent developability and film strength.

In addition to the above, polyvinyl pyrrolidone and ethylene oxide are useful as the water-soluble linear organic high molecular polymer. For increasing cured film strength, alcohol-soluble nylon, polyethers of 2,2-bis(4-hydroxyphenyl)propane and epichlorohydrin are also useful. These linear organic high molecular polymers can be mixed in an arbitrary amount in the entire composition, but when the amount exceeds 90 wt %, image strength, etc., are adversely influenced. A preferred amount is from 3 to 85 wt %. The weight ratio of the compound having photopolymerizable ethylenically unsaturated double bond and the linear organic high molecular polymer is preferably within the range of from 1/9 to 7/3. In a preferred embodiment of the present invention, the binder polymer to be used is substantially water-insoluble and alkali-soluble, by which the organic solvents which are environmentally undesirable as developing solution can be done without, or the use amount can be limited to extremely small amount. In such a usage, the acid value (acid content per g of the polymer represented in chemical equivalent weight) and the molecular weight of the binder polymer are appropriately selected from the viewpoint of the image strength and developability. The acid value is preferably from 0.4 to 3.0 meq/g, more preferably from 0.6 to 2.0 meq/g, and the molecular weight is preferably from 3,000 to 500,000, more preferably from 10,000 to 300,000.

The photosensitive composition in another embodiment of the present invention comprises (A) a photopolymerization initiator, and (B) a compound which reacts with at least either a radical or an acid to change and retain at least either the physical or chemical characteristics as essential components and, if necessary, (C) a binder polymer. Each of these components is described specifically below.

(A) Photopolymerization Initiator

A photopolymerization initiator (a photoinitiator) which is an essential component of the photosensitive composition according to the present invention comprises (I) a sensitizing dye having a specific structure, and (II) a titanocene compound. It is thought that in the photoinitiator according to the present invention, a sensitizing dye primarily absorbs light to accelerate the generation of an initiating radical from the coexisting titanocene compound (such a process is hereinafter referred to as "dye sensitization"). One reason why the sensitizing dyes according to the present invention are superior is that their absorption wavelength is within the region of from 350 nm to 450 nm. Further, the greatest part of titanocene compounds described later per se have weak absorption in the wavelength region of from ultraviolet to the vicinity of 500 nm and also have photosensitivity in the same region, but since the sensitizing dyes having a specific structure according to the present invention extremely improve the photosensitivity of the titanocene compounds, it is possible, on one hand, to sufficiently increase the photosensitivity in short wavelength region by confining the use amount of the titanocene compounds to a relatively small amount, on the other hand, at the same time, it is possible to make the photosensitivity in 500 nm region by the titanocene compounds themselves low, therefore, safelight aptitude of the photosensitive compositions can be improved.

The present inventors have found that the above characteristics can be obtained when the sensitizing dye satisfies the following structural characteristics, thus the present invention has been attained. That is, markedly high sensitivity and excellent absorption characteristic can be obtained when the acidic nucleus of a dye has oxazolidinone 5-membered ring structure having one or more carbonyl group or thiocarbonyl group, and the basic nucleus has an aromatic ring or a heterocyclic ring. The definition of "acidic nucleus" and "basic nucleus" are described in T. H. James, *The Theory of The Photographic Process,* Fourth Edition, Chapter 8, Macmillan Publishing Co. The sensitizing dye represented by a merocyanine dye generally has 1) basic (electron-donative) and 2) acidic (electron-acceptive) heterocyclic rings at terminals, and 1) a basic (electron-donative) heterocyclic ring is called a basic nucleus, and 2) an acidic (electron-acceptive) heterocyclic ring is called an acidic nucleus. Examples of basic nuclei and acidic nuclei are described in detail in the above T. H. James, *The Theory of The Photographic Process,* Fourth Edition, Chapter 8, Macmillan Publishing Co.

The reason why the sensitizing dyes having a specific structure according to the present invention have particularly excellent dye sensitization property cannot be described in detail as the mechanism of dye sensitization is unknown but it can be presumed as follows. That is, the sensitizing dyes in the present invention exhibit high emission (fluorescence or phosphorescence) spectrum, which suggests, as one possibility, that the life in excitation state of the sensitizing dye of the present invention having the above-described partial structure is relatively long, as a result, the dye functions to make the reaction with an activator efficient.

(A1) Sensitizing Dye

The sensitizing dye for use in the present invention is represented by formula (III-1):

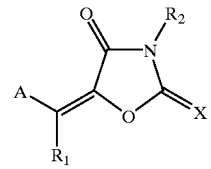

(III-1)

wherein A represents an aromatic or heterocyclic ring which may have a substituent; X represents an oxygen atom, a sulfur atom or $-N(R_3)-$; $R_1$, $R_2$ and $R_3$ each represents a hydrogen atom, or a monovalent non-metallic atomic group, and A and $R_1$, and $R_2$ and $R_3$ each may be bonded to each other to form an aliphatic or aromatic group.

The compound represented by formula (III-1) will be described in detail below.

$R_1$, $R_2$ and $R_3$ each represents a hydrogen atom, or a monovalent non-metallic atomic group, and each preferably represents a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxyl group, a substituted or unsubstituted alkylthio group, a hydroxyl group or a halogen atom.

Preferred examples of $R_1$, $R_2$ and $R_3$ are specifically described. Preferred examples of the alkyl groups include a straight chain, branched or cyclic alkyl groups having from 1 to 20 carbon atoms, and specific examples include a methyl group, an ethyl group, a propyl group, a butyl group, a pentyl group, a hexyl group, a heptyl group, an octyl group, a nonyl group, a decyl group, a undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group. Of these groups, a straight chain alkyl group having from 1 to 12 carbon atoms, a branched alkyl group having from 3 to 12 carbon atoms, and a cyclic alkyl group having from 5 to 10 carbon atoms are more preferred.

Examples of the substituents of the substituted alkyl groups are monovalent non-metallic atomic groups exclusive of a hydrogen atom, and preferred examples include a halogen atom (—F, —Br, —Cl, —I), a hydroxyl group, an alkoxyl group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and a conjugate base group thereof (hereinafter referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and a conjugate base group thereof (hereinafter referred to as a phosphonato group), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugate base group thereof (hereinafter referred to as an alkylphosphonato group), a monoarylphosphono group (—PO$_3$H(aryl)) and a conjugate base group thereof (hereinafter referred to as an arylphosphonato group), a phosphonooxy group (—OPO$_3$H$_2$) and a conjugate base group thereof (hereinafter referred to as a phosphonatooxy group), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and a conjugate base group thereof (hereinafter referred to as an alkylphosphonatooxy group), a monoarylphosphonooxy group (—OPO$_3$H(aryl)) and a conjugate base group thereof (hereinafter referred to as an arylphosphonatooxy group), a cyano group, a nitro group, an aryl group, a heteroaryl group, an alkenyl group, and an alkynyl group.

As the specific examples of the alkyl groups in these substituents, the above-described alkyl groups can be exemplified. As the specific examples of the aryl groups, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a cyanophenyl group, a sulfophenyl group, a sulfonatophenyl group, a phosphonophenyl group and a phosphonatophenyl group can be exemplified.

As the examples of the heteroaryl groups, a monocyclic or polycyclic aromatic ring containing at least one of nitrogen, oxygen and sulfur atoms are used, and particularly preferred examples of the heteroaryl groups include thiophene, thianthrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthyridine, quinazoline, cinnoline, pteridine, carbazole, carboline, phenanthrene, acridine, perimidine, phenanthroline, phthalazine, phenarsazine, phenoxazine, furazane, and phenoxazine. These groups may further be benzo-condensed or may have a substituent.

As the examples of the alkenyl groups, a vinyl group, a 1-propenyl group, a 1-butenyl group, a cinnamyl group, and a 2-chloro-1-ethenyl group can be exemplified, and as the examples of the alkynyl groups, an ethynyl group, a 1-propynyl group, a 1-butynyl group and a trimethylsilylethynyl group can be exemplified. As G$_1$ in the acyl group (G$_1$CO—), a hydrogen atom and the above-described alkyl groups and aryl groups can be exemplified. Of these substituents, more preferred examples include a halogen atom (—F, —Br, —Cl, —I), an alkoxyl group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group, and an alkenyl group.

On the other hand, as the alkylene group in the substituted alkyl group, the alkylene groups obtained by removing any one hydrogen atom on the above-described alkyl groups having from 1 to 20 carbon atoms to make divalent organic residues can be exemplified, preferably a straight chain alkylene group having from 1 to 12 carbon atoms, a branched alkylene group having from 3 to 12 carbon atoms, and a cyclic alkylene group having from 5 to 10 carbon atoms.

Specific examples of preferred substituted alkyl groups represented by R$_1$, R$_2$ and R$_3$ obtained by combining the above substituents and alkylene groups include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N- dipropylcarbamoylmethyl group, an N-(methoxyphenyl) carbamoylethyl group, an N-methyl-N-(sulfophenyl) carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethyphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group, and a 3-butynyl group.

Preferred examples of the aryl groups represented by $R_1$, $R_2$ and $R_3$ are a condensed ring formed by 1 to 3 benzene rings and a condensed ring formed by a benzene ring and a 5-membered unsaturated ring, and specific examples include a phenyl group, a naphthyl group, an anthryl group, a phenanthryl group, an indenyl group, an acenaphthenyl group, and a fluorenyl group. Of these, a phenyl group and a naphthyl group are more preferred.

Specific examples of the preferred substituted aryl groups represented by $R_1$, $R_2$ and $R_3$ are those having a monovalent non-metallic atomic groups exclusive of a hydrogen atom on the ring-forming carbon atoms of the above-described aryl groups as the substituent. As preferred examples of the substituents, the above-described alkyl groups, substituted alkyl groups, and those described above as the examples of the substituents in the substituted alkyl groups can be exemplified. Preferred specific examples of these substituted aryl groups include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoylphenyl group, an N-(methoxyphenyl) carbamoylphenyl group, an N-methyl-N-(sulfophenyl) carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allyl group, a 1-propenylmethyl group, a 2-butenyl group, a 2-methylallylphenyl group, a 2-methylpropenylphenyl group, a 2-propynylphenyl group, a 2-butynylphenyl group, and a 3-butynylphenyl group.

In the next place, A in formula (III-1) will be described. A represents an aromatic or heterocyclic ring which may have a substituent. As the specific examples of the aromatic or heterocyclic ring which may have a substituent, the same groups as described in $R_1$, $R_2$ and $R_3$ can be exemplified.

The sensitizing dyes represented by formula (III-1) can be obtained by the condensation reaction of the above-described acidic nucleus, an acidic nucleus having an active methylene group with a substituted or unsubstituted aromatic or heterocyclic ring, and these dyes can be synthesized by referring to JP-B-59-28329.

Preferred specific examples (D1) to (D28) of the compound represented by formula (III-1) are shown below, but the present invention is not limited thereto. Further, the isomer by the double bond connecting an acidic nucleus with a basic nucleus is not clear and the present invention is not limited to either isomer.

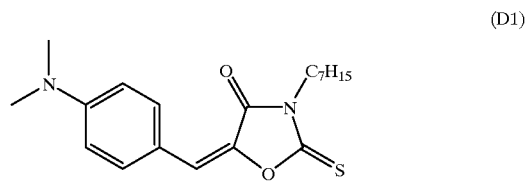

(D1)

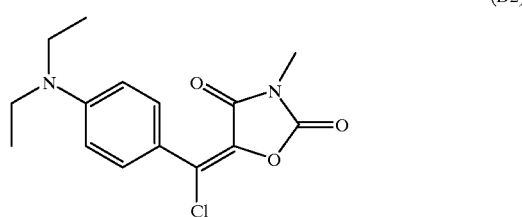

(D2)

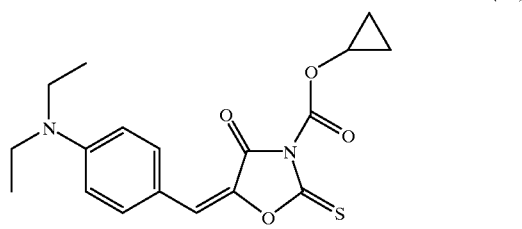

(D3)

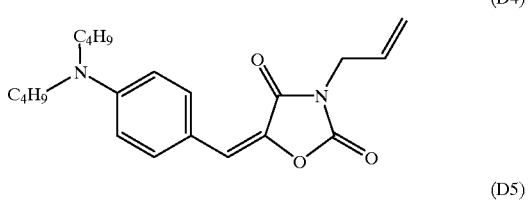

(D4)

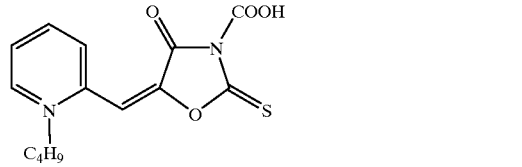

(D5)

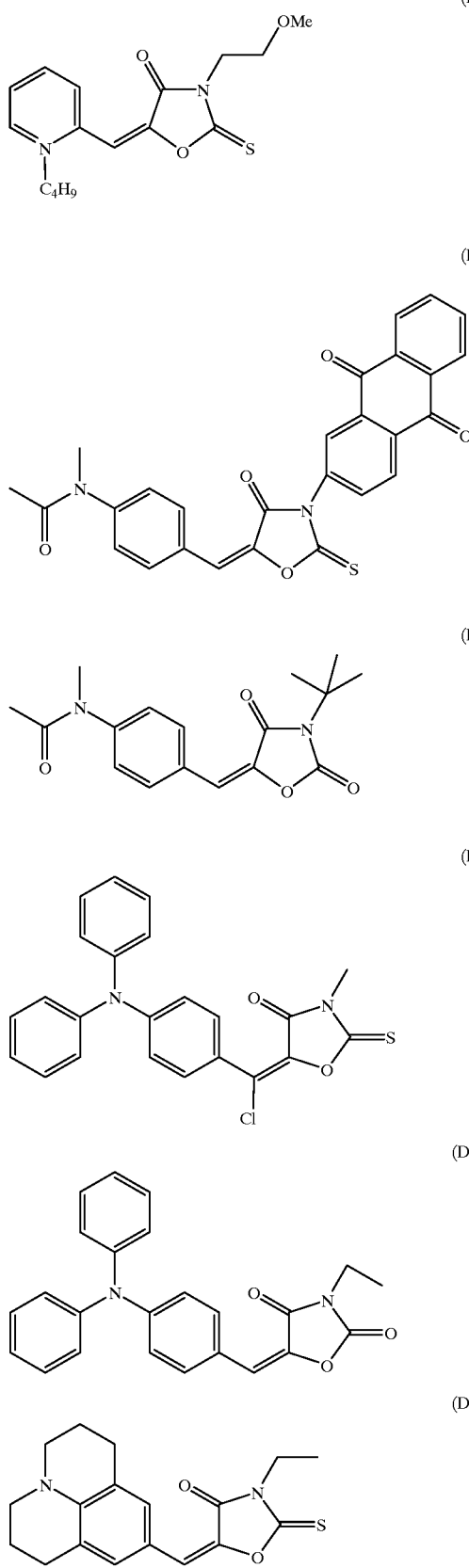
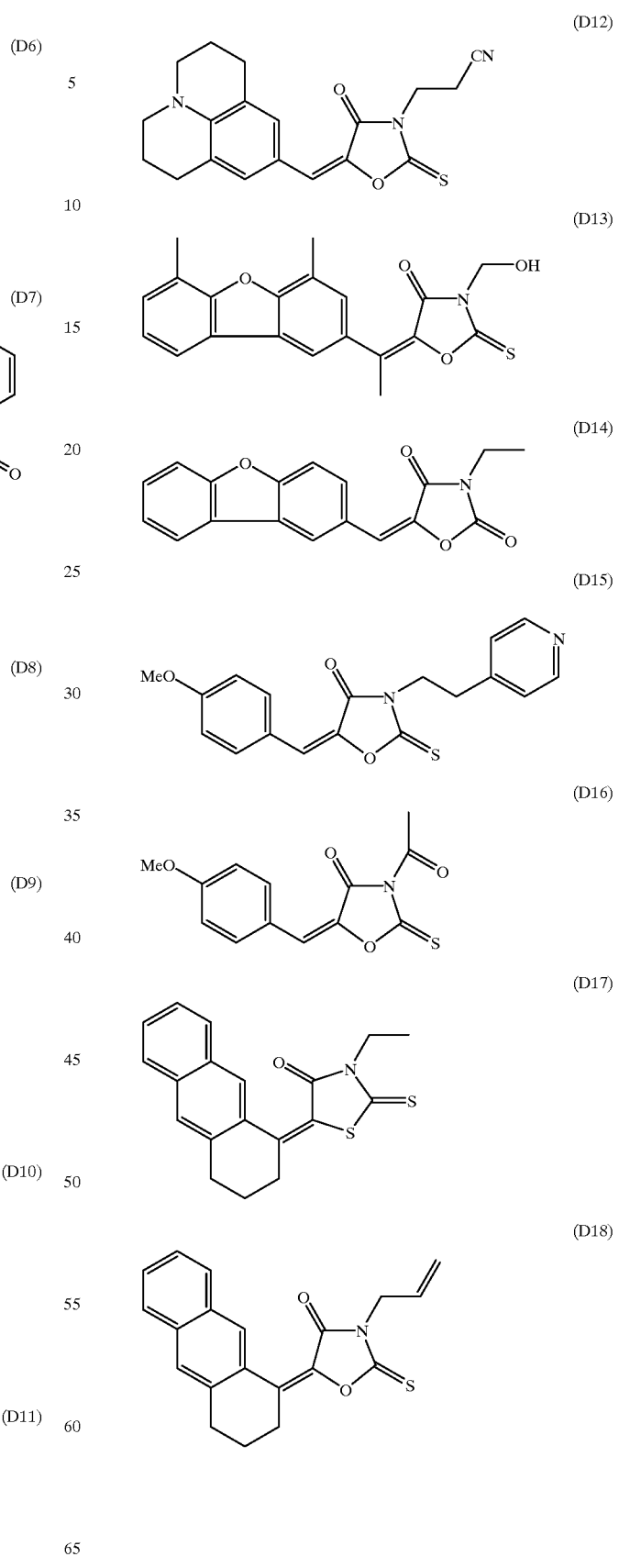

(D19) 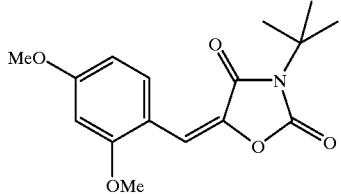

(D20) 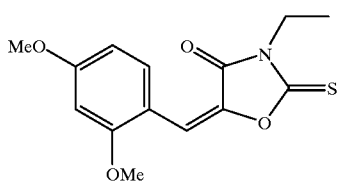

(D21) 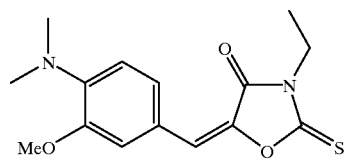

(D22) 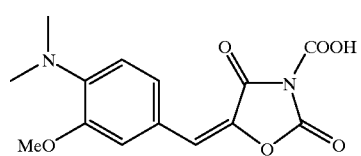

(D23) 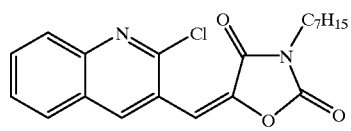

(D24) 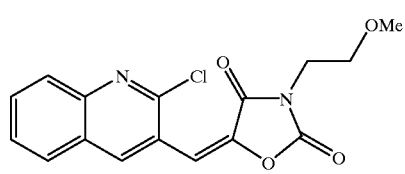

(D25) 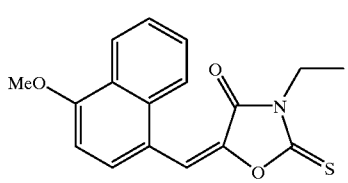

(D26) 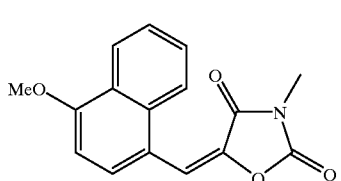

(D27) 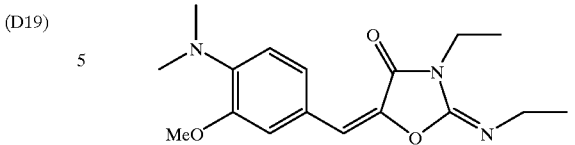

(D28) 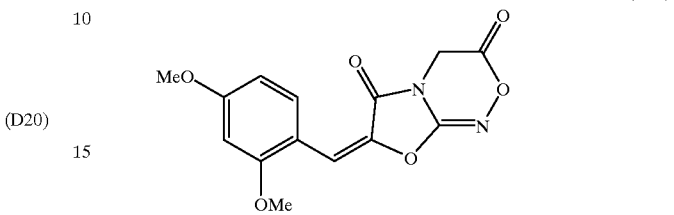

With respect to the sensitizing dyes, in the case where they are used as a lithographic printing plate precursor, various chemical modifications can be performed for the purpose of improving the characteristics of the photosensitive layer. For example, the strength of the film to be exposed can be increased and the unnecessary precipitation of dyes from the film after exposure can be prevented by bonding the sensitizing dye with addition polymerizable compound structure (e.g., an acryloyl group and a methacryloyl group) by means of covalent bonding, ionic bonding, and hydrogen bonding. Further, the photosensitivity of the photosensitive composition can be conspicuously increased with the state of the photoinitiator in low concentration by bonding the sensitizing dyes with the later-described titanocene compound and other radical generating parts (e.g., reduction decomposition parts such as alkyl halide, onium, peroxide, biimidazole, etc., and oxidation cleavage parts such as borate, amine, trimethylsilylmethyl, carboxymethyl, carbonyl, imine, etc.).

For the purpose of improving the processing aptitude of the lithographic printing plate precursor using the photosensitive composition according to the present invention to a (alkali) water system developing solution, which is a preferred way of use of the present invention, the introduction of a hydrophilic part (an acid radical or a polar group such as a carboxyl group and the ester thereof, a sulfonic acid group and the ester thereof, and an ethylene oxide group, etc.) is effective. An ester type hydrophilic group is, in particular, excellent in compatibility due to its comparatively hydrophobic structure in the photosensitive layer of a lithographic printing plate precursor; and generates an acid radical by hydrolysis in a developing solution, as a result hydrophilicity increases. In addition, substituents can be arbitrarily introduced for the purpose of improving compatibility and preventing crystal precipitation in the photosensitive layer. For example, in a certain kind of photosensitive system, unsaturated bonds of an aryl group and an allyl group are sometimes extremely effective for the improvement of compatibility and, further, crystal precipitation can be markedly inhibited by introducing steric hindrance between the π-plane of a dye and that of other dyes by a method of introducing branched alkyl structure, etc. Further, by the introduction of a phosphonic acid group, an epoxy group and a trialkoxysilyl group, etc., adhesion of metals and metallic oxides to inorganic substances can be improved. In addition, if necessary, a polymerizing method of a sensitizing dye can also be used.

The details in usage of the sensitizing dye, e.g., what structure is to be used, whether the dye is to be used alone or in combination of two or more, or what an amount is to be used, can be optionally set up according to the final design of the characteristics of the photosensitive material. For example, the compatibility with the photosensitive composition layer can be increased by using two or more sensitizing dyes in combination. In the selection of the sensitizing dye, the molar extinction coefficient at the emission wavelength of the light source to be used is an important factor, in addition to the photosensitivity. If the dye having a large molar extinction coefficient is used, the addition amount of the dye can be relatively reduced, which is economical and is also advantageous from the point of view of the physical properties of the film of the photosensitive layer when used in a lithographic printing plate precursor. Since the photosensitivity, the resolving power and the physical properties of exposed film of a photosensitive layer are largely influenced by the absorbance at a light source wavelength, the addition amount of the sensitizing dye is arbitrarily selected taking these factors into consideration. For example, sensitivity decreases in the region of absorbance of 0.1 or less. Further, resolving power decreases by the influence of halation.

However, such low absorbance is sometimes rather effective for the purpose of increasing hardness of a thick film of 5 μm or more. In a high region of absorbance of 3 or more, almost all the light is absorbed on the surface of the photosensitive layer, hence curing is hindered at more inside of the film and the film strength and adhesion strength to a substrate become insufficient when the sensitizing dye is used, e.g., in a printing plate. When the sensitizing dye is used in a lithographic printing plate having a comparatively thin film thickness, it is preferred to set up the addition amount of the sensitizing dye such that the absorbance of the photosensitive layer becomes from 0.1 to 1.5, preferably from 0.25 to 1. When the sensitizing dye is used in a lithographic printing plate, the amount is generally from 0.05 to 30 weight parts, preferably from 0.1 to 20 weight parts, and more preferably from 0.2 to 10 weight parts, per 100 weight parts of the photosensitive layer component.

(A2) Titanocene Compound

Titanocene compounds for use in the present invention as a photoinitiator are not particularly limited and any compound can be used so long as it can generate active radicals when irradiated with light in the coexistence with the above-described sensitizing dyes. For example, well-known compounds disclosed in the following patents can arbitrarilybe used: JP-A-59-152396, JP-A-61-151197, JP-A-63-41483, JP-A-63-41484, JP-A-2-249, JP-A-2-291, JP-A-3-27393, JP-A-3-12403 and JP-A-6-41170.

More specifically, dicyclopentadienyl-Ti-dichloride, dicyclopentadienyl-Ti-bisphenyl, dicyclopentadienyl-Ti-bis-2,3,4,5,6-pentafluorophen-1-yl (hereinafter sometimes referred to as "T-1"), dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethyl-cyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, and bis(cyclopentadienyl)-bis(2,6-difluoro-3-(1-H-pyrrol-1-yl)phenyl)titanium (hereinafter sometimes referred to as "T-2") can be exemplified.

Concerning the titanocene compounds according to the present invention, similarly to the above-described sensitizing dyes, a variety of chemical modifications can be performed for the purpose of improving the characteristics of the photosensitive layer when used as a lithographic printing plate precursor. For example, a method of bonding titanocene compounds with sensitizing dyes, addition polymerizable unsaturated compounds and other radical generating parts, a method of introducing hydrophilic parts, a method of introducing substituents for the compatibility improvement and crystal precipitation prevention, a method of introducing substituents for adhesion improvement, and a method of polymerization can be utilized.

With respect to the usage of the titanocene compound, it can also be used arbitrarily according to the design of the characteristics of the photosensitive material similarly to the addition polymerizable compound and the sensitizing dye described above. For example, the compatibility with the photosensitive composition layer can be increased by using two or more titanocene compounds in combination. In general, the use amount of the titanocene compound is preferably large from the point of view of photosensitivity. The amount of from 0.5 to 80 weight parts and preferably from 1 to 50 weight parts per 100 weight parts of the photosensitive layer component is sufficient to obtain satisfactory photosensitivity. On the other hand, when the use under a yellow lamp and a white lamp is taken into consideration, which is a primary object of the present invention, the amount of the titanocene compound is preferably small from the point of fogging characteristic due to light in the vicinity of 500 nm. Even if the amount of the titanocene compound is reduced to 6 weight parts or less, further 1.9 weight parts or less, and still further 1.4 weight parts or less, sufficient photosensitivity can be obtained by the combined use with the sensitizing dye according to the present invention.

(B) Compound which Reacts with at Least Either Radical or Acid to Change and Retain at Least Either the Physical or Chemical Characteristics The third essential component (iii) in the present invention is a compound whose physical or chemical characteristics are changed by the function of the active seed generated by the photo-reaction of the above-described photoinitiator and retained. Component (iii) is not particularly limited and any compound can be used so long as it has such property. For example, the above-exemplified compounds as a photoinitiator per se have such property in many cases. The characteristics of component (iii) which are changed by the functions of the radical, acid and/or base generated from a photoinitiator include physical properties of the molecule such as absorption spectrum (color), chemical structure and polarizability, and physical properties of the material such as solubility, strength, refractive index, flowability, and adhesive property.

For example, when a compound the absorption spectrum of which changes by pH, such as a pH indicator, is used as component (iii) to generate an acid or a base from a photoinitiator, it is possible to vary the tint of the exposed part alone and such a composition is useful as an image-forming material. Similarly, when a compound the absorption spectrum of which changes by an oxidation/reduction reaction or a nucleophilic addition reaction is used as component (iii), an image can be formed as a result of the oxidation or reduction caused by the radical generated from the photoinitiator. Such examples are described, e.g., in *J. Am. Chem. Soc.*, 108, 128 (1986), *J. Imaging Sci.*, 30, 215 (1986) and *Israel J. Chem.*, 25 264 (1986).

Further, by the combination of an addition polymerizable compound or a compound capable of polycondensation as component (iii) with a photoinitiator, it is possible to form a photo-curable resin or a negative photopolymer.

As component (iii), a radical polymerizable compound (e.g., a compound having an ethylenically unsaturated bond, etc.), a cationic polymerizable compound (e.g., an epoxy compound, a vinyl ether compound, a methylol compound, etc.), and an anionic polymerizable compound (e.g., an epoxy compound, etc.) are used, and examples of these compounds are described, e.g., in, compiled by the Photopolymer Meeting, *Photopolymer Handbook*, Kogyo Chosa-Kai (1989), and *Kobunshi*, 45, 786 (1996). Compositions comprising thiol compounds as component (iii) and photoradical generators in combination are also well known.

It is also useful to combine acid-decomposable compounds as component (iii) with light-acid generating agents. For example, materials in which a high molecular compound whose side chain and main chain are decomposed by an acid is used, and the solubility, hydrophilicity and hydrophobicity thereof are changed by light are widely put to practical use as photodecomposable photosensitive resins and positive photopolymers. Specific examples of these compounds are described, e.g., in *ACS. Symp. Ser.*, 242, 11 (1984), JP-A-60-3625, U.S. Pat. Nos. 5,102,771, 5,206,317, 5,212,047, JP-A-4-26850, JP-A-3-1921731, JP-A-60-10247 and JP-A-62-40450.

Component (iii), an addition polymerizable compound, which is an excellent component for one object of the present invention of providing a high speed lithographic printing plate precursor will be described in detail below.

(B-1) Addition Polymerizable Compound

An addition polymerizable compound having at least one ethylenically unsaturated double bond, which is component (iii) preferably used in the present invention, is selected from among the compounds having at least one, preferably two or more, ethylenically unsaturated bond at terminals. Such compounds are well known in the industry and they can be used in the present invention with no particular limitation. Such compounds have, for example, the chemical form of a monomer, a prepolymer, i.e., a dimer, a trimer, and an oligomer or a mixture and a copolymer of them. As examples of monomers and copolymers thereof, unsaturated carboxylic acids (e.g., acrylic acid, methacrylic acid, itaconic acid, crotonic acid, isocrotonic acid, maleic acid, etc.), and esters and amides thereof can be exemplified, and preferably esters of unsaturated carboxylic acids and aliphatic polyhydric alcohol compounds, and amides of unsaturated carboxylic acids and aliphatic polyhydric amine compounds are used. In addition, the addition reaction products of unsaturated carboxylic esters and amides having a nucleophilic substituent such as a hydroxyl group, an amino group and a mercapto group with monofunctional or polyfunctional isocyanates and epoxies, and the dehydration condensation reaction products of these compounds with monofunctional or polyfunctional carboxylic acids are also preferably used.

The addition reaction products of unsaturated carboxylic esters and amides having electrophilic substituents such as an isocyanato group and an epoxy group with monofunctional or polyfunctional alcohols, amines and thiols, and the substitution reaction products of unsaturated carboxylic esters and amides having releasable substituents such as a halogen group and a tosyloxy group with monofunctional or polyfunctional alcohols, amines and thiols are also preferably used. As another example, it is also possible to use compounds replaced with unsaturated phosphonic acid, styrene, vinyl ether, etc., in place of the above unsaturated carboxylic acids.

Specific examples of ester monomers of aliphatic polyhydric alcohol compounds and unsaturated carboxylic acids include, as acrylates, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl) isocyanurate, polyester acrylate oligomer, etc.

As methacrylates, examples include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis[p-(methacryloxyethoxy)-phenyl]dimethylmethane, etc.

As itaconates, examples include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.

As crotonates, examples include ethylene glycol dicrotonate, tetramethylene glycol dicrotonate, pentaerythritol dicrotonate, sorbitol tetradicrotonate, etc.

As isocrotonates, examples include ethylene glycol diisocrotonate, pentaerythritol diisocrotonate, sorbitol tetraisocrotonate, etc.

As maleates, examples include ethylene glycol dimaleate, triethylene glycol dimaleate, pentaerythritol dimaleate, sorbitol tetramaleate, etc.

As examples of other esters, e.g., aliphatic alcohol esters disclosed in JP-B-46-27926, JP-B-51-47334 and JP-A-57-196231, those having an aromatic skeleton disclosed in JP-A-59-5240, JP-A-59-5241 and JP-A-2-226149, and those containing an amino group disclosed in JP-A-1-165613 can also be preferably used in the present invention.

Further, the mixtures of the above-described ester monomers can also be used.

Further, specific examples of amide monomers of aliphatic polyhydric amine compounds and unsaturated carboxylic acids include methylenebis-acrylamide, methylenebis-methacrylamide, 1,6-hexamethylenebis-acrylamide, 1,6-hexamethylenebis-methacrylamide, diethylenetriaminetris-acrylamide, xylylenebis-acrylamide, xylylenebis-methacrylamide, etc.

As other preferred amide monomers, those having cyclohexylene structure disclosed in JP-B-54-21726 can be exemplified.

Further, urethane-based addition polymerizable compounds which are obtained by the addition reaction of an isocyanate and a hydroxyl group are also preferably used in the present invention, and as the specific example, as is disclosed in JP-B-48-41708, a vinyl urethane compound having two or more polymerizable vinyl groups in one molecule can be exemplified, which is obtained by the addition of a vinyl monomer having a hydroxyl group represented by the following formula (2) to a polyisocyanate compound having two or more isocyanate groups in one molecule.

$$CH_2=C(R)COOCH_2CH(R')OH \qquad (2)$$

wherein R and R' each represents H or $CH_3$.

Further, urethane acrylates as disclosed in JP-A-51-37193, JP-B-2-32293, and JP-B-2-16765, and urethane compounds having an ethylene oxide skeleton as disclosed in JP-B-58-49860, JP-B-56-17654, JP-B-62-39417, and JP-B-62-39418 are also preferably used in the present invention.

Further, extremely high speed photosensitive compositions can be obtained by using addition polymerizable compounds having amino structure and sulfide structure in the molecule as disclosed in JP-A-63-277653, JP-A-63-260909 and JP-A-1-105238.

As other examples, polyfunctional acrylates and methacrylates, such as polyester acrylates, and epoxy acrylates obtained by reacting epoxy resins with (meth)acrylic acids as disclosed in JP-A-48-64183, JP-B-49-43191 and JP-B-52-30490 can be exemplified. Specific unsaturated compounds as disclosed in JP-B-46-43946, JP-B-1-40337, and JP-B-1-40336, and vinyl sulfonic acid compounds as disclosed in JP-A-2-25493 can also be exemplified. Further, according to cases, structures containing a perfluoroalkyl group as disclosed in JP-A-61-22048 are preferably used. Moreover, photo-curable monomers and oligomers introduced into Bulletin of Nihon Setchaku Kyokai, Vol. 20, No. 7, pp. 300–308 (1984) can be used as well.

The details in usage of the addition polymerizable compound, e.g., what structure is to be used, whether the compound is to be used alone or in combination, or what an amount is to be used, can be optionally set up according to the final design of the characteristics of the photosensitive material. For example, the conditions are selected from the following viewpoint. As for the photosensitive speed, the structure containing many unsaturated groups per molecule is preferred and in many cases bifunctional or more functional groups are preferred. For increasing the strength of an image part, i.e., a cured film, trifunctional or more functional groups are preferred, further, it is effective to use different functional numbers and different polymerizable groups (e.g., acrylate, methacrylate, styrene compounds, vinyl ether compounds) in combination to control both photosensitivity and strength. Compounds having a large molecular weight or compounds having high hydrophobicity are excellent in photosensitive speed and film strength, but they are in some cases not preferred in the point of development speed and precipitation in a developing solution.

The selection and usage of the addition polymerizable compound are important factors for the compatibility with other components (e.g., a binder polymer, an initiator, a colorant, etc.) in the photosensitive composition and dispersibility, for example, sometimes compatibility can be improved by using a low purity compound or two or more compounds in combination. Further, it is also possible to select a compound having specific structure for the purpose of improving the adhesion property of a support (described later) and an overcoat layer when the addition polymerizable compounds are used in a lithographic printing plate precursor. Concerning the compounding ratio of the addition polymerizable compound in a photosensitive composition, the more the amount, the higher is the sensitivity, but too large an amount sometimes results in disadvantageous phase separation, problems in manufacturing process due to the stickiness of the photosensitive composition (e.g., manufacturing failure resulting from the transfer and adhesion of the photosensitive material components), and precipitation from a developing solution when the addition polymerizable compound is used as a lithographic printing plate precursor. From these points of view, a preferred compounding ratio of the addition polymerizable compound is in many cases from 5 to 80 weight parts, preferably from 25 to 75 weight parts, based on the entire composition components. The addition polymerizable compound may be used alone or in combination of two or more. In addition, appropriate structure, compounding ratio and addition amount of the addition polymerizable compound can be arbitrarily selected taking into consideration the degree of polymerization hindrance due to oxygen, resolving power, fogging characteristic, refractive index variation and surface adhesion. Further, the layer constitution and the coating method of undercoating and overcoating can be performed according to circumstances.

(C) Binder Polymer

When the photosensitive composition according to the present invention is applied to a lithographic printing plate precursor, which is a preferred embodiment of the present invention, it is preferred for the photosensitive layer to further contain a binder polymer. As the binder, linear organic high molecularpolymers are preferably used. Any compound can be used as such "linear organic high molecular polymers". Water- or weak alkali water-soluble or swelling linear organic high molecular polymers capable of water development or weak alkali water development are preferably selected. Linear organic high molecular polymers are selected and used not only as a film-forming agent of the composition but according to the purpose as a water developer, a weak alkali water developer or an organic solvent developer. For example, when water-soluble linear organic high molecular polymers are used, water development becomes possible. As such linear organic high molecular polymers, addition polymers having a carboxylic acid group at the side chain, e.g., the polymers disclosed in JP-A-59-44615, JP-B-54-34327, JP-B-58-12577, JP-B-54-25957, JP-A-54-92723, JP-A-59-53836, and JP-A-59-71048, i.e., a methacrylic acid copolymer, an acrylic acid copolymer, an itaconic acid copolymer, a crotonic acid copolymer; a maleic acid copolymer, and a partially esterified maleic acid copolymer, can be exemplified. Acidic cellulose derivatives having a carboxylic acid group at the side chain can also be used. Besides the above, the polymers obtained by adding a cyclic acid anhydride to an addition polymer having a hydroxyl group are also useful.

Of these polymers, in particular, copolymers of [benzyl (meth)acrylate-(meth)acrylic acid-other addition polymerizable vinyl monomer according to necessity] and [allyl (meth)acrylate-(meth)acrylic acid-other addition polymerizable vinyl monomer according to necessity] are excellent in the balance of film strength, sensitivity and developability hence advantageously used in the present invention.

Since the urethane-based binder polymers having an acid radical disclosed in JP-B-7-12004, JP-B-7-120041, JP-B-7-120042, JP-B-8-12424, JP-A-63-287944, JP-A-63-287947, JP-A-1-271741, and Japanese Patent Application No. 10-116232 are very excellent in strength, advantageous in the point of press life and low exposure aptitude.

The binder having an amido group disclosed in JP-A-11-171907 has both excellent developability and film strength.

In addition to the above, polyvinyl pyrrolidone and polyethylene oxide are useful as the water-soluble linear organic high molecular polymer. For increasing cured film strength, alcohol-soluble nylon, polyethers of 2,2-bis(4-hydroxyphenyl)propane and epichlorohydrin are also useful. These linear organic high molecular polymers can be mixed in an arbitrary amount in the entire composition, but when the amount exceeds 90 wt %, image strength, etc., are adversely influenced. A preferred amount is from 3 to 85 wt %. The weight ratio of the compound having photopolymerizable ethylenically unsaturated double bond and the linear organic high molecular polymer is preferably within the range of from 1/9 to 7/3.

In a preferred embodiment of the present invention, the binder polymer to be used is substantially water-insoluble and alkali-soluble, by which the organic solvents which are environmentally undesirable as developing solution can be done without, or the use amount can be limited to extremely small amount. In such a usage, the acid value (acid content per g of the polymer represented in chemical equivalent weight) and the molecular weight of the binder polymer are appropriately selected from the viewpoint of the image strength and developability. The acid value is preferably from 0.4 to 3.0 meq/g, more preferably from 0.6 to 2.0 meq/g, and the molecular weight is preferably from 3,000 to 500,000, more preferably from 10,000 to 300,000.

Components other than the above described main components are described below.

D. Other Components

When the photosensitive composition according to the present invention is used as the photosensitive layer of a lithographic printing plate precursor, other components suitable for the usages and manufacturing methods can be arbitrarily used. Preferred additives are described below.

(D1) Co-sensitizer

Sensitivity of the photosensitive layer can further be increased by using certain kinds of additives (hereinafter referred to as "co-sensitizers"). The mechanisms of their functions are not clear but it is presumed to be based on the following chemical processes. That is, various intermediate active seeds (a radical, a peroxide, an oxidizing agent, a reducing agent, etc.) which are generated during the course of the photo-reaction initiated by the light absorption of the above-described photoinitiator and the succeeding addition polymerization reaction react with a co-sensitizer, thus a new active radical is formed. Co-sensitizers can be classified into the categories (a) a compound capable of generating an active radical by reduction, (b) a compound capable of generating an active radical by oxidation, and (c) a compound which reacts with a radical of lower activity and converts into a higher active radical, or functions as a chain transfer agent. However, in many cases, there is no common view as to what compound belongs to what category.

(a) Compound which Generates Active Radical by Reduction

A Compound having a Carbon-halogen Bond

It is thought that a carbon-halogen bond is cleaved reducibly and generates an active radical. Specifically, for example, trihalomethyl-s-triazines and trihalomethyl oxadiazoles are preferably used.

A Compound Having a Nitrogen-nitrogen Bond

It is thought that a nitrogen-nitrogen bond is cleaved reducibly and generates an active radical. Specifically, for example, hexaallylbiimidazoles are preferably used.

A Compound Having an Oxygen-oxygen Bond

It is thought that an oxygen-oxygen bond is cleaved reducibly and generates an active radical. Specifically, for example, organic peroxides are preferably used.

An Onium Compound

It is thought that a carbon-hetero bond and oxygen-nitrogen bond are cleaved reducibly and generates an active radical. Specifically, for example, diaryliodoniums, triarylsulfoniums, N-alkoxypyridinium (adinium) salts are preferably used.

Ferrocene, Iron Arene Complexes

An active radical is generated reducibly.

(b) Compound which Generates Active Radical by Oxidation

An Alkylate Complex

It is thought that a carbon-hetero bond is cleaved and generates an active radical by oxidation. Specifically, for example, triarylalkylborates are preferably used.

An Alkylamine Compound

It is thought that the C—X bond on the carbon adjacent to the nitrogen atom is cleaved and generates an active radical by oxidation. A hydrogen atom, a carboxyl group, a trimethylsilyl group, a benzyl group, etc., are preferred as X. Specifically, for example, ethanolamines, N-phenylglycines, N-trimethylsilylmethylanilines can be exemplified.

A Sulfur-containing Compound, a Tin-containing Compound

The above compounds in which the nitrogen atom of the amines is substituted with a sulfur atom or a tin atom can generate an active radical by similar function. Further, it is known that a compound having an S—S bond is also sensitized by S—S cleavage.

α-Substituted Methylcarbonyl Compound

An active radical is generated by the cleavage of bond between carbonyl-α carbon by oxidation. The compound whose carbonyl is substituted with oxime ether also shows the same function. Specifically, 2-alkyl-1-[4-(alkylthio)phenyl]-2-morpholinopuronone-1 compounds, and oxime ethers obtained by reacting these compounds with hydroxylamines and then etherifying the N—OH can be exemplified.

Sulfinates

An active radical is generated reducibly. Specifically, sodium arylsulfinate, etc., can be exemplified.

(c) Compound which Reacts with Radical and Converts into Higher Active Radical or Functions as Chain Transfer Agent For example, compounds having SH, PH, SiH, GeH are used. They can generate a radical by donating hydrogen to low active radical seed, or can generate a radical by removing a proton after being oxidized. Specifically, for example, 2-mercaptobenzimidazoles can be exemplified.

Many more specific examples of the co-sensitizers are disclosed, e.g., in JP-A-9-236913 as the additive aiming at improving sensitivity. A part of these are shown below but the present invention is not limited thereto.

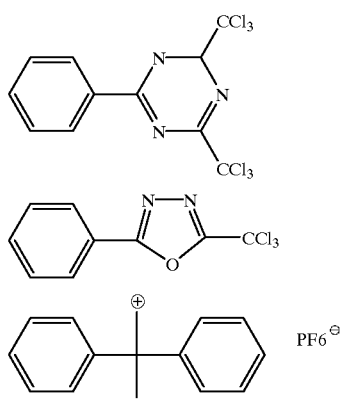

-continued

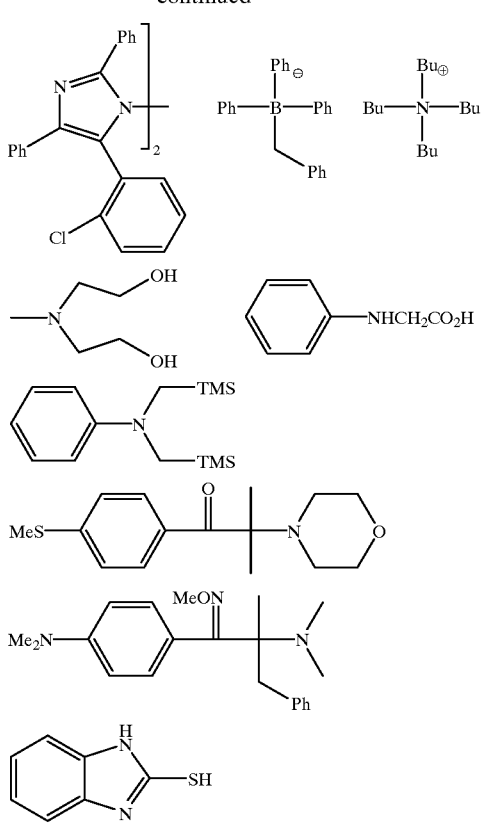

With respect to these co-sensitizers, similarly to the above-described sensitizing dyes, a variety of chemical modifications can be performed for the purpose of improving the characteristics of the photosensitive layer of a lithographic printing plate precursor. For example, methods of bonding with sensitizing dyes, titanocene compounds, addition polymerizable unsaturated compounds and other radical generating parts, introduction of hydrophilic parts, improvement of compatibility, introduction of substituents for crystal precipitation prevention, introduction of substituents for adhesion improvement, and polymerization can be utilized.

These co-sensitizers can be used alone or two or more in combination. The use amount of the co-sensitizer is appropriately from 0.05 to 100 weight parts, preferably from 1 to 80 weight parts, and more preferably from 3 to 50 weight parts, per 100 weight parts of the compound having ethylenically unsaturated double bond.

(D2) Polymerization Inhibitor

Besides the above main components, it is preferred for the photosensitive composition according to the present invention to contain a small amount of thermal polymerization inhibitor for inhibiting unnecessary thermal polymerization of a compound having ethylenically unsaturated bond during production and storage. As the appropriate thermal polymerization inhibitors, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxyamine primary cerium salt can be exemplified. The addition amount of the thermal polymerization inhibitor is preferably from about 0.01 wt % to about 5 wt % based on the weight of the entire composition. Further, when the photosensitive composition of the present invention is coated as the photosensitive layer of a lithographic printing plate precursor, if necessary, higher fatty acid derivatives, such as behenic acid and behenic acid amide, may be added to localize on the surface of the photosensitive layer during drying process after coating to inhibit polymerization hindrance due to oxygen. The addition amount of the higher fatty acid derivative is preferably from about 0.5 wt % to about 10 wt % based on the entire composition.

(D3) Colorant, Etc.

When the photosensitive composition of the present invention is used as the photosensitive layer of a lithographic printing plate precursor, etc., a dye or a pigment may be added thereto for the purpose of coloring the photosensitive layer. The so-called plate-inspection property, e.g., visibility after plate-making as the lithographic printing plate precursor, and the aptitude to an image densitometer can be improved due to the addition of colorants. Since many of dyes are liable to reduce the sensitivity of a photopolymerizable photosensitive layer, the use of pigments is particularly preferred as the colorant. Specific examples of the colorants include, e.g., pigments such as phthalocyanine pigments, azo pigments, carbon black and titanium oxide, and dyes such as Ethyl Violet, Crystal Violet, azo dyes, anthraquinone dyes and cyanine dyes. The addition amount of the dye and the pigment is preferably from about 0.5 wt % to about 5 wt % based on the entire composition.

(D4) Other Additives

When the photosensitive composition of the present invention is used as the photosensitive layer of a lithographic printing plate precursor, etc., the photosensitive composition may further contain well-known additives such as inorganic fillers for improving the physical properties of the cured film, other plasticizers, sensitizing agents capable of improving the ink adhering property of the photosensitive layer surface.

As the plasticizers, dioctyl phthalate, didodecyl phthalate, triethylene glycol dicaprylate, dimethyl glycol phthalate, tricresyl phosphate, dioctyl adipate, dibutyl sebacate, triacetyl glycerin are exemplified, and when a binder polymer is used, the addition amount of the plasticizer is 10 wt % or less based on the total weight of the compound having ethylenically unsaturated bond and the binder polymer.

A UV initiator and a thermal crosslinking agent can also be added to the photosensitive composition for reinforcing the effect of heating/exposure after development aiming at improving the film strength (elongation of press life) of the photosensitive layer of a lithographic printing plate precursor.

In addition, for improving the adhesion of the photosensitive layer with the support and for increasing the removing property of the unexposed photosensitive layer by development, additives may be added or an interlayer may be provided. For example, it is possible to increase adhesion and improve press life by the addition or undercoating of the compounds having relatively strong interaction with the later-described support, e.g., a compound having diazonium structure and a phosphon compound. On the other hand, by the addition or undercoating of hydrophilic polymers such as polyacrylic acid and polysulfonic acid, it is possible to improve the developability of a non-image part and anti-smearing property (i.e., anti-staining property).

When the photopolymerizable composition or a photosensitive composition according to the present invention is coated on a support as a photosensitive layer, the composition is dissolved in various organic solvents before use.

Examples of the solvents used here include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, etc. These solvents may be used alone or may be used as a mixed solvent. The concentration of the solid content in the coating solution is generally from 2 to 50 wt %.

The coating amount of the photosensitive layer on a support primarily influences the sensitivity of the photosensitive layer, developability, the strength of the exposed film, and press life, therefore, it is preferred to arbitrarily select the coating amount according to the usage. Too small a coating amount results in insufficient press life. While when it is too large, sensitivity decreases, exposure takes long time, and longer time is required for development processing, which is not advantageous. When the photosensitive composition according to the present invention is used as a lithographic printing plate precursor for scanning exposure, which is a primary object of the present invention, the coating amount is preferably from about 0.1 $g/m^2$ to about 10 $g/m^2$, more preferably from 0.5 to 5 $g/m^2$ in dry weight.

Support

For providing a lithographic printing plate precursor, which is one use purpose of the photosensitive composition of the present invention, it is preferred to provide a photosensitive layer comprising the photopolymerizable composition or photosensitive composition on a hydrophilic surface support. Conventionally well known hydrophilic supports used for a lithographic printing plate precursor can be used without any limitation. Supports for use in the present invention are preferably plate-like supports having dimensional stability. For example, paper, paper laminated with plastics (e.g., polyethylene, polypropylene, polystyrene, etc.), a metal plate (e.g., aluminum, zinc, copper, etc.), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.), and paper or a plastic film laminated or deposited with the above metals can be exemplified. The surfaces of these supports may be chemically or physically treated by well-known methods for providing hydrophilicity or improvement of strength, if necessary.

Paper, polyester films and aluminum plates are preferably used in the present invention, above all, aluminum plates are particularly preferably used because they are dimensionally stable and comparatively inexpensive, further, they can provide a hydrophilic and strong surface by surface treatment according to necessity. A composite sheet comprising a polyethylene terephthalate film having provided thereon an aluminum sheet as disclosed in JP-B-48-18327 is also preferred.

Preferred aluminum plates are pure aluminum plates or alloy plates containing aluminum as a main component and a trace amount of foreign elements, and plastic films laminated or deposited with aluminum may also be used. Examples of foreign elements contained in the aluminum alloy include silicon, iron, manganese, copper, magnesium, chromium, zinc, bismuth, nickel, titanium, etc. The content of foreign elements in the aluminum alloy is at most 10 wt % or less. In the present invention, particularly preferred aluminum is pure aluminum but 100% pure aluminum is difficult to produce from the refining technique, accordingly, an extremely small amount of foreign elements may be contained. The composition of an aluminum plate used in the present invention is not specified as described above, and aluminum plates of conventionally well-known and commonly used materials can be used arbitrarily. Aluminum plates for use in the present invention have a thickness of from about 0.1 to about 0.6 mm, preferably from 0.15 to 0.4 mm, and particularly preferably from 0.2 to 0.3 mm.

In the case of a metal support, in particular, a support having an aluminum surface, it is preferred to perform surface treatment such as roughening treatment (graining), immersion treatment in an aqueous solution of sodium silicate, potassium zirconate fluoride, phosphate, etc., or anodic oxidation treatment.

Surface roughening treatment of an aluminum plate is performed by various methods, e.g., a mechanical roughening method, an electrochemical method of dissolution roughening, and a chemical method of selectively dissolving. Well-known mechanical methods such as a ball abrading method, a brushing method, a blasting method, and a buffing method can be used in the present invention. As the electrochemical method, a method of applying an alternating or direct electric current to an aluminum plate in an electrolytic solution of hydrochloric acid, nitric acid, etc., can be used. Further, as disclosed in JP-A-54-63902, a method of combining mechanical roughening with electrochemical roughening can also be used. Prior to the surface roughening of an aluminum plate, degreasing is performed to remove the rolling oil on the surface of the plate by means of, e.g., surfactants, organic solvents or alkaline aqueous solution, if required.

Further, an aluminum plate subjected to immersion treatment in an aqueous sodium silicate solution after roughening treatment is preferably used. As disclosed in JP-B-47-5125, an aluminum plate immersion-treated in an aqueous solution of alkali metal silicate is preferably used. Anodic oxidation treatment is carried out by turning on electricity with the aluminum plate as the anode in an electrolytic solution comprising alone or combination of two or more of an aqueous solution or nonaqueous solution of an inorganic acid such as phosphoric acid, chromic acid, sulfuric acid, boric acid, etc., or an organic acid such as oxalic acid, sulfamic acid, etc., or salts of these.

Silicate electrodeposition disclosed in U.S. Pat. No. 3,658,662 is also effective.

Supports subjected to electrolytic graining disclosed in JP-B-46-27481, JP-A-52-58602, and JP-A-52-30503, and surface treatment of combining the above anodic oxidation treatment and sodium silicate treatment are also useful.

Further, the technique disclosed in JP-A-56-28893 comprising performing mechanical surface roughening, chemical etching, electrolytic graining, anodic oxidation treatment and sodium silicate treatment in order is also preferably used in the present invention.

The support undercoated with water-soluble resins, e.g., polymers and copolymers having a polyvinyl phosphonic acid group, a sulfonic acid group at the side chain, polyacrylic acid, water-soluble metal salts (e.g., zinc borate), a yellow dye, amine salt, etc., after being subjected to the above treatments is also preferably used in the present invention.

The support subjected to sol-gel treatment by which a functional group capable of causing addition polymerization by radicals is imparted by covalent bonding as disclosed in JP-A-7-159983 is also preferably used in the present invention.

As other preferred examples, an arbitrary support having provided thereon a waterproof hydrophilic layer as a surface layer is exemplified. As such surface layers, e.g., a layer comprising an inorganic pigment and a binder disclosed in U.S. Pat. No. 3,055,295 and JP-A-56-13168, a hydrophilic swelling layer disclosed in JP-A-9-80744, and a sol-gel film comprising titanium oxide, polyvinyl alcohol, and silicic acids disclosed in JP-W-8-507727 can be exemplified.

Such hydrophilizing treatment is performed not only for hydrophilizing the surface of a support but also for preventing harmful reaction of the photosensitive layer provided on the support and for improving adhesion property of the photosensitive layer.

Protective Layer

In a lithographic printing plate precursor for scanning exposure, which is a preferable usage of the photopolymerizable composition or a photosensitive composition of the present invention, exposure is in general performed in the air, hence it is preferred to provide a protective layer on the layer comprising the photopolymerizable composition or a photosensitive composition. The protective layer prevents oxygen in the air and low molecular compounds such as basic substances which hinder image-forming reaction caused by exposure in the photosensitive layer from mixing in the photosensitive layer and makes the exposure in the air possible. Accordingly, as the characteristics which are required of the protective layer, the protective layer preferably has low permeability of a low molecular compound such as oxygen, does not substantially hinder the transmission of light for exposure, has excellent adhesion with the photosensitive layer, and can be easily removed after exposure during development process. Such contrivances have so far been tried and disclosed in detail in U.S. Pat. No. 3,458,311 and JP-A-55-49729.

As the materials for the protective layer, water-soluble high molecular compounds comparatively excellent in crystallizability are preferably used, specifically, water-soluble polymers, e g., polyvinyl alcohol, polyvinyl pyrrolidone, acidic celluloses, gelatin, gum arabic, polyacrylic acid are known. Of these compounds, when polyvinyl alcohol is used as a main component, the best results can be obtained in fundamental characteristics such as exclusion of oxygen and removal of the protective layer by development. The polyvinyl alcohols for use in the protective layer may be partially substituted with ester, ether and acetal so long as they contain unsubstituted vinyl alcohol units for obtaining necessary oxygen-cutting off property and water solubility. Also, the part of the polyvinyl alcohols may have other copolymer components. As specific examples of the polyvinyl alcohols, those having hydrolyzing rate of 71 to 100% and molecular weight of from 300 to 2,400 can be exemplified.

Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (manufactured by Kuraray Co., Ltd.) can be exemplified.

The components of the protective layer (the selection of PVA and the use of additives) and the coating amount are selected taking into consideration fogging characteristic, adhesion and scratch resistance besides the oxygen-excluding property and the removal by development. In general, the higher the hydrolyzing rate of the PVA used (the higher the content of the unsubstituted vinyl alcohol units in the protective layer) and the thicker the layer thickness, the higher becomes the oxygen excluding-property, thus advantageous in the sensitivity. However, too high an oxygen excluding-property results in generation of unnecessary polymerization reaction during manufacture and live storage, or generation of unnecessary fog and fattening of image lines at image exposure. The adhesion with the image part and scratch resistance are extremely important in treating a printing plate, i.e., when a hydrophilic layer comprising water-soluble polymers is laminated on a lipophilic layer, peeling off of the film due to insufficient adhesion is liable to occur, and the peeled part causes such a defect as film hardening failure by polymerization hindrance due to oxygen.

Various countermeasures have been proposed for improving the adhesion between the photosensitive layer and the protective layer. For example, it is disclosed in U.S. Pat. Nos. 292,501 and 44,563 that sufficient adhesion property can be obtained by mixing from 20 to 60 wt % of an acryl-based emulsion or a water-insoluble vinyl pyrrolidone/vinyl acetate copolymer to a hydrophilic polymer mainly comprising polyvinyl alcohol and laminating the resulting product on a polymer layer. Any of these well-known techniques can be applied to the protective layer of the present invention. The coating methods of these protective layers are disclosed in detail, e.g., in U.S. Pat. No. 3,458,311 and JP-A-55-49729.

Another function can further be imparted to the protective layer. For instance, by adding colorants (water-soluble dyes, etc.) which are excellent in permeability to the light for exposure of from 350 nm to 450 nm, and capable of efficiently absorbing the light of 500 nm or more, safelight aptitude can be further increased without causing the reduction of the sensitivity.

When the photosensitive material comprising the photosensitive composition according to the present invention is used as an image-forming material, an image is obtained in general by image exposure, and then removing the unexposed part of the photosensitive layer by a developing solution. When the photosensitive composition is used as a lithographic printing plate precursor, the developing solution disclosed in JP-B-57-7427 can be exemplified as preferred developing solution, and aqueous solutions of inorganic alkali salts such as sodium silicate, potassium silicate, sodium hydroxide, potassium hydroxide, lithium hydroxide, tertiary sodium phosphate, secondary sodium phosphate, tertiary ammonium phosphate, secondary ammonium phosphate, sodium metasilicate, sodium bicarbonate, and aqueous ammonia, and organic alkali agents such as monoethanolamine or diethanolamine are preferably used. These inorganic or organic alkali agents are added so that the concentration of the alkali solution becomes from 0.1 to 10 wt %, preferably from 0.5 to 5 wt %.

The alkaline aqueous solution can contain, if necessary, a surfactant and an organic solvent, e.g., benzyl alcohol, 2-phenoxyethanol, 2-butoxyethanol, etc., in a small amount. For example, the compounds disclosed in U.S. Pat. Nos. 3,375,171 and 3,615,480 can be exemplified.

Further, the developing solutions disclosed in JP-A-50-26601, JP-A-58-54341, JP-B-56-39464 and JP-B-56-42860 are also preferably sued.

In addition, in the plate-making process of a lithographic printing plate from a lithographic printing plate precursor having a photosensitive layer in which the photosensitive composition of the present invention is used, if necessary, the plate may be heated all over the surface before exposure, during exposure and from exposure to development. The image-forming reaction in the photosensitive layer is accelerated by heating, which leads to the improvement of sensitivity and press life and the stabilization of sensitivity. Further, for the purpose of improving the image strength and press life, it is effective for the image after development to be subjected to whole image post-heating or whole image exposure. The heating before development is generally preferably performed on moderate condition of 150° C. or lower. If the temperature is too high, a problem that the non-image is fogged occurs. Heating after development is performed on very severe condition, i.e., generally from 200 to 500° C. Lower temperature does not result in sufficient image strengthening effect, while higher temperature leads to the degradation of a support and thermal decomposition of an image part.

A lithographic printing plate precursor having a photosensitive layer in which the photosensitive composition of the present invention is used can be exposed by well-known methods with no limitation. Preferred wavelength of a light source is from 350 nm to 450 nm, specifically an InGan series semiconductor laser is preferably used. Exposure machinery may be any of an internal drum type, an external drum type, or a flat bed type. Since the photosensitive layer components are highly water-soluble, they are also soluble in neutral water and weak alkaline water. A lithographic printing plate precursor having such constitution can take an on-press exposure-development system after being loaded onto a printing press.

As other exposure rays for the photopolymerizable composition according to the present invention, a mercury lamp, a chemical lamp, a carbon arc lamp, a xenon lamp, a metal halide lamp of ultra-high pressure, high pressure, intermediate pressure and low pressure, and various visible and ultraviolet laser lamps, a fluorescent lamp, a tungsten lamp and sunlight can be used.

As available laser light sources of from 350 nm to 450 nm, the following can be used.

As gas lasers: Ar ion laser (364 nm, 351 nm, 10 mW to 1 W), Kr ion laser (356 nm, 351 nm, 10 mW to 1 W), He-Cd laser (441 nm, 325 nm, 1 mW to 100 mW), As solid state lasers: a combination of 2 times of Nd/YAG (YVO$_4$) and SHG crystals (355 nm, 5 mW to 1 W), a combination of Cr/LiSAF and SHG crystals (430 nm, 10 mW), As semiconductor lasers: KNbO$_3$ ring resonator (430 nm, 30 mW), a combination of waveguide type wavelength conversion device and AlGaAs, InGaAs semiconductor (380 nm to 450 nm, 5 mW to 100 mW), a combination of waveguide type wavelength conversion device and AlGaInP, AlGaAs semiconductor (300 nm to 350 nm, 5 mW to 100 mW), AlGaInN (350 nm to 450 nm, 5 mW to 30 mW), and As other pulse lasers: N$_2$ laser (337 nm, pulse 0.1 to 10 mJ), XeF (351 nm, pulse 10 to 250 mJ).

Of these, AlGaInN semiconductor laser (commercially available InGaN series semiconductor laser, 400 to 410 nm, 5 to 30 mW) is particularly preferred in view of the wavelength characteristics and the cost.

As the exposure apparatuses of scanning exposure type lithographic printing plate precursor, exposure machinery may be an internal drum type, an external drum type, or a flat bed type, and as the light sources, those capable of continuous oscillation among the above light sources can be preferably used. In practice the following exposure apparatuses are particularly preferred from the relationship between the sensitivity of the photosensitive material and the plate-making time.

An exposure apparatus of single beam to triple beams using one or more of a gas laser or solid state laser light source, so that the total output becomes 20 mW or more by internal drum type.

An exposure apparatus of multi-beam (from 1 to 10 beams) using one or more of a semiconductor laser, gas laser or solid state laser light source, so that the total output becomes 20 mW or more by flat bed type.

An exposure apparatus of multi-beam (from 1 to 9 beams) using one or more of a semiconductor laser, gas laser or solid state laser light source, so that the total output becomes 20 mW or more by external drum type.

An exposure apparatus of multi-beam (10 beams or more) using one or more of a semiconductor laser or solid state laser light source, so that the total output becomes 20 mW or more by external drum type.

In the above-described direct drawing type lithographic printing plates by laser beams, the following equation (eq 1) comes to existence among the sensitivity of the photosensitive material X (J/cm$^2$), the exposure area of the photosensitive material S (cm$^2$), the power of one laser light source q (W), the number of laser beams n, and the total exposure time t (s):

$$X \cdot S = n \cdot q \cdot t \qquad \text{(eq 1)}$$

i) In the case of internal drum type (single beam):

The following equation (eq 2) comes to existence among the laser revolution number f (radian/s), the sub-scanning length of the photosensitive material Lx (cm), the resolving power Z (dot/cm), and the total exposure time t (s):

$$f \cdot Z \cdot t = Lx \qquad \text{(eq 2)}$$

ii) In the case of external drum type (multi-beam):

The following equation (eq 3) comes to existence among the drum revolution number F (radian/s), the sub-scanning length of the photosensitive material Lx (cm), the resolving power Z (dot/cm), the total exposure time t (s), and the beam number (n):

$$F \cdot Z \cdot n \cdot t = Lx \qquad \text{(eq 3)}$$

iii) In the case of flat bed type (multi-beam):

The following equation (eq 4) comes to existence among the polygonal mirror revolution number H (radian/s), the sub-scanning length of the photosensitive material Lx (cm), the resolving power Z (dot/cm), the total exposure time t (s), and the beam number (n):

$$F \cdot Z \cdot n \cdot t = Lx \qquad \text{(eq 4)}$$

By substituting the resolving power required of the practical printing plate (2,560 dpi), the plate size (A1/B1, sub-scanning length 421 inches), the exposure condition of about 20 sheets/hour, and the photosensitive characteristics of the photosensitive composition of the present invention (photosensitive wavelength, sensitivity: about 0.1 mJ/cm$^2$) for the above equation, it can be understood that the combination of the photosensitive material using the photosensitive composition according to the present invention with a multi-beam exposure system using the laser having total output of 20 mW or more is particularly preferred. Further, taking the operational property and the cost into consideration, the combination of external drum type and an exposure apparatus of a semiconductor laser multi-beam (10 beams or more) is most preferred.

Besides the lithographic printing plate for scanning exposure, the photopolymerizable composition or photosensitive composition according to the present invention can be widely used in the field of photo-curable resins with no particular limitation, e.g., when the composition is applied, according to necessity, to a liquid photopolymerizable composition combined with a cationic polymerizable compound, a high speed optical image-forming material can be obtained. Further, the composition can be used as a material for hologram by making use of the refractive index variation with photopolymerization. The composition can also be applied to a variety of transfer materials (a stripping off photographic material, a toner developing material) by making use of the surface adhesion variation. It also can be used in photo-curing of microcapsules. It can further be applied to the manufacture of electronic materials such as photoresist, and the photo-curable resin materials of inks, coatings and adhesives.

Further, the photopolymerization initiator comprising a carbazole compound and a titanocene compound contained in the photopolymerizable composition or photosensitive composition according to the present invention is excellent in photosensitivity and stability, and can be used in various usages in addition to the above-described photosensitive composition. For example, radical generation by light with high efficiency can cause the oxidative coloring of a triphenylmethane series leuco dye at high sensitivity. Further, the photopolymerization initiator of the present invention can cause a decoloring reaction of a certain kind of polymethine series dye by radical addition Since the photopolymerization initiator of the present invention generates by light not only a radical but also acid component at the same time, high speed image-forming materials can be produced by combining with a compound whose absorption changes by acid, a resin composition which causes a crosslinking reaction by acid, or a resin composition which can decompose by acid to improve the solubility.

EXAMPLE

The present invention will be described in detail with referring to examples but it should not be construed as the present invention is limited thereto.

Examples I-1 to I-8. Comparative Examples I-1 to I-3

Preparation of Support

An aluminum plate having a thickness of 0.3 mm was immersed in a 10 wt % aqueous sodium hydroxide solution at 60° C. for 25 seconds to effect etching, then washed with flowing water, washed with a 20 wt % aqueous nitric acid solution for neutralization and then washed with water. The plate was subjected to electrolytic surface roughening treatment in a 1 wt % aqueous nitric acid solution with applying alternating waveform electric current of sine wave at anode current of 300 coulomb/dm$^2$. Subsequently, the plate was immersed in a 1 wt % aqueous sodium hydroxide solution at 40° C. for 5 seconds, then immersed in a 30 wt % aqueous sulfuric acid solution and desmutting-treated at 60° C. for 40 seconds. Thereafter, the plate was subjected to anodic oxidation treatment for 2 minutes in a 20 wt % aqueous sulfuric acid solution at the electric density of 2 A/cm$^2$ so that the thickness of the anodic oxidation film reached 2.7 g/m$^2$. On measurement, the surface roughness was 0.3 μm (Ra indication by JIS B0601).

The sol-gel reaction solution shown below was coated on the back surface of the thus-treated plate by means of a bar coater, the coated plate was dried at 100° C. for 1 minute. Thus, a support having a back coat layer having a dry coating amount of 70 mg/m$^2$ was obtained.

| Sol-Cel Reaction Solution | |
|---|---|
| Tetraethyl silicate | 50 weight parts |
| Water | 20 weight parts |
| Methanol | 15 weight parts |
| Phosphoric acid | 0.05 weight parts |

The above component was mixed and stirred, heat generation started after about 5 minutes. After the reaction was continued for 60 minutes, the following solution was added to the reaction solution, thereby a back coat layer coating solution was obtained.

| Back Coat Layer Coating Solution | |
|---|---|
| Pyrogallol-formaldehyde condensation resin (molecular weight: 2,000) | 4 weight parts |
| Dimethyl phthalate | 5 weight parts |
| Fluorine-containing surfactant (N-butylperfluorooctanesulfonamide ethyl acrylate/polyoxyethylene acrylate copolymer, molecular weight: 20,000) | 0.7 weight parts |
| Methanol Silica Sol (manufactured by Nissan Chemical Industries, Ltd., methanol: 30 wt %) | 50 weight parts |
| Methanol | 800 weight parts |

Preparation of Photosensitive Layer

The following photopolymerizable composition was coated on the thus-treated aluminum plate in a dry coating amount of 1.0 g/m$^2$, and the coated plate was dried at 80° C. for 2 minutes, thus a photosensitive layer was formed.

| | |
|---|---|
| Pentaerythritol tetraacrylate | 20 weight parts |
| Allylmethacrylate/methacrylic acid copolymer (copolymerization molar ratio: 83/17) | 20 weight parts |
| Photoinitiator (shown in Table I-1) | |
| Sensitizing dye | |
| Titanocene compound | |
| Co-sensitizer | |
| Fluorine-based nonionic surfactant (F-177P) | 0.3 weight parts |
| Thermal polymerization inhibitor, N-nitrosophenylhydroxylamine aluminum salt | 0.1 weight parts |
| Pigment dispersion | 0.6 weight parts |
| Composition of pigment dispersion | |
| Composition/Pigment Blue: 15/6 | 15 weight parts |
| Allylmethacrylate/methacrylic acid copolymer (copolymerization molar ratio: 83/17) | 10 weight parts |
| Cyclohexanone | 15 weight parts |
| Methoxypropyl acetate | 20 weight parts |
| Propylene glycol monomethyl ether | 40 weight parts |
| Methyl ethyl ketone | 20 g |
| Propylene glycol monomethyl ether | 20 g |

Preparation of Protective Layer

A 3 wt % aqueous solution of polyvinyl alcohol (saponification degree: 98 mol %, polymerization degree: 550) was coated on the photosensitive layer in a dry coating weight of 2 g/m$^2$, and dried at 100° C. for 2 minutes.

Evaluation of Photosensitivity and Safelight Aptitude

A step guide (manufactured by Fuji Photo Film Co., Ltd., a gray scale guide showing discontinuous variation of transmitted optical density at ΔD=0.15) was closely contacted on the above-obtained photosensitive material, and exposure was performed using a xenon lamp through an optical filter (Kenko-BP-40) so as to reach the already known exposure energy. For the purpose of estimating the exposure aptitude to short wavelength semiconductor laser, Kenko-BP-40 capable of exposure with monochromatic light of 400 nm was used as the optical filter. Thereafter, the photosensitive material was subjected to development by immersing in the developing solution having the following composition at 25° C. for 10 seconds. Sensitivity (clear sensitivity) was computed from the highest stage where the image was completely removed (shown in Table I-1) "Clear sensitivity" is the lowest necessary energy for the formation of an image, and the lower the value, the higher is the sensitivity.

TABLE I-1

| Example No. | Initiator (addition amount based on the total solid content in the photosensitive layer, wt %) | | | Clear Sensitivity (mJ/cm²) |
| --- | --- | --- | --- | --- |
| | Sensitizing Dye | Titanocene Compound | Co-Sensitizer | |
| Example I-1 | D3 (1.0) | T-1 (1.0) | H-1 (5.0) | 0.2 |
| Example I-2 | D1 (1.0) | T-2 (1.3) | H-1 (2.0) | 0.1 |
| Example I-3 | D2 (1.5) | T-2 (1.8) | H-2 (5.0) | 0.1 |
| Example I-4 | D13 (1.2) | T-2 (0.9) | None | 0.3 |
| Example I-5 | D14 (1.0) | T-2 (2.8) | H-1 (10) | 0.2 |
| Example I-6 | D18 (1.2) | T-1 (1.8) | None | 0.3 |
| Example I-7 | D10 (0.8) | T-1 (1.8) | H-2 (3.0) | 0.1 |
| Example I-8 | D22 (0.9) | T-1 (0.5) | None | 0.3 |
| Comparative Example I-1 | None | T-2 (1.8) | None | 1.5 |
| Comparative Example I-2 | None | T-2 (2.8) | H-1 (5.0) | 0.7 |
| Comparative Example I-3 | D1 (1.0) | H-3 (1.0)* | H-2 (3.0) | 1.0 |

*Hexarylbiimidazole was used in place of the titanocene compound as comparative example.

As can be seen from the results in Table I-1, the lithographic printing plate of the present invention is very high speed and shows sufficient sensitivity for scanning exposure system.

Further, the photoinitiator according to the present invention is high speed as compared with the case wherein a sensitizing dye is not used and, in particular, shows sufficient sensitivity even when the addition amount of the titanocene compound is small.

Developing Solution in Table I-1

An aqueous solution comprising the following composition and having pH 13.

| 1 K Potassium silicate | 3.0 weight parts |
| --- | --- |
| Potassium hydroxide | 1.5 weight parts |
| Compound represented by the following formula 1 | 0.2 weight parts |
| Water | 95.3 weight parts |

Compound of Formula 1

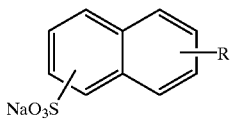

Example I-9

A lithographic printing plate precursor was prepared in the same manner as in Examples I-1 to I-8 except that the composition of the photoinitiator was changed as follows and that the film thickness of the photosensitive layer was changed to 1.5 g/m².

Photopolymerization Initiator (The addition amount was the content in the entire solid content in the photosensitive layer.)

| Sensitizing Dye D1 | 1.2 wt % |
| --- | --- |
| Titanocene compound T-2 | 1.5 wt % |
| Co-sensitizer H-1 | 7.0 wt % |

The thus-obtained lithographic printing plate precursor was subjected to scanning exposure by using InGaN semiconductor laser having oscillation wavelength of 400 nm on the condition of the beam on the printing plate of 25 μm and exposure energy density of 0 2 mJ/cm². Subsequently, after the plate was heated at 100° C. for 10 seconds, the above development process was performed.

A lithographic printing plate having a blue image excellent in visibility was obtained. Offset printing was performed using the thus-obtained printing plate by KOR-D printer manufactured by Heidelberg Co. More than 50,000 sheets of print excellent in image density and anti-smearing could be obtained.

Example I-10

The lithographic printing plate precursor prepared in Example I-9 was stored for three days under forced conditions of 65% RH at 45° C. Print-making and printing were performed using this plate in the same manner as in Example I-9. Good results similar to those in Example I-9 were obtained.

Example I-11

The emission strength distribution of safelight commonly used was measured and the position where the emission strength distribution on the short wavelength side arose (the end of short wave) was measured. Further, the working ability under each safelight was evaluated.

TABLE I-2

| Safelight | End of Short Wave of Emission (nm) | Working Ability |
| --- | --- | --- |
| White lamp | 400 | Good |
| Yellow lamp | 520 | Sufficiently bright for plate-making work |
| Orange lamp | 570 | Considerably dark and Difficult to work, it takes time to be |

TABLE I-2-continued

| Safelight | End of Short Wave of Emission (nm) | Working Ability |
|---|---|---|
| Red lamp | 600 | accustomed to the work Very dark, the work requires skill |

Thus, a yellow lamp is desired in view of the working ability. Materials which are handleable under a yellow lamp are required to have low photosensitivity at at least 520 nm, preferably at 490 nm or longer wavelength. The dye groups according to the present invention have absorption maximum in the vicinity of 400 nm, thus the present invention is advantageous in this point, also.

Example I-12

A lithographic printing plate precursor was prepared in the same manner as in Example I-9 except that the composition of the photoinitiator was changed as follows and that the film thickness of the photosensitive layer was changed to 2.0 g/m².
Photoinitiator
(The addition amount was the content in the entire solid content in the photosensitive layer.)

| Sensitizing Dye D8 | 1.5 wt % |
|---|---|
| Titanocene compound T-2 | 1.5 wt % |
| Co-sensitizer H-1 | 5.0 wt % |

The thus-obtained lithographic printing plate precursor was subjected to scanning exposure by using InGaN semiconductor laser having oscillation wavelength of 400 nm on the condition of the beam on the printing plate of 25 μm and exposure energy density of 0.15 mJ/cm². Subsequently, after the plate was heated at 100° C. for 10 seconds, the above development process was performed. A lithographic printing plate having a blue image excellent in visibility was obtained. The above-obtained plate was further heated at 300° C. for 5 minutes, and offset printing was performed by KOR-D printer manufactured by Heidelberg Co. More than 200,000 sheets of print excellent in image density and anti-smearing (i.e., anti-staining) could be obtained.

Example I-13

The lithographic printing plate precursor prepared in Example I-9 was exposed to a yellow lamp for 30 minutes before scanning exposure. Print-making and printing were performed using this plate in the same manner as in Example I-9. Good results completely the same as those in Example I-9 were obtained.

Comparative Example I-4

A lithographic printing plate precursor was prepared in the same manner as in Example I-9 except that sensitizing dye D1 (absorption maximum wavelength: 410 nm) was replaced with H4 (absorption maximum wavelength: 500 nm). The plate-making in the same manner as in Example I-9 using InGaN semiconductor laser having oscillation wavelength of 400 nm resulted in image-flowing (i.e., image deletion). Further, the lithographic printing plate precursor prepared was exposed to a yellow lamp for 30 minutes before scanning exposure in the same manner as in Example I-13, and print-making and printing were performed in the same manner as in Example I-9. The whole surface of the print was solid and fog was generated.

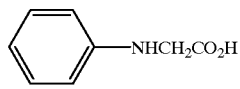
(H1)

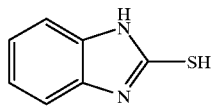
(H2)

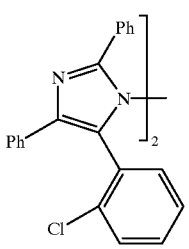
(H3)

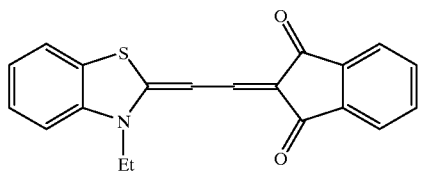
(H4)

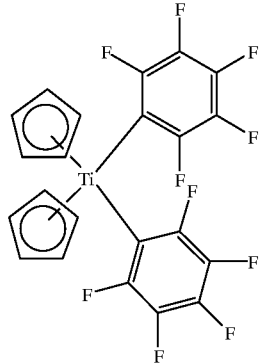
(T-1)

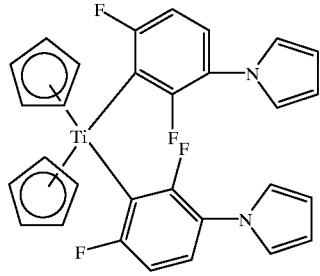
(T-2)

The lithographic printing plate precursor according to the present invention has sufficient sensitivity fitted for scanning exposure by short wavelength semiconductor laser such as InGaN, and provides a lithographic printing plate excellent in press life and anti-smearing (i.e., anti-staining) property. The lithographic printing plate precursor for scanning exposure according to the present invention is markedly improved in fog under a yellow lamp, hence the working ability of handling the printing plate can be largely improved. In addition, the photopolymerizable composition of the present invention is excellent not only in the sensitivity but in the storage stability.

Examples II-1 to II-8, Comparative Examples II-1 to II-6

Preparation of Support

Each support was prepared in the same manner as in Examples I-1 to I-8 and Comparative Examples I-1 to I-3.

| | |
|---|---|
| Pentaerythritol tetraacrylate | 1.5 g |
| Allylmethacrylate/methacrylic acid copolymer (copolymerization molar ratio: 83/17) | 2.0 g |
| Photoinitiator (shown in Table II-1) Sensitizing dye Titanocene compound Co-sensitizer | |
| Fluorine-based nonionic surfactant (F-177P) | 0.02 g |
| Thermal polymerization inhibitor, N-nitrosophenylhydroxylamine aluminum salt | 0.01 g |
| Pigment dispersion | 2.0 g |
| Composition of pigment dispersion | |
| Composition/Pigment Blue: 15/6 | 15 weight parts |
| Allylmethacrylate/methacrylic acid copolymer (copolymerization molar ratio: 83/17) | 10 weight parts |
| Cyclohexanone | 15 weight parts |
| Methoxypropyl acetate | 20 weight parts |
| Propylene glycol monomethyl ether | 40 weight parts |
| Methyl ethyl ketone | 20.0 g |
| Propylene glycol monomethyl ether | 20.0 g |

Preparation of Protective Layer

Each protective layer was formed in the same manner as in Examples I-1 to I-8 and Comparative Examples I-1 to I-3.

Evaluation of Photosensitivity and Safelight Aptitude

Evaluation was carried out in the same manner as in Examples I-1 to I-8 and Comparative Examples I-1 to I-3. The results obtained are shown in Table II-1 below.

TABLE II-1

| Example No. | Initiator (addition amount based on the total solid content in the photosensitive layer, wt %) | | | Clear Sensitivity (mJ/cm²) |
|---|---|---|---|---|
| | Sensitizing Dye | Titanocene Compound | Co-Sensitizer | |
| Example II-1 | D4 (1.0) | T-1 (1.0) | H1 (5.0) | 0.2 |
| Example II-2 | D21 (1.3) | T-2 (1.8) | H2 (2.0) | 0.1 |
| Example II-3 | D18 (1.2) | T-2 (0.9) | None | 0.3 |
| Example II-4 | D6 (1.0) | T-2 (2.8) | H1 (10) | 0.2 |
| Example II-5 | D17 (1.2) | T-1 (1.8) | None | 0.3 |
| Example II-6 | D25 (0.8) | T-1 (1.8) | H2 (3.0) | 0.1 |
| Example II-7 | D14 (0.9) | T-2 (0.5) | None | 0.1 |
| Example II-8 | D1 (1.2) | T-1 (1.8) | None | 0.3 |
| Comparative Example II-1 | D7 (2.5) | None | None | Image could not be formed |
| Comparative Example II-2 | None | T-2 (1.8) | None | 1.5 |
| Comparative Example II-3 | None | T-2 (2.8) | H1 (5.0) | 0.7 |
| Comparative Example II-4 | H6 (0.9) | T-2 (0.5) | None | 0.9 |
| Comparative Example II-5 | H5 (1.2) | T-1 (1.8) | None | 1.2 |
| Comparative Example II-6 | D14 (1.0) | H3 (1.0)* | None | 1.4 |

*A triazine compound was used in place of the titanocene compound as Comparative Example II-6.

As can be seen from the results in Table II-1, the lithographic printing plate precursor using the photosensitive composition according to the present invention is very high speed and shows sufficient sensitivity for scanning exposure system.

Further, the photoinitiator contained in the photosensitive composition according to the present invention is high speed as compared with the case wherein a sensitizing dye is not used and, in particular, shows sufficient sensitivity even when the addition amount of the titanocene compound is small.

The developing solution used in Examples II-1 to II-8 and Comparative Examples II-1 to II-6 was an aqueous solution comprising the following composition and having pH 13.

| | |
|---|---|
| 1 K Potassium silicate | 3.0 weight parts |
| Potassium hydroxide | 1.5 weight parts |
| Compound represented by the following formula 1 | 0.2 weight parts |
| Water | 95.3 weight parts |

Compound of Formula 1

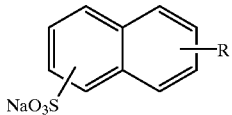

Example II-9 to II-16, Comparative Compound II-7

Each lithographic printing plate precursor was prepared according to the following procedure and printing performance was evaluated. The results obtained are shown in Table II-2 below.

Pre-treatment of Support

A 1S aluminum plate having a thickness of 0.30 mm was subjected to brush-graining treatment using a No. 8 nylon brush and a suspension of 800 mesh pumice stone and water, and the surface of the plate was thoroughly washed with water. The etching was effected by immersing the plate in a 10 wt % sodium hydroxide aqueous solution at 70° C. for 60 seconds, the plate was further washed with flowing water, then washed with a 20 wt % nitric acid aqueous solution for neutralization followed by washing with water. Under the condition of $V_A$ of 12.7 V using alternating waveform electric current of sine wave, the plate was subjected to electrolytic surface roughening treatment in a 1 wt % aqueous nitric acid solution with applying alternating waveform electric current of sine wave at anode current of 300 coulomb/dm$^2$. The surface roughness determined was 0.45 µm (Ra indication by JIS B0601).

Hydrophilizing Treatment of Support Surface

The above support was immersed in a 2.5 wt % aqueous solution of sodium tetrasilicate (SiO$_2$: 28 to 30%, Na$_2$O: 9 to 10%, Fe: 0.02% or less) having pH of 11.2 at 70° C. for 13 seconds followed by washing with water. The amount of silicate on the surface obtained from the Si element on the surface measured by fluorescent X-ray analysis was 10 mg/m$^2$.

Coating of Interlayer

The coating solution A having the following composition was prepared and coated on the hydrophilized surface of the above support by a wheeler at rotation rate of 180 rpm in a coating amount of phenylphosphonic acid of 20 mg/m$^2$, and then dried at 80° C. for 30 seconds.

| Interlayer Coating Solution A | |
|---|---|
| Phenylphosphonic acid | 0.07 to 1.4 g |
| Methanol | 200 g |

Coating of Photosensitive Layer

On the above support having the interlayer, a photosensitive layer coating solution having the following composition was coated using a wheeler in a coating amount of 1.0 to 2.0 g/m$^2$, and the photosensitive layer was dried at 100° C. for 1 minute.

| Photosensitive Layer Coating Solution | |
|---|---|
| Addition polymerizable compound (compound shown in Table II-2) | 1.5 g |
| Binder polymer (compound shown in Table II-2) | 2.0 g |
| Sensitizing dye (compound shown in Table II-2) | 0.1 g |
| Activator (compound shown in Table II-2) | 0.1 g |
| Co-sensitizer (compound shown in Table II-2) | 0.3 g |
| Pigment dispersion | 2.0 g |
| Composition of pigment dispersion | |
| Composition/Pigment Blue: 15/6 | 15 weight parts |
| Allylmethacrylate/methacrylic acid copolymer (copolymerization molar ratio: 83/17) | 10 weight parts |
| Cyclohexanone | 15 weight parts |
| Methoxypropyl acetate | 20 weight parts |
| Propylene glycol monomethyl ether | 40 weight parts |
| Thermal polymerization inhibitor, N-nitrosophenylhydroxylamine aluminum salt | 0.01 g |
| Surfactant, Megafac F-177 (manufactured by Dainippon Chemicals & Ink Co., Ltd.) | 0.02 g |
| Methyl ethyl ketone | 20.0 g |
| Propylene glycol monomethyl ether | 20.0 g |

Preparation of Protective Layer

A 3 wt % aqueous solution of polyvinyl alcohol (saponification degree: 98 mol %, polymerization degree: 550) was coated on the photosensitive layer in a dry coating weight of 2 g/m$^2$, and dried at 100° C. for 2 minutes.

Exposure of Lithographic Printing Plate Precursor

The thus-obtained lithographic printing plate precursor was exposed using 400 nm monochromatic light as a light source, the exposure power was controlled so that the exposure energy density of the plate became 200 µJ/cm$^2$, and the plate was exposed by solid image exposure and half dot image exposure from 1% to 99% every 1% on the condition of 175 lines/inch.

Development and Plate-Making

The prescribed developing solution (shown in Table II-2) and Finisher FP-2W (manufactured by Fuji Photo Film Co., Ltd.) were charged in automatic processor LP-850 (manufactured by Fuji Photo Film Co., Ltd.), and the exposed plate was subjected to development/plate-making on the condition of the temperature of the developing solution of 30° C. and development time of 18 seconds. Thus, a lithographic printing plate was obtained.

Test of Press Life

R201 (manufactured by Roland Co., Ltd.) was used as a printer and GEOS-G(N) (manufactured by Dainippon Chemicals & Ink Co., Ltd.) was used as ink. Printed matters of solid image part were observed and press life was evaluated by the number of the sheets which became blurred. The higher the value, the better is the press life.

Forced Test of Half Dot Press Life

R201 (manufactured by Roland Co., Ltd.) was used as a printer and GEOS-G(N) (manufactured by Dainippon Chemicals & Ink Co., Ltd.) was used as ink. After 5,000 sheets were printed from the start of printing, PS plate cleaner CL-2 (manufactured by Fuji Photo Film Co., Ltd.) was applied to printing sponge and the half dot part was wiped to remove the ink on the printing plate. Thereafter, 10,000 sheets were printed and skipping (i.e., disappearance) of half dot on the printed matter was visually observed.

Test of Smearing (i.e., Staining)

R201 (manufactured by Roland Co., Ltd.) was used as a printer and GEOS-G(S) (manufactured by Dainippon Chemicals & Ink Co., Ltd.) was used as ink. The non-image part (the unexposed part) of the printed matter was observed and smearing (staining) was evaluated.

TABLE II-2

| | Photosensitive Layer | | | | | | Printing Performance | | |
|---|---|---|---|---|---|---|---|---|---|
| Ex. No. | Addition Polymerizable Cpd. | Binder Polymer | Sensitizing Dye | Titanocene | Co-sensitizer | Coating Amount (mg/m$^2$) | Composition of Developing Solution | Press Life of Image Part | Press Life of Half Dot Part | Smearing of Non-image Part |
| Ex. II-9 | M-1 | B-1 | D-3 | T-1 | H-8 | 1.5 | DV-1 | 100,000 | good | good |
| Ex. II-10 | M-2 | B-1 | D-22 | T-2 | H-8 | 2 | DV-2 | 70,000 | good | good |
| Ex. II-11 | M-2 | B-3 | D-14 | T-2 | H-2 | 1.8 | DV-3 | 200,000 | good | good |
| Ex. II-12 | M-1 | B-2 | D-1 | T-2 | H-2 | 2.5 | DV-1 | 80,000 | good | good |
| Ex. II-13 | M-1 | B-1 | D-17 | T-1 | H-2 | 1 | DV-1 | 70,000 | good | good |
| Ex. II-14 | M-2 | B-3 | D-25 | T-1 | H-2 | 1 | DV-3 | 50,000 | good | good |
| Ex. II-15 | M-2 | B-3 | D-4 | T-2 | H-7 | 2.5 | DV-3 | 50,000 | good | good |
| Ex. II-16 | M-2 | B-1 | D-21 | T-1 | H-8 | 1.8 | DV-1 | 80,000 | good | good |
| Comp. Ex. II-7 | M-1 | B-1 | None | T-2 | H-2 | 1.5 | DV-1 | image-flowing | image-flowing | good |

Addition Polymerizable Compound in Table II-2

M-1: Pentaerythritol tetraacrylate (manufactured by Shin-Nakamura Kagaku Kogyo Co., Ltd., NK ester A-TMMT)

M-2: Glycerin dimethacrylate hexamethylenediisocyanate urethane prepolymer (manufactured by Kyoei Chemical Co., Ltd., UA101H)

Binder Polymer in Table II-2

B-1: Allylmethacrylate/methacrylic acid/N-isopropylacrylamide copolymer (copolymerization molar ratio: 67/13/20), Measured acid value: 1.15 meq/g, obtained by NaOH titration, Weight average molecular weight obtained by GPC measurement: 130,000

B-2: Allylmethacrylate/methacrylic acid copolymer (copolymerization molar ratio: 83/17) Measured acid value: 1.55 meq/g, obtained by NaOH titration, Weight average molecular weight obtained by GPC measurement: 125,000

B-3: Dolyurethane resin of condensation polymerization product of the following diisocyanate and diol: 4,4'-diphenylmethanediisocyanate (MDI), hexamethylenediisocyanate (HMDI), polypropylene glycol (PPG1000, weight average molecular weight: 1,000), 2,2-bis(hydroxymethyl)propionic acid (DMPA), copolymerization molar ratio (MDI/HMDI/PPG1000/DMPA): 40/10/15/35 Measured acid value: 1.05 meq/g, obtained by NaOH titration, Weight average molecular weight obtained by GPC measurement: 45,000

Developing Solution in Table II-2

DV1

An aqueous solution comprising the following composition and having pH 10.

| Monoethanolamine | 0.1 weight parts |
|---|---|
| Triethanolamine | 1.5 weight parts |
| Compound represented by the following formula 1 | 4.0 weight parts |
| Compound represented by the following formula 2 | 2.5 weight parts |
| Compound represented by the following formula 3 | 0.2 weight parts |
| Water | 91.7 weight parts |

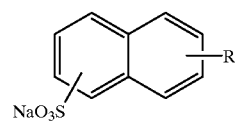
(1)

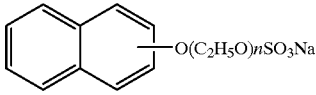
(2)

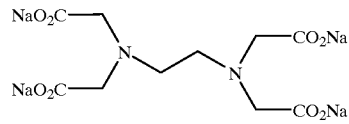
(3)

DV-2

An aqueous solution comprising the following composition and having pH 10.

| Sodium bicarbonate | 1.2 weight parts |
|---|---|
| Sodium carbonate | 0.8 weight parts |
| Compound represented by the above formula 1 | 3.0 weight parts |
| Compound represented by the above formula 2 | 2.0 weight parts |
| Compound represented by the above formula 3 | 0.2 weight parts |
| Water | 92.8 weight parts |

DV-3

An aqueous solution comprising the following composition and having pH 13.

| 1 K Potassium silicate | 3.0 weight parts |
|---|---|
| Potassium hydroxide | 1.5 weight parts |
| Compound represented by the following formula 3 | 0.2 weight parts |
| Water | 95.3 weight parts |

As is apparent from the results in Table II-2, the lithographic printing plate precursor according to the present invention can provide an excellent lithographic printing plate on the condition of capable of plate-making a printing plate by scanning exposure with high productivity, i.e., even on extremely low energy exposure condition. On the other hand, in Comparative Example II-7 where the photoinitiator of the present invention was not used, a practicable lithographic printing plate could not be obtained.

Example II-17

Each of a lithographic printing plate precursor was prepared in the same manner as in Examples II-1 to II-6 except that the composition of the photoinitiator was changed as follows and that the film thickness of the photosensitive layer was changed to 1.5 g/m$^2$.

Photoinitiator (The addition amount was the content in the entire solid content in the photosensitive layer.)

| Sensitizing Dye D14 | 1.2 wt % |
|---|---|
| Titanocene compound T-2 | 1.5 wt % |
| Co-sensitizer H-1 | 7.0 wt % |

The thus-obtained lithographic printing plate precursor was subjected to scanning exposure by using InGaN semiconductor laser having oscillation wavelength of 400 nm on the condition of the beam on the printing plate of 25 μm and exposure energy density of 0.2 mJ/cm$^2$. Subsequently, after the plate was heated at 100° C. for 10 seconds, the above development process was performed.

A lithographic printing plate having a blue image excellent in visibility was obtained. Offset printing was performed using the thus-obtained printing plate by KOR-D printer manufactured by Heidelberg Co. More than 50,000 sheets of print excellent in image density and anti-smearing (i.e., anti-staining) could be obtained.

Example II-18

The lithographic printing plate precursor prepared in Example II-17 was stored for three days under forced conditions of 65% RH at 45° C. Print-making and printing were performed using this plate in the same manner as in Example II-17. Good results similar to those in Example II-17 were obtained.

Example II-19

The emission strength distribution of safelight commonly used was measured and the position where the emission strength distribution on the short wavelength side arose (the end of short wave) was measured. Further, the workabililty under each safelight was evaluated. The results obtained are shown in Table II-3 below.

TABLE II-3

| Safelight | End of Short Wave of Emission (nm) | Working Ability |
|---|---|---|
| White lamp | 400 | Good |
| Yellow lamp | 520 | Sufficiently bright for plate-making work |
| Orange lamp | 570 | Considerably dark and difficult to work, it takes time to be accustomed to the work |
| Red lamp | 600 | Very dark, the work requires skill |

Thus, a yellow lamp is desired in view of the working ability. Materials which are handleable under a yellow lamp are required to have low photosensitivity at at least 520 nm, preferably at 490 nm or longer wavelength. The dye groups according to the present invention have absorption maximum in the vicinity of 400 nm, thus the present invention is advantageous in this point, also.

Example II-20

A lithographic printing plate precursor was prepared in the same manner as in Example II-17 except that the composition of the photoinitiator was changed as follows and that the film thickness of the photosensitive layer was changed to 2.0 g/m$^2$.

Photoinitiator (The addition amount was the content in the entire solid content in the photosensitive layer.)

| Sensitizing Dye D14 | 1.5 wt % |
|---|---|
| Titanocene compound T-2 | 1.5 wt % |
| Co-sensitizer H-1 | 5.0 wt % |

The thus-obtained lithographic printing plate precursor was subjected to scanning exposure by using InGaN semiconductor laser having oscillation wavelength of 400 nm on the condition of the beam on the printing plate of 25 pm and exposure energy density of 0.15 mJ/cm$^2$. Subsequently, after the plate was heated at 100° C. for 10 seconds, the above development process was performed. A lithographic printing plate having a blue image excellent in visibility was obtained. The above-obtained plate was further heated at 300° C. for 5 minutes, and offset printing was performed by KOR-D printer manufactured by Heidelberg Co. More than 200,000 sheets of print excellent in image density and anti-smearing (i.e., anti-staining) could be obtained.

Example II-21

The lithographic printing plate precursor prepared in Example II-20 was exposed to a yellow lamp for 30 minutes before scanning exposure. Print-making and printing were performed using this plate in the same manner as in Example II-20. Good results completely the same as those in Example II-20 were obtained.

Comparative Example II-8

A lithographic printing plate precursor was prepared in the same manner as in Example II-17 except that sensitizing dye D14 (absorption maximum wavelength: 410 nm) was replaced with H4 (absorption maximum wavelength: 500 nm). The plate-making in the same manner as in Example II-17 using InGaN semiconductor laser having oscillation wavelength of 400 nm resulted in image-flowing (i.e., image deletion). Further, the lithographic printing plate precursor prepared was exposed to a yellow lamp for 30 minutes before scanning exposure in the same manner as in Example II-21, and print-making and printing were performed in the same manner as in Example II-17. The whole surface of the print was solid and fog was generated.

The structure of the carbazole-based sensitizing dye used in this example was that exemplified in the specification of the present invention. Other compounds are shown below.

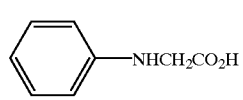

(H1)

(H2) 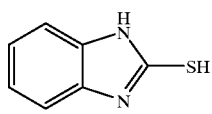

(H3) 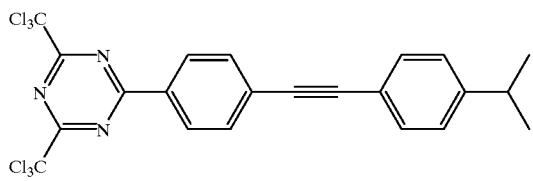

(H4) 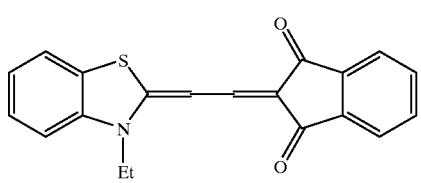

(H5) 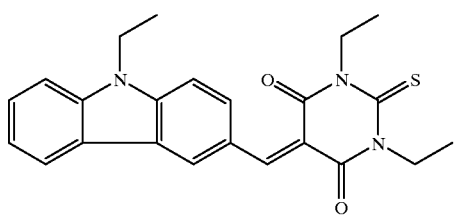

(H6) 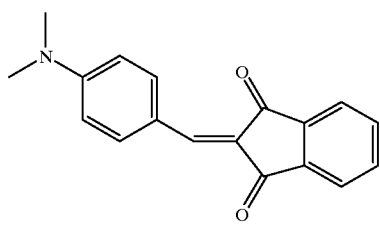

(T-1) 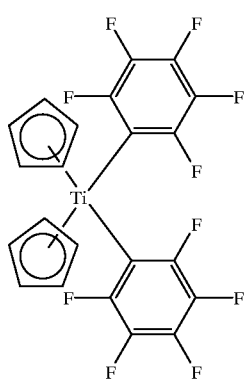

(T-2) 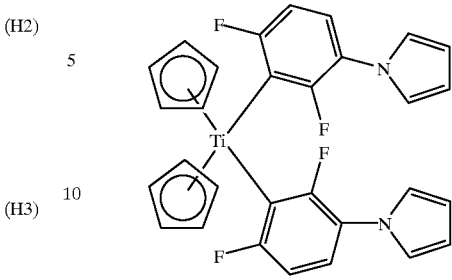

The lithographic printing plate precursor using the photosensitive composition according to the present invention has sufficient sensitivity fitted for scanning exposure by short wavelength semiconductor laser such as InGaN, and provides a lithographic printing plate excellent in press life and anti-smearing property. The lithographic printing plate precursor for scanning exposure using the photosensitive composition according to the present invention is markedly improved in fog under a yellow lamp, hence the working ability of handling the printing plate can be largely improved. In addition, the photopolymerizable composition of the present invention is excellent not only in the sensitivity but in the storage stability.

ExampleS III-1 to III-6, Comparative Examples III-1 to III-6

Preparation of Support

Each support was prepared in the same manner as in Examples I-1 to I-8 and Comparative Examples I-1 to I-3.

Preparation of Photosensitive Layer

The following photopolymerizable composition was coated on the above-treated aluminum plate in a dry coating amount of 1.0 g/m$^2$, and the coated plate was dried at 80° C. for 2 minutes, thus a photosensitive layer was formed.

| | |
|---|---|
| Pentaerythritol tetraacrylate | 1.5 g |
| Allylmethacrylate/methacrylic acid copolymer (copolymerization molar ratio: 83/17) | 2.0 g |
| Photoinitiator (shown in Table III-1) | |
| Sensitizing dye | |
| Titanocene compound | |
| Co-sensitizer | |
| Fluorine-based nonionic surfactant (F-177P) | 0.02 g |
| Thermal polymerization inhibitor, N-nitrosophenylhydroxylamine aluminum salt | 0.01 g |
| Pigment dispersion | 2.0 g |
| Composition of pigment dispersion | |
| | |
| Composition/Pigment Blue: 15/6 | 15 weight parts |
| Allylmethacrylate/methacrylic acid copolymer (copolymerization molar ratio: 83/17) | 10 weight parts |
| Cyclohexanone | 15 weight parts |
| Methoxypropyl acetate | 20 weight parts |
| Propylene glycol monomethyl ether | 40 weight parts |
| Methyl ethyl ketone | 20.0 g |
| Propylene glycol monomethyl ether | 20.0 g |

Coating of Protective Layer

Each protective layer was formed in the same manner as in Examples I-1 to I-8 and Comparative Examples I-1 to I-3.

Evaluation of Photosensitivity and Safelight Aptitude

Evaluation was carried out in the same manner as in Examples I-1 to I-8 and Comparative Examples I-1 to I-3. The results obtained are shown in Table III-1 below.

TABLE III-1

| Example No. | Sensitizing Dye | Titanocene Compound | Co-sensitizer | Clear Sensitivity (mJ/cm²) |
|---|---|---|---|---|
| Ex. III-1 | D21 (0.06) | T-1 (0.06) | H1 (0.2) | 0.2 |
| Ex. III-2 | D10 (0.1) | T-2 (0.12) | H2 (0.2) | 0.1 |
| Ex. III-3 | D12 (0.08) | T-2 (0.06) | None | 0.3 |
| Ex. III-4 | D11 (0.08) | T-2 (0.15) | H1 (0.5) | 0.2 |
| Ex. III-5 | D20 (0.05) | T-2 (0.03) | None | 0.4 |
| Ex. III-6 | D1 (0.1) | T-1 (0.1) | None | 0.1 |
| Comp. Ex. III-1 | D4 (0.2) | None | None | Image could not be formed |
| Comp. Ex. III-2 | None | T-2 (0.1) | None | 1.8 |
| Comp. Ex. III-3 | None | T-2 (0.15) | H1 (0.2) | 0.7 |
| Comp. Ex. III-4 | DR-2 (0.05) | T-2 (0.03) | None | 1.5 |
| Comp. Ex. III-5 | DR-3 (0.1) | T-1 (0.1) | None | 1.1 |
| Comp. Ex. III-6 | DR-1 (0.08) | H3 (0.06)* | None | 1.8 |

Initiator (addition amount based on the total solid content in the photosensitive layer, wt %)

*A triazine compound was used in place of the titanocene compound as comparative example.

As can be seen from the results in Table III-1, the lithographic printing plate precursor according to the present invention is very high speed and shows sufficient sensitivity for scanning exposure system.

Further, the photoinitiator according to the present invention is high speed as compared with the case wherein a sensitizing dye is not used and, in particular, shows sufficient sensitivity even when the addition amount of the titanocene compound is small.

The developing solution used in Examples III-1 to III-8 and Comparative Examples III-1 to III-6 was an aqueous solution comprising the following composition and having pH 13.

| 1 K Potassium silicate | 3.0 weight parts |
|---|---|
| Potassium hydroxide | 1.5 weight parts |
| Compound represented by the above formula 3 (Pelex NBL, manufactured by Kao Atlas Co., Ltd.) | 0.2 weight parts |
| Water | 95.3 weight parts |

Compound of Formula 3 (Pelex NBL)

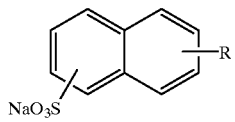

(3)

Example III-7 to III-14, Comparative Compound III-7

Each lithographic printing plate precursor was prepared according to the following procedure and printing performance was evaluated. The results obtained are shown in Table III-2 below.

Pre-treatment of Support

A 1 S aluminum plate having a thickness of 0.30 mm was subjected to brush-graining treatment using a No. 8 nylon brush and a suspension of 800 mesh pumice stone and water, and the surface of the plate was thoroughly washed with water. The etching was effected by immersing the plate in a 10 wt % sodium hydroxide aqueous solution at 70° C. for 60 seconds, the plate was further washed with flowing water, then washed with a 20 wt % nitric acid aqueous solution for neutralization followed by washing with water. Under the condition of $V_A$ of 12.7 V using alternating waveform electric current of sine wave, the plate was subjected to electrolytic surface roughening treatment in a 1 wt % aqueous nitric acid solution with applying alternating waveform electric current of sine wave at anode current of 300 coulomb/dm². The surface roughness determined was 0.45 pm (Ra indication by JIS B0601).

Hydrophilizing Treatment of Support Surface

The above support was immersed in a 2.5 wt % aqueous solution of sodium tetrasilicate ($SiO_2$: 28 to 30%, $Na_2O$: 9 to 10%, Fe: 0.02% or less) having pH of 11.2 at 70° C. for 13 seconds followed by washing with water. The amount of silicate on the surface obtained from the Si element on the surface measured by fluorescent X-ray analysis was 10 mg/m².

Coating of Interlayer

The coating solution A having the following composition was prepared and coated on the hydrophilized surface of the above support by a wheeler at rotation rate of 180 rpm in a coating amount of phenylphosphonic acid of 20 mg/m², and then dried at 80° C. for 30 seconds.

| Interlayer Coating Solution A | |
|---|---|
| Phenylphosphonic acid | 0.07 to 1.4 g |
| Methanol | 200 g |

Coating of Photosensitive Layer

On the above support having the interlayer, a photosensitive layer coating solution having the following composition was coated using a wheeler in a coating amount of 1.0 to 2.0 g/m², and the photosensitive layer was dried at 100° C. for 1 minute.

| Photosensitive Layer Coating Solution | |
|---|---|
| Addition polymerizable compound (compound shown in Table III-2) | 1.5 g |
| Binder polymer (compound shown in Table III-2) | 2.0 g |
| Sensitizing dye (compound shown in Table III-2) | 0.1 g |
| Activator (compound shown in Table III-2) | 0.1 g |
| Co-sensitizer (compound shown in Table III-2) | 0.3 g |

-continued

| Photosensitive Layer Coating Solution | |
|---|---|
| Pigment dispersion | 2.0 g |
| Composition of pigment dispersion | |
| Composition/Pigment Blue: 15/6 | 15 weight parts |
| Allylmethacrylate/methacrylic acid copolymer (copolymerization molar ratio: 83/17) | 10 weight parts |
| Cyclohexanone | 15 weight parts |
| Methoxypropyl acetate | 20 weight parts |
| Propylene glycol monomethyl ether | 40 weight parts |
| Thermal polymerization inhibitor, N-nitrosophenylhydroxylamine aluminum salt | 0.01 g |
| Surfactant, Megafac F-177 (manufactured by Dainippon Chemicals & Ink Co., Ltd.) | 0.02 g |
| Methyl ethyl ketone | 20.0 g |
| Propylene glycol monomethyl ether | 20.0 g |

Coating of Protective Layer

A 3 wt % aqueous solution of polyvinyl alcohol (saponification degree: 98 mol %, polymerization degree: 550) was coated on the photosensitive layer in a dry coating weight of 2 g/m$^2$, and dried at 100° C. for 2 minutes.

Exposure of Lithographic Printing Plate Precursor

The thus-obtained lithographic printing plate precursor was exposed using 400 nm monochromatic light as a light source, the exposure power was controlled so that the exposure energy density of the plate became 200 µJ/cm$^2$, and the plate was exposed by solid image exposure and half dot image exposure from 1% to 99% every 1% on the condition of 175 lines/inch.

Development and Plate-Making

The prescribed developing solution (shown in Table III-2) and Finisher FP-2W (manufactured by Fuji Photo Film Co., Ltd.) were charged in automatic processor LP-850 (manufactured by Fuji Photo Film Co., Ltd.), and the exposed plate was subjected to development/plate-making on the condition of the temperature of the developing solution of 30° C. and development time of 18 seconds. Thus, a lithographic printing plate was obtained.

Test of Press Life

R201 (manufactured by Roland Co., Ltd.) was used as a printer and GEOS-G(N) (manufactured by Dainippon Chemicals & Ink Co., Ltd.) was used as ink. Printed matters of solid image part were observed and press life was evaluated by the number of the sheets which became blurred. The higher the value, the better is the press life.

Forced Test of Half Dot Press Life

R201 (manufactured by Roland Co., Ltd.) was used as a printer and GEOS-G(N) (manufactured by Dainippon Chemicals & Ink Co., Ltd ) was used as ink. After 5,000 sheets were printed from the start of printing, PS plate cleaner CL-2 (manufactured by Fuji Photo Film Co., Ltd ) was applied to printing sponge and the half dot part was wiped to remove the ink on the printing plate. Thereafter, 10,000 sheets were printed and skipping (i.e., disappearance) of half dot on the printed matter was visually observed.

Test of Smearing (i.e. Staining)

R201 (manufactured by Roland Co., Ltd.) was used as a printer and GEOS-G(S) (manufactured by Dainippon Chemicals & Ink Co., Ltd.) was used as ink. The non-image part (the unexposed part) of the printed matter was observed and smearing (i.e., styaining) was evaluated.

TABLE III-2

| | Photosensitive Layer | | | | | | | Printing Performance | | |
|---|---|---|---|---|---|---|---|---|---|---|
| Ex. No. | Addition Polymerizable Cpd. | Binder Polymer | Sensitizing Dye | Titanocene | Co-sensitizer | Coating Amount (mg/m$^2$) | Composition of Developing Solution | Press Life of Image Part | Press Life of Half Dot Part | Smearing of Non-image Part |
| Ex. III-7 | M-1 | B-1 | D-11 | T-1 | H-5 | 1.5 | DV-1 | 100,000 | good | good |
| Ex. III-8 | M-2 | B-1 | D-22 | T-2 | H-5 | 2 | DV-2 | 70,000 | good | good |
| Ex. III-9 | M-2 | B-3 | D-1 | T-2 | H-2 | 1.8 | DV-3 | 200,000 | good | good |
| Ex. III-10 | M-1 | B-2 | D-26 | T-2 | H-2 | 2.5 | DV-1 | 80,000 | good | good |
| Ex. III-11 | M-1 | B-1 | D-16 | T-1 | H-2 | 1 | DV-1 | 70,000 | good | good |
| Ex. III-12 | M-2 | B-3 | D-10 | T-1 | H-2 | 1 | DV-3 | 50,000 | good | good |
| Ex. III-13 | M-2 | B-3 | D-20 | T-2 | H-4 | 2.5 | DV-3 | 50,000 | good | good |
| Ex. III-14 | M-2 | B-1 | D-21 | T-1 | H-5 | 1.8 | DV-1 | 80,000 | good | good |
| Comp. Ex. III-7 | M-1 | B-1 | None | T-2 | H-2 | 1.5 | DV-1 | image-flowing | image-flowing | good |

Addition Polymerizable Compound in Table III-2

M-1: Pentaerythritol tetraacrylate (manufactured by Shin-Nakamura Kagaku Kogyo Co., Ltd., NK ester A-TMMT)

M-2: Glycerin dimethacrylate hexamethylenediisocyanate urethane prepolymer (manufactured by Kyoei Chemical Co., Ltd., UA101H)

Binder Polymer in Table III-2

B-1: Allylmethacrylate/methacrylic acid/N-isopropylacrylamide copolymer (copolymerization molar ratio: 67/13/20), Measured acid value: 1.15 meq/g, obtained by NaOH titration, Weight average molecular weight obtained by GPC measurement: 130,000

B-2: Allylmethacrylate/methacrylic acid copolymer (copolymerization molar ratio: 83/17) Measured acid value: 1.55 meq/g, obtained by NaOH titration, Weight average molecular weight obtained by GPC measurement: 125,000

B-3: Polyurethane resin of condensation polymerization product of the following diisocyanate and diol: 4,4'-diphenylmethanediisocyanate (MDI), hexamethylenediisocyanate (HMDI), polypropylene glycol (PPG1000, weight average molecular weight: 1,000), 2,2-bis(hydroxymethyl)propionic acid (DMPA), copolymerization molar ratio (MDI/HMDI/PPG1000/DMPA): 40/10/15/35 Measured acid value: 1.05 meq/g, obtained by NaOH titration, Weight average molecular weight obtained by GPC measurement: 45,000

Developing Solution in Table III-2

DV-1

An aqueous solution comprising the following composition and having pH 10.

| Monoethanolamine | 0.1 weight parts |
|---|---|
| Triethanolamine | 1.5 weight parts |
| Compound represented by the following formula 3 (Pelex NBL, manufactured by Kao Atlas Co., Ltd.) | 4.0 weight parts |
| Compound represented by the following formula 4 (Nukol B4SN, manufactured by Nippon Nyukazai Co., Ltd.) | 2.5 weight parts |
| Compound represented by the following formula 5 | 0.2 weight parts |
| Water | 91.7 weight parts |

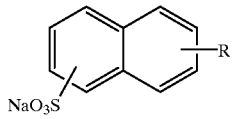

(3)

(Pelex NBL, manufactured by Kao Atlas Co., Ltd.)

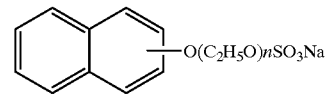

(4)

(Nukol B4SN, manufactured by Nippon Nyukazai Co., Ltd.)

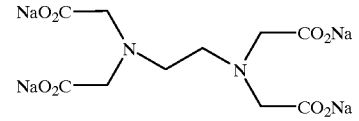

(5)

DV-2

An aqueous solution comprising the following composition and having pH 10.

| Sodium bicarbonate | 1.2 weight parts |
|---|---|
| Sodium carbonate | 0.8 weight parts |
| Compound represented by the above formula 3 (Pelex NBL, manufactured by Kao Atlas Co., Ltd.) | 3.0 weight parts |
| Compound represented by the above formula 4 (Nukol B4SN, manufactured by Nippon Nyukazai Co., Ltd.) | 2.0 weight parts |
| Compound represented by the above formula 5 | 0.2 weight parts |
| Water | 92.8 weight parts |

DV-3

An aqueous solution comprising the following composition and having pH 13.

| 1 K Potassium silicate | 3.0 weight parts |
|---|---|
| Potassium hydroxide | 1.5 weight parts |
| Compound represented by the above formula 5 | 0.2 weight parts |
| Water | 95.3 weight parts |

As is apparent from the results in Table III-2, the lithographic printing plate precursor according to the present invention can provide an excellent lithographic printing plate on the condition of capable of making a printing plate by scanning exposure with high productivity, i.e., even on extremely low energy exposure condition. On the other hand, in Comparative Example III-7 where the photoinitiator of the present invention was not used, a practicable lithographic printing plate could not be obtained.

Example III-15

Each of a lithographic printing plate precursor was prepared in the same manner as in Examples III-1 to III-6 except that the composition of the photoinitiator was changed as follows and that the film thickness of the photosensitive layer was changed to 1.5 g/m$^2$.

Photoinitiator (The addition amount was the content in the entire solid content in the photosensitive layer.)

| Sensitizing Dye D20 | 1.2 wt % |
|---|---|
| Titanocene compound T-2 | 1.5 wt % |
| Co-sensitizer H-1 | 7.0 wt % |

The thus-obtained lithographic printing plate precursor was subjected to scanning exposure by using InGaN semiconductor laser having oscillation wavelength of 400 nm on the condition of the beam on the printing plate of 25 μm and exposure energy density of 0.2 mJ/cm$^2$. Subsequently, after the plate was heated at 100° C. for 10 seconds, the above development process was performed.

A lithographic printing plate having a blue image excellent in visibility was obtained. Offset printing was performed using the thus-obtained printing plate by KOR-D printer manufactured by Heidelberg Co. More than 50,000 sheets of print excellent in image density and anti-smearing (i.e., anti-staining) could be obtained.

Example III-16

The lithographic printing plate precursor prepared in Example III-15 was stored for three days under forced conditions of 65% RH at 45° C. Print-making and printing were performed using this plate in the same manner as in Example III-15. Good results similar to those in Example III-15 were obtained.

Example III-17

The emission strength distribution of safelight commonly used was measured and the position where the emission strength distribution on the short wavelength side arose (the end of short wave) was measured. Further, the workabililty under each safelight was evaluated. The results obtained are shown in Table III-3 below.

TABLE III-3

| Safelight | End of Short Wave of Emission (nm) | Working Ability |
|---|---|---|
| White lamp | 400 | Good |
| Yellow lamp | 520 | Sufficiently bright for plate-making work |
| Orange lamp | 570 | Considerably dark and difficult to work, it takes time to be accustomed to the work |
| Red lamp | 600 | Very dark, the work requires skill |

Thus, a yellow lamp is desired in view of the working ability. Materials which are handleable under a yellow lamp are required to have low photosensitivity at at least 520 nm, preferably at 490 nm or longer wavelength. The dye groups according to the present invention have absorption maximum in the vicinity of 400 nm, thus the present invention is advantageous in this point, also.

Example III-18

A lithographic printing plate precursor was prepared in the same manner as in Example III-15 except that the composition of the photoinitiator was changed as follows and that the film thickness of the photosensitive layer was changed to 2.0 g/m².
Photoinitiator
(The addition amount was the content in the entire solid content in the photosensitive layer.)

| Sensitizing Dye D20 | 1.5 wt % |
| Titanocene compound T-2 | 1.5 wt % |
| Co-sensitizer H-1 | 5.0 wt % |

The thus-obtained lithographic printing plate precursor was subjected to scanning exposure by using InGaN semiconductor laser having oscillation wavelength of 400 nm on the condition of the beam on the printing plate of 25 μm and exposure energy density of 0.15 mJ/cm². Subsequently, after the plate was heated at 100° C. for 10 seconds, the above development process was performed. A lithographic printing plate having a blue image excellent in visibility was obtained. The above-obtained plate was further heated at 300° C. for 5 minutes, and offset printing was performed by KOR-D printer manufactured by Heidelberg Co. More than 200,000 sheets of print excellent in image density and anti-smearing (i.e., anti-staining)could be obtained.

Example III-19

The lithographic printing plate precursor prepared in Example III-18 was exposed to a yellow lamp for 30 minutes before scanning exposure. Print-making and printing were performed using this plate in the same manner as in Example III-18. Good results completely the same as those in Example III-18 were obtained.

Comparative Example III-8

A lithographic printing plate precursor was prepared in the same manner as in Example III-15 except that sensitizing dye D20 (absorption maximum wavelength: 395 nm) was replaced with DR-4 (absorption maximum wavelength: 500 nm) The plate-making in the same manner as in Example III-15 using InGaN semiconductor laser having oscillation wavelength of 400 nm resulted in image-flowing (i.e., image deletion) Further, the lithographic printing plate precursor prepared was exposed to a yellow lamp for 30 minutes before scanning exposure in the same manner as in Example III-19, and print-making and printing were performed in the same manner as in Example III-19. The whole surface of the print was solid and fog was generated.

Comparative Example III-9

Plate-making was performed in the same manner as in Example III-15 except that the laser was replaced with FD-YAG (532 nm). An image having the clear sensitivity of 1.8 mJ/cm² was obtained. However, when the lithographic printing plate precursor prepared was exposed to a yellow lamp for 30 minutes before scanning exposure in the same manner as in Example III-19, and print-making and printing were performed in the same manner as in Example III-19, the whole surface of the print obtained was solid and fog was generated.

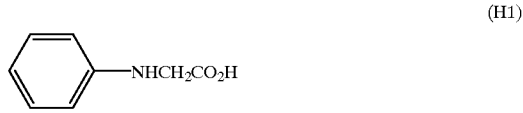

(H1)

(H2)

(H3)

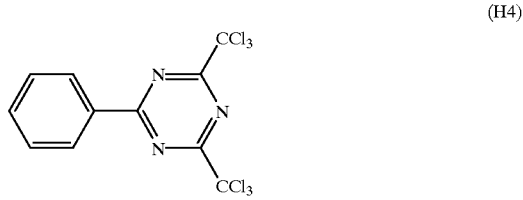

(H4)

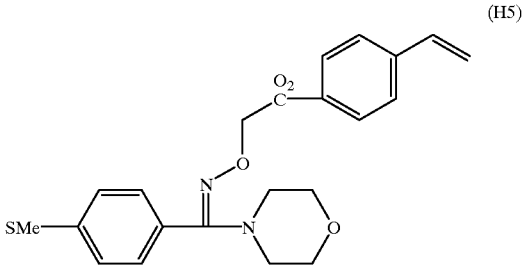

(H5)

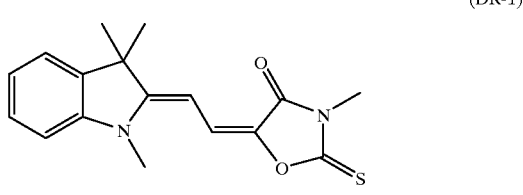

(DR-1)

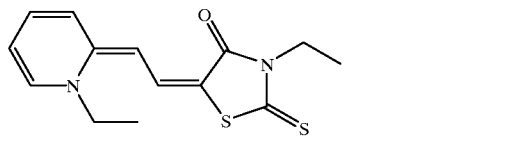

(DR-2)

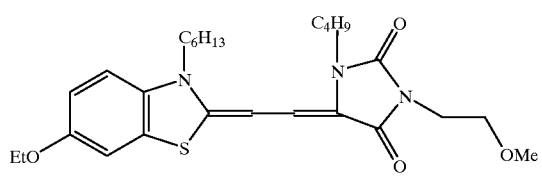

(DR-3)

-continued (DR-4)

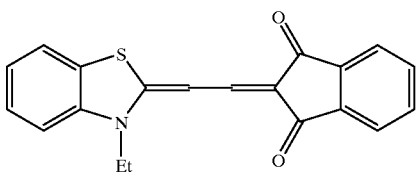

(T-1)

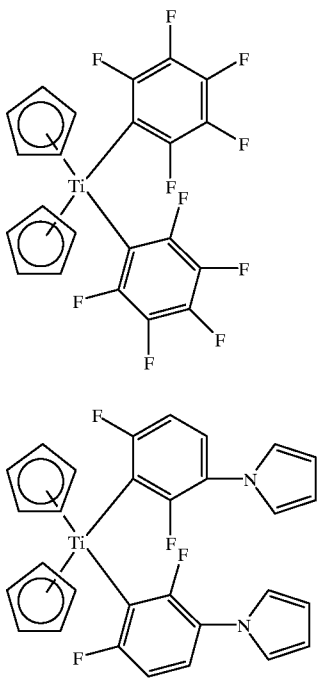

(T-2)

When the photosensitive composition according to the present invention is used as the photosensitive layer of a lithographic printing plate precursor, the lithographic printing plate precursor has sufficient sensitivity fitted for scanning exposure by short wavelength semiconductor laser such as InGaN, and provides a lithographic printing plate excellent in press life and anti-smearing property (i.e., anti-staining). The lithographic printing plate for scanning exposure using the photosensitive composition according to the present invention in the photosensitive layer is markedly improved in fog under a yellow lamp, hence the working ability of handling the printing plate can be largely improved. The photosensitive composition of the present invention has excellent sensitivity to wavelength of from 350 nm to 450 nm and at the same time extremely superior in storage stability.

While the invention has been described in detail and with reference to specific examples thereof, it will be apparent to one skilled in the art that various changes and modifications can be made therein without departing from the spirit and scope thereof.

What is claimed is:

1. A photopolymerizable composition which comprises (i) a sensitizing dye represented by the following formula (I-1), (ii) a titanocene compound, and (iii) an addition polymerizable compound having at least one ethylenically unsaturated double bond:

(I-1)

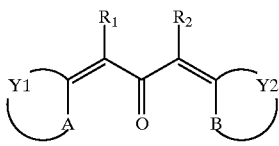

wherein A and B each represents —S—, $NR_3$, or $NR_4$; $R_3$ and $R_4$ each represents a substituted or unsubstituted alkyl group, or a substituted or unsubstituted aryl group; $Y_1$ and $Y_2$ each represents a non-metallic atomic group to form the basic nucleus of the dye together with the adjacent A or B, and the adjacent carbon atoms; $R_1$ and $R_2$ each represents a monovalent non-metallic atomic group, or $R_1$ and $R_2$ may be bonded to each other to form an aliphatic or aromatic ring.

2. The photopolymerizable composition as claimed in claim 1, wherein the sensitizing dye represented by formula (I-1) is represented by the following formula (I-2):

(I-2)

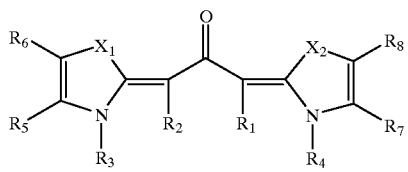

wherein $R_1$, $R_2$, $R_3$, and $R_4$ each has the same meaning as defined in formula (I-1); $X_1$ and $X_2$ each represents an O atom, an S atom, an Se atom, $NR_9$ or $CR_{10}R_{11}$; $R_9$, $R_{10}$ and $R_{11}$ each represents an alkyl group having from 1 to 6 carbon atoms, or a substituted or unsubstituted phenyl group; and $R_5$, $R_6$, $R_7$ and $R_8$ each represents a hydrogen atom, an alkyl group having from 1 to 6 carbon atoms, an alkoxyl group having from 1 to 6 carbon atoms, a substituted or unsubstituted phenyl group, chlorine or bromine, and $R_5$ and $R_6$, and $R_7$ and $R_8$ may be bonded to each other to form an aliphatic or aromatic ring.

3. A photosensitive composition which comprises (i) a sensitizing dye represented by the following formula (II-1), (ii) a titanocene compound, and (iii) a compound which reacts with a radical or an acid to change and retain the physical or chemical characteristics of the photosensitive composition:

(II-1)

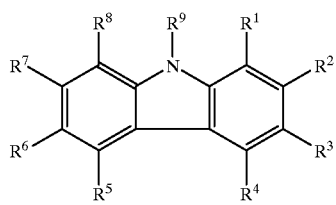

wherein $R^1$, $R^2$, $R^3$, $R^4$, $R^5$, $R^6$, $R^7$, $R^8$ and $R^9$ each represents a hydrogen atom, or a monovalent non-metallic atomic group, provided that at least one of $R^1$ and $R^3$ is a monovalent organic residue represented by the following partial structural formula (1), and $R^1$, $R^2$, $R^3$, $R^4$, $R^5$, $R^6$, $R^7$, $R^8$ and $R^9$ each may be bonded to each other to form an aliphatic or aromatic group;

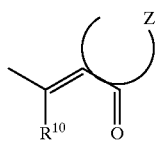
(1)

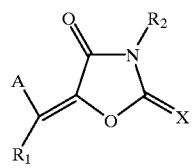
(III-1)

wherein $R^{10}$ represents a hydrogen atom, or a monovalent non-metallic atomic group; Z represents a divalent non-metallic atomic group necessary to form the acidic nucleus of a 5-membered ring together with the adjacent atomic group, and $R^{10}$ may be bonded to $R^1$, $R^2$, $R^3$, $R^4$, $R^5$, $R^6$, $R^7$, $R^8$ or $R^9$ to form an aliphatic or aromatic ring.

4. The photosensitive composition as claimed in claim 3, wherein the compound which reacts with a radical or an acid to change and retain the physical or chemical characteristics of the photosensitive composition is an addition polymerizable compound having at least one ethylenically unsaturated double bond.

5. A photosensitive composition which comprises (i) a sensitizing dye represented by the following formula (III-1), (ii) a titanocene compound, and (iii) a compound which reacts with at least either a radical or an acid to change and retain at least either the physical or chemical characteristics of the photosensitive composition:

wherein A represents an aromatic or heterocyclic ring which may have a substituent; X represents an oxygen atom, a sulfur atom or —N($R_3$)—; $R_1$, $R_2$ and $R_3$ each represents a hydrogen atom, or a monovalent non-metallic atomic group, and A and $R_1$, and $R_2$ and $R_3$ each may be bonded to each other to form an aliphatic or aromatic group.

6. The photosensitive composition as claimed in claim 5, wherein the compound which reacts with at least either a radical or an acid to change and retain at least either the physical or chemical characteristics of the photosensitive composition is an addition polymerizable compound having at least one ethylenically unsaturated double bond.

7. A photopolymerizing method which comprises exposing the photosensitive composition as claimed in claim 5 with laser beams having a wavelength of 450 nm or less.

* * * * *